US012298823B2

(12) United States Patent
Morisawa et al.

(10) Patent No.: US 12,298,823 B2
(45) Date of Patent: May 13, 2025

(54) ELECTRONIC APPARATUS AND EXTERIOR PANEL THEREOF

(71) Applicant: Sony Interactive Entertainment Inc., Tokyo (JP)

(72) Inventors: Yujin Morisawa, Kanagawa (JP); Yasuhiro Ootori, Kanagawa (JP); Keiichi Aoki, Tokyo (JP); Shinya Tsuchida, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 129 days.

(21) Appl. No.: 17/911,874

(22) PCT Filed: Mar. 25, 2021

(86) PCT No.: PCT/JP2021/012749
§ 371 (c)(1),
(2) Date: Sep. 15, 2022

(87) PCT Pub. No.: WO2021/193881
PCT Pub. Date: Sep. 30, 2021

(65) Prior Publication Data
US 2023/0114888 A1 Apr. 13, 2023

(30) Foreign Application Priority Data
Mar. 27, 2020 (JP) ................. 2020-059189

(51) Int. Cl.
G06F 1/20 (2006.01)
H05K 5/03 (2006.01)
H05K 7/20 (2006.01)
(52) U.S. Cl.
CPC ................. G06F 1/20 (2013.01); H05K 5/03 (2013.01); H05K 7/20145 (2013.01)

(58) Field of Classification Search
CPC ...... G06F 1/20; G06F 1/181; G06F 2200/201; G06F 1/16; H05K 1/0203; H05K 5/03; H05K 7/20145; H05K 7/20172
See application file for complete search history.

(56) References Cited

U.S. PATENT DOCUMENTS 5,593,219 A  1/1997  Ho
5,896,273 A  4/1999  Warghese
(Continued)

FOREIGN PATENT DOCUMENTS

CN  1940819 A  4/2007
CN  1976574 A  6/2007
(Continued)

OTHER PUBLICATIONS

Extended European Search Report for related EP Patent Application No. 20926492.8, 6 pages, dated Feb. 5, 2024.
(Continued)

Primary Examiner — Adam B Dravininkas
(74) Attorney, Agent, or Firm — Kilpatrick Townsend & Stockton LLP

(57) ABSTRACT

There is provided an electronic apparatus which improves an external appearance and which easily ensures the strength of an exterior member. In the electronic apparatus, an upper surface of an exterior panel (20A) has, on a peripheral portion of the upper surface, a first position (P1), a second position (P2) defined on an opposite side of a center (P0) of the upper surface from the first position (P1), a third position (P3), and a fourth position (P4) defined on an opposite side of the center (P0) of the upper surface from the third position (P3). A line (L1) that connects the first position (P1) and the second position (P2) to each other and is formed along the upper surface is a curve bulging to a lower side, and a line (L2) that connects the third position (P3) and the fourth (Continued)

position (P4) to each other and is formed along the upper surface is a curve bulging to an upper side.

12 Claims, 52 Drawing Sheets

(56) References Cited

U.S. PATENT DOCUMENTS

| | | | |
|---|---|---|---|
| 5,903,435 A * | 5/1999 | Hsieh | H01L 23/367 361/752 |
| 5,967,633 A | 10/1999 | Jung | |
| 6,052,279 A * | 4/2000 | Friend | G06F 1/1626 361/679.56 |
| 6,147,859 A | 11/2000 | Abboud | |
| 6,241,247 B1 | 6/2001 | Sternberg | |
| 6,301,103 B1 | 10/2001 | Abboud | |
| 6,364,278 B1 | 4/2002 | Lin et al. | |
| 6,480,398 B1 * | 11/2002 | Fiora | G06F 1/181 174/382 |
| 6,549,397 B1 | 4/2003 | Diaz | |
| 6,633,276 B1 | 10/2003 | Jaynes | |
| 6,715,850 B1 | 4/2004 | Diaz | |
| 6,816,391 B2 | 11/2004 | Davis | |
| 6,864,573 B2 | 3/2005 | Robertson | |
| 7,405,928 B2 | 7/2008 | Robertson | |
| 7,687,711 B2 * | 3/2010 | Kutaragi | G06F 1/20 361/752 |
| 8,228,671 B2 | 7/2012 | Ikeda | |
| 8,243,445 B2 | 8/2012 | Hasegawa | |
| 8,681,501 B2 | 3/2014 | Govindasamy | |
| 8,817,470 B2 | 8/2014 | Aoki | |
| 8,902,588 B2 | 12/2014 | Ritter | |
| 8,920,903 B2 | 12/2014 | Liang | |
| 9,153,109 B1 | 10/2015 | Foster | |
| 9,392,317 B2 | 7/2016 | Bose | |
| 9,510,472 B2 | 11/2016 | Amano | |
| 9,594,402 B2 | 3/2017 | Hiroki | |
| 9,648,779 B2 | 5/2017 | Kohn | |
| 9,756,761 B2 | 9/2017 | Inoue | |
| 9,814,149 B2 | 11/2017 | Schmidt | |
| 10,201,111 B2 | 2/2019 | Wen | |
| 10,405,449 B2 | 9/2019 | Nakagawa | |
| 10,446,192 B2 | 10/2019 | Hirose | |
| 10,478,668 B2 | 11/2019 | Welker | |
| 10,709,025 B2 | 7/2020 | Lee | |
| 10,795,193 B2 | 10/2020 | Jin | |
| 10,908,649 B2 | 2/2021 | Lange | |
| 11,192,038 B2 | 12/2021 | Miyatake | |
| 2002/0195909 A1 | 12/2002 | Cleereman et al. | |
| 2003/0011288 A1 | 1/2003 | Searby | |
| 2004/0264120 A1 | 12/2004 | Fan | |
| 2006/0065804 A1 | 3/2006 | Burriel et al. | |
| 2006/0082973 A1 * | 4/2006 | Egbert | H05K 7/20154 361/709 |
| 2006/0148578 A1 | 7/2006 | Hayes | |
| 2006/0207748 A1 | 9/2006 | Hashimoto | |
| 2007/0101535 A1 | 5/2007 | Maier | |
| 2007/0109741 A1 | 5/2007 | Seibold | |
| 2008/0310082 A1 * | 12/2008 | Kutaragi | G11B 17/051 361/679.31 |
| 2009/0168331 A1 | 7/2009 | Fujiwara | |
| 2010/0254085 A1 | 10/2010 | Hasegawa | |
| 2010/0254086 A1 * | 10/2010 | Ikeda | H05K 7/20163 361/697 |
| 2011/0200219 A1 | 8/2011 | Vizcarra et al. | |
| 2011/0226451 A1 | 9/2011 | Kensuke | |
| 2011/0279974 A1 | 11/2011 | Fujiwara | |
| 2012/0024733 A1 | 2/2012 | Hwang | |
| 2012/0155015 A1 * | 6/2012 | Govindasamy | H01L 23/36 361/688 |
| 2012/0201001 A1 | 8/2012 | Aoki | |
| 2013/0078416 A1 | 3/2013 | Liang | |
| 2013/0126365 A1 | 5/2013 | Hung | |
| 2013/0335311 A1 | 12/2013 | Kim | |
| 2014/0036440 A1 | 2/2014 | Yukito | |
| 2014/0104166 A1 | 4/2014 | Kim | |
| 2014/0197998 A1 * | 7/2014 | Govindasamy | H01Q 21/29 343/702 |
| 2014/0306586 A1 | 10/2014 | Sullivan | |
| 2015/0261254 A1 | 9/2015 | Hiroki | |
| 2016/0088760 A1 | 3/2016 | Inoue | |
| 2016/0129524 A1 | 5/2016 | Evans | |
| 2016/0191680 A1 | 6/2016 | Jung | |
| 2017/0007928 A1 | 1/2017 | Middleton | |
| 2017/0287527 A1 | 10/2017 | Hirose | |
| 2019/0014670 A1 | 1/2019 | Lee | |
| 2019/0121400 A1 | 4/2019 | Mao | |
| 2019/0353950 A1 | 11/2019 | Jin | |

FOREIGN PATENT DOCUMENTS

| | | |
|---|---|---|
| CN | 101237760 A | 8/2008 |
| CN | 101442894 A | 5/2009 |
| CN | 101861084 A | 10/2010 |
| CN | 102403015 A | 4/2012 |
| CN | 102752990 A | 10/2012 |
| CN | 103563341 A | 2/2014 |
| CN | 103563503 A | 2/2014 |
| CN | 103025102 B | 6/2015 |
| CN | 104918457 A | 9/2015 |
| CN | 109215517 A | 1/2018 |
| CN | 208855252 U | 5/2019 |
| CN | 209402822 U | 9/2019 |
| CN | 110501829 A | 11/2019 |
| CN | 110830617 A | 2/2020 |
| DE | 20020283 U1 | 4/2001 |
| EP | 0762815 A1 | 3/1997 |
| JP | 11119181 A | 4/1999 |
| JP | 2004349548 A | 12/2004 |
| JP | 2011198860 A | 10/2011 |
| JP | 2012003130 A | 1/2012 |
| JP | 2014123591 A | 7/2014 |
| JP | 2015187858 A | 10/2015 |
| JP | 2017228594 A | 12/2017 |
| KR | 10-1355772 B1 | 2/2014 |
| WO | 2011045866 A1 | 4/2011 |
| WO | 2014107668 A1 | 7/2014 |
| WO | 2014185311 A | 11/2014 |
| WO | 2015051840 A1 | 4/2015 |
| WO | 2018106176 A1 | 6/2018 |

OTHER PUBLICATIONS

Extended European Search Report for related EP Patent Application No. 21774751.8, 10 pages, dated Mar. 7, 2024.
Notice of Allowance for related CN application No. 202110293587. X, 9 pages, dated Oct. 10, 2022.
International Search Report for corresponding PCT Application No. PCT/JP2021/012749, 4 pages, dated Jun. 8, 2021.
Written Opinion for corresponding PCT Application No. PCT/JP2021/012749, 10 pages, dated on Jun. 8, 2021.
Partial Search Report for related EP Patent Application No. 21163419. 1, 18 pages, dated Jul. 30, 2021.
BitFenix: "BitFenix Aurora ProductVideo", YouTube, XP054982071, URL: https://www.youtube.com/watch?=VNuKEqdU6zw&t=5s, 2 pages, Aug. 9, 2016. (See Non-Pat. Lit. #3 and 5).
Extended European Search Report for related European App No. EP 21 16 3419, 31 pages, dated Nov. 24, 2021.
Office Action for related Taiwan Application No. 110110324, with English translation, 9 pages, dated Dec. 14, 2021.
Office Action for related Canadian Patent Application No. 3,144,685, 4 pages, dated May 27, 2022.
Office Action for related Chinese Patent Application No. 202110293587, 16 pages, dated Apr. 6, 2022.
Notification of Reasons for Refusal for related JP Patent Application No. 2020-059187, 7 pages, dated May 24,.
Office Action for related TW application No. 111128486, 11 pages, dated Apr. 19, 2023.
Office Action for related JP Application No. 2022-510707, 5 pages, dated Nov. 8, 2023.

(56) References Cited

OTHER PUBLICATIONS

International Preliminary Report on Patentability and Written Opinion for related PCT Application No. PCT/2020/036079, 5 pages, dated Oct. 6, 2022.
International Preliminary Report on Patentability and Written Opinion for related PCT Application No. PCT/2021/012750, 5 pages, dated Oct. 6, 2022.
International Preliminary Report on Patentability and Written Opinion for corresponding PCT Application No. PCT/JP2021/012749, 6 pages, dated Oct. 6, 2022.
International Search Report for related PCT Application No. PCT/2020/036079, 4 pages, dated Dec. 15, 2020.
International Search Report for related PCT Application No. PCT/2021/012750, 5 pages, dated Jun. 8, 2021.
Notice of Preliminary Rejection for corresponding KR Application No. 10-2022-7035370, 10 pages, dated Nov. 23, 2023.
The First Office Action for related CN Application No. 202080098418.4, 12 pages, dated Aug. 31, 2023.
The First Office Action for corresponding CN Application No. 202180022657.6, 18 pages, dated Sep. 26, 2024.
Notice of Allowance of Nov. 6, 2024, for Korean Patent Application No. 10-2022-7035370, 7 pages dated Nov. 6, 2024.
Office Action of Nov. 29, 2024, for Chinese Patent Application No. 202180018948.8, 24 pages, dated Nov. 29, 2024.
Office Action of Nov. 28, 2024, for Chinese Patent Application No. 202211673469.2, 21 pages, dated Nov. 28, 2024.
Office Action for related TW Patent Application No. 112146466, 18 pages, dated Mar. 10, 2025.

\* cited by examiner

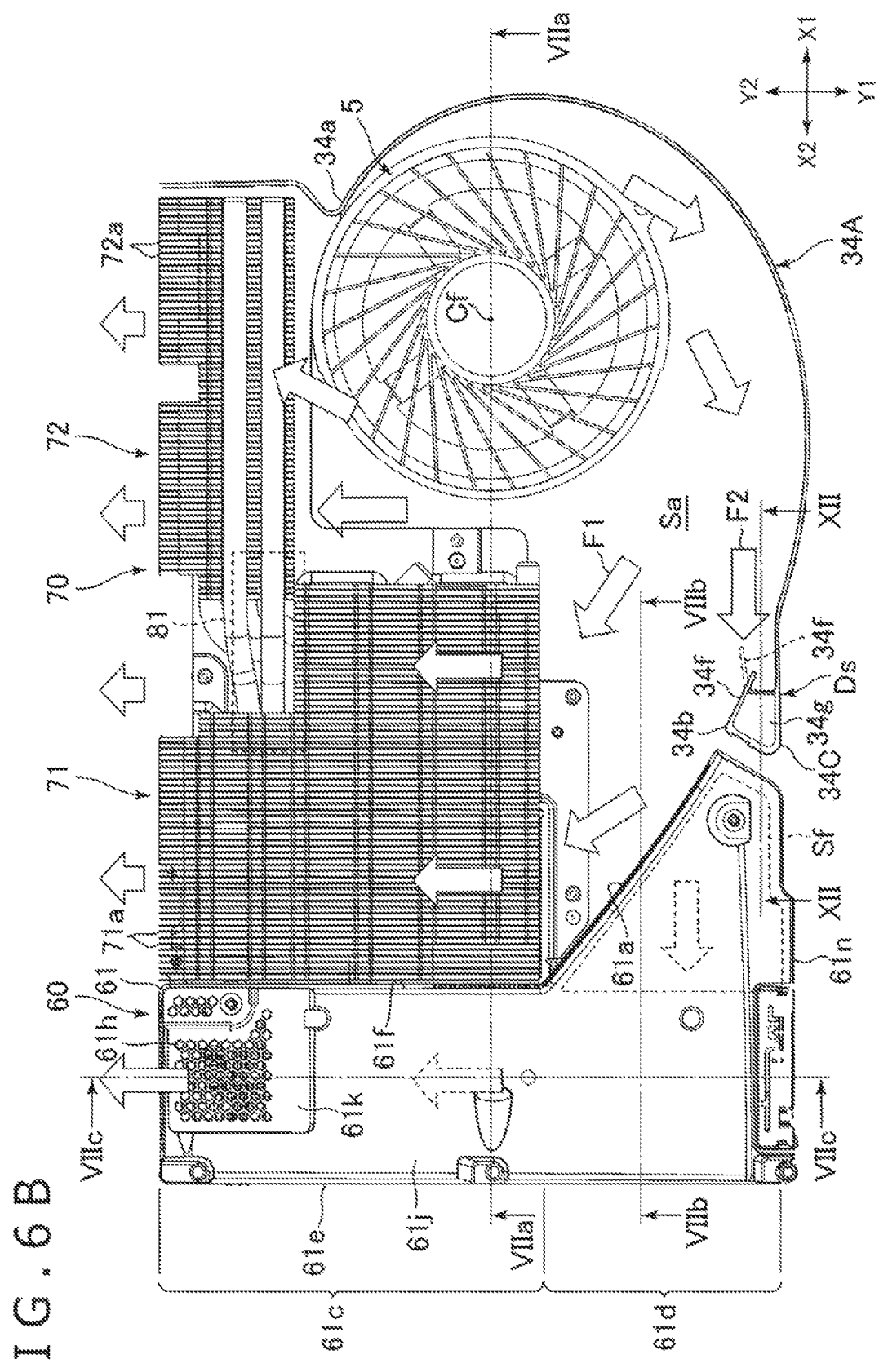

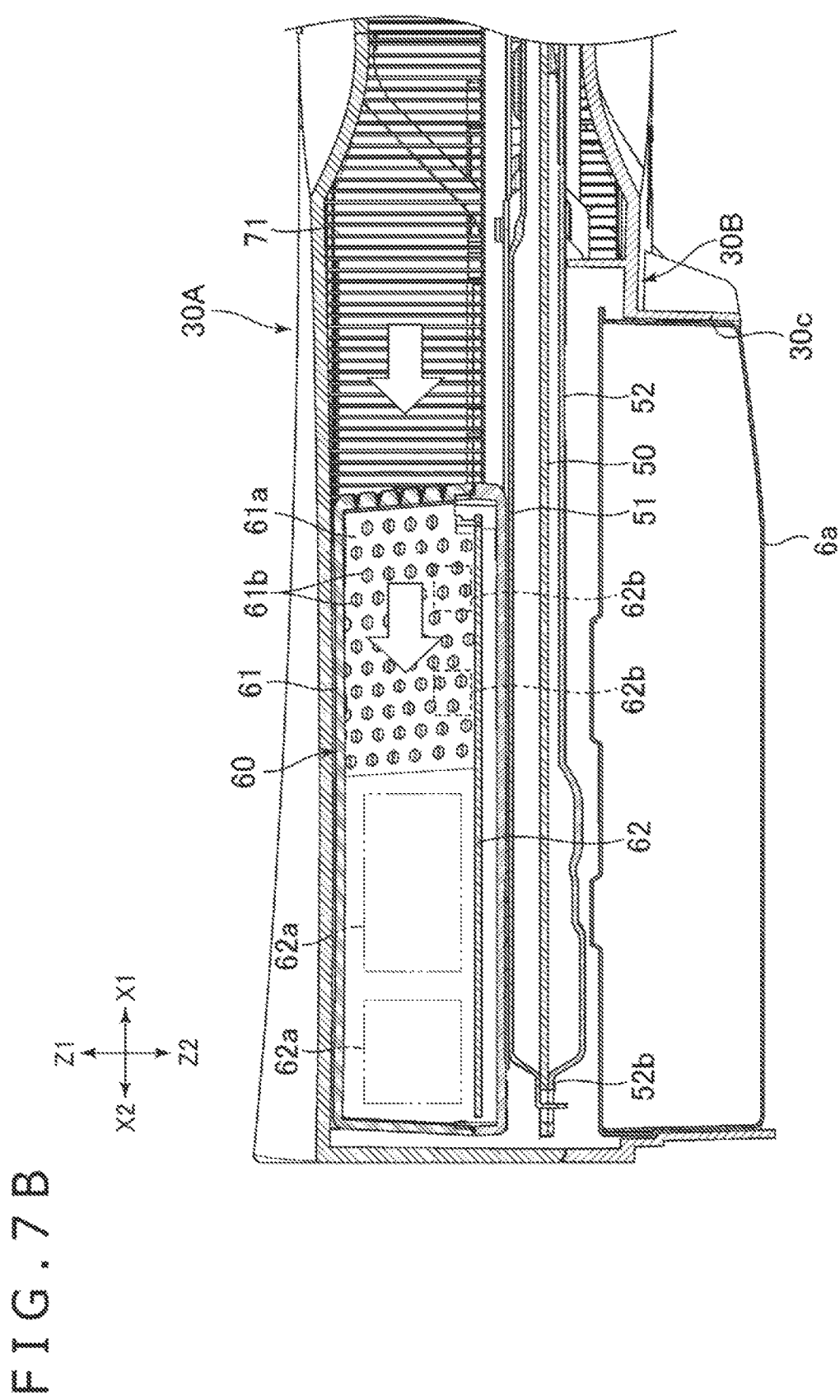

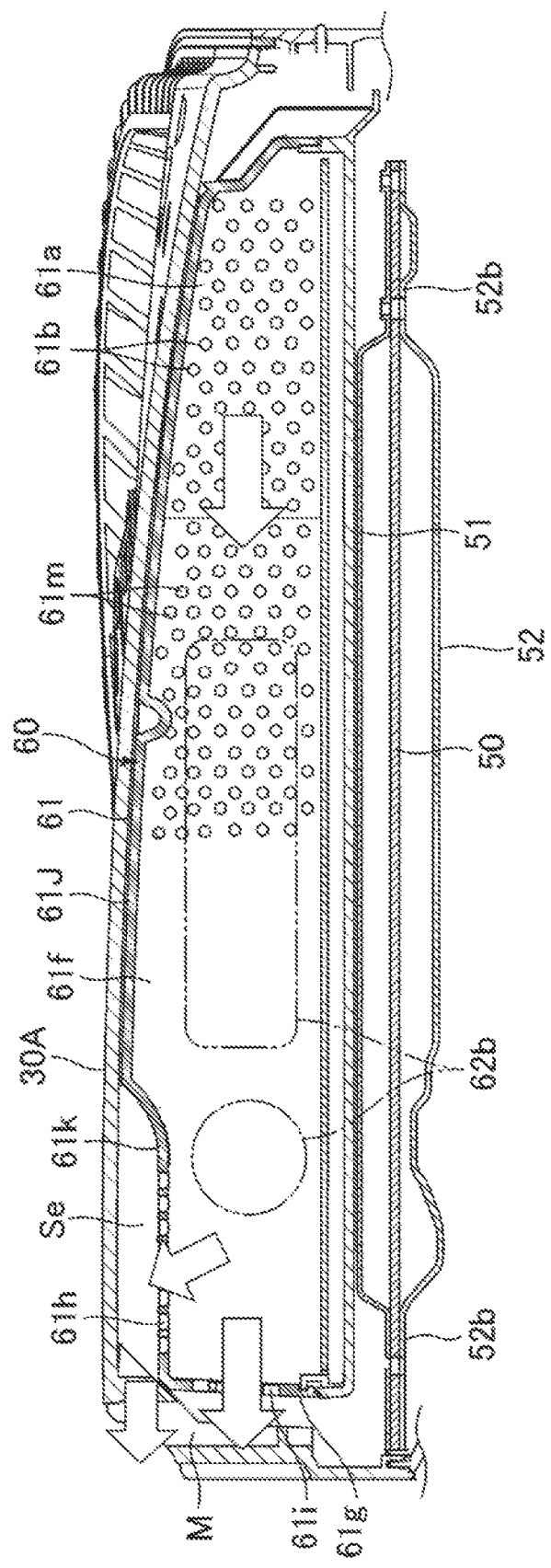

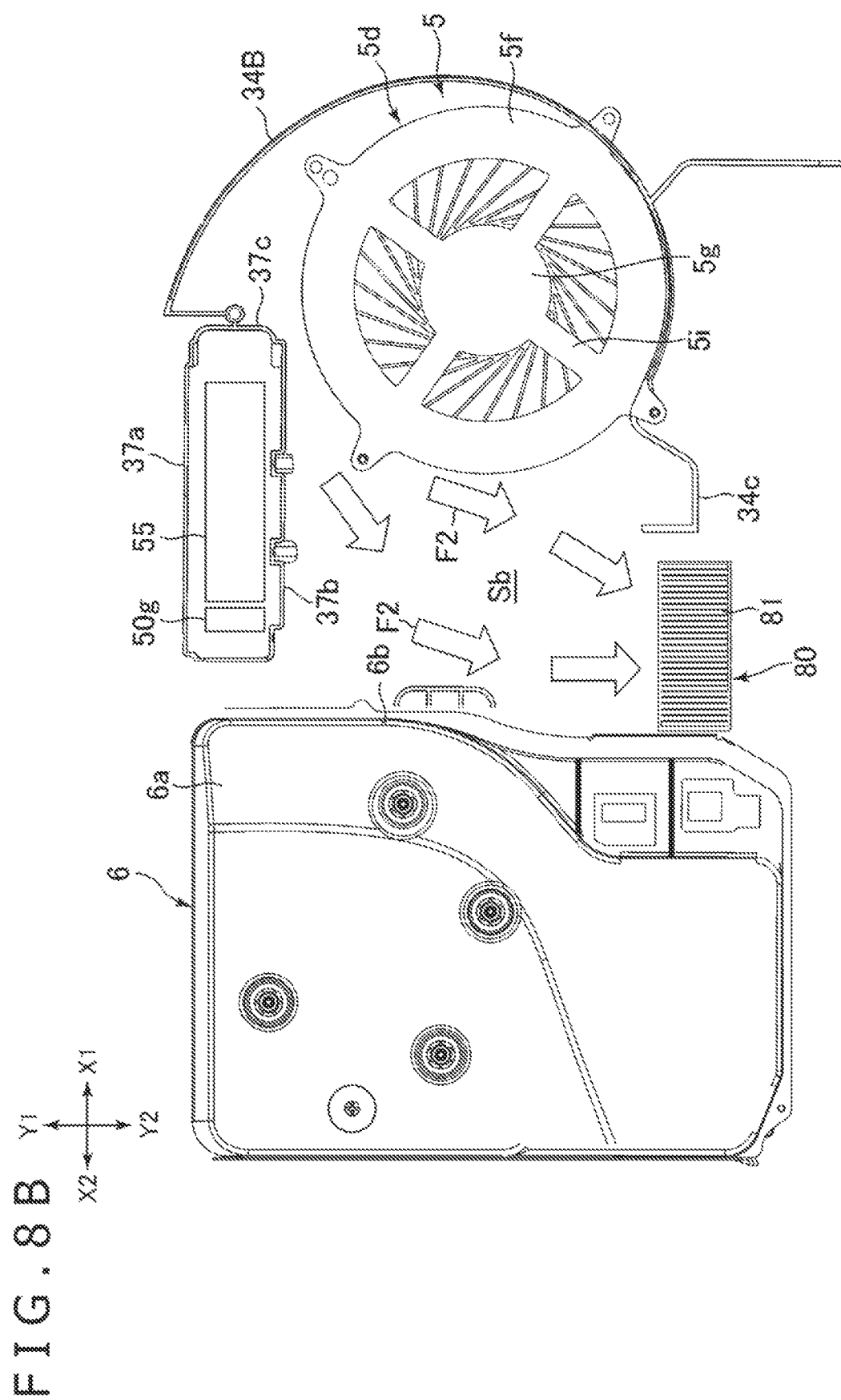

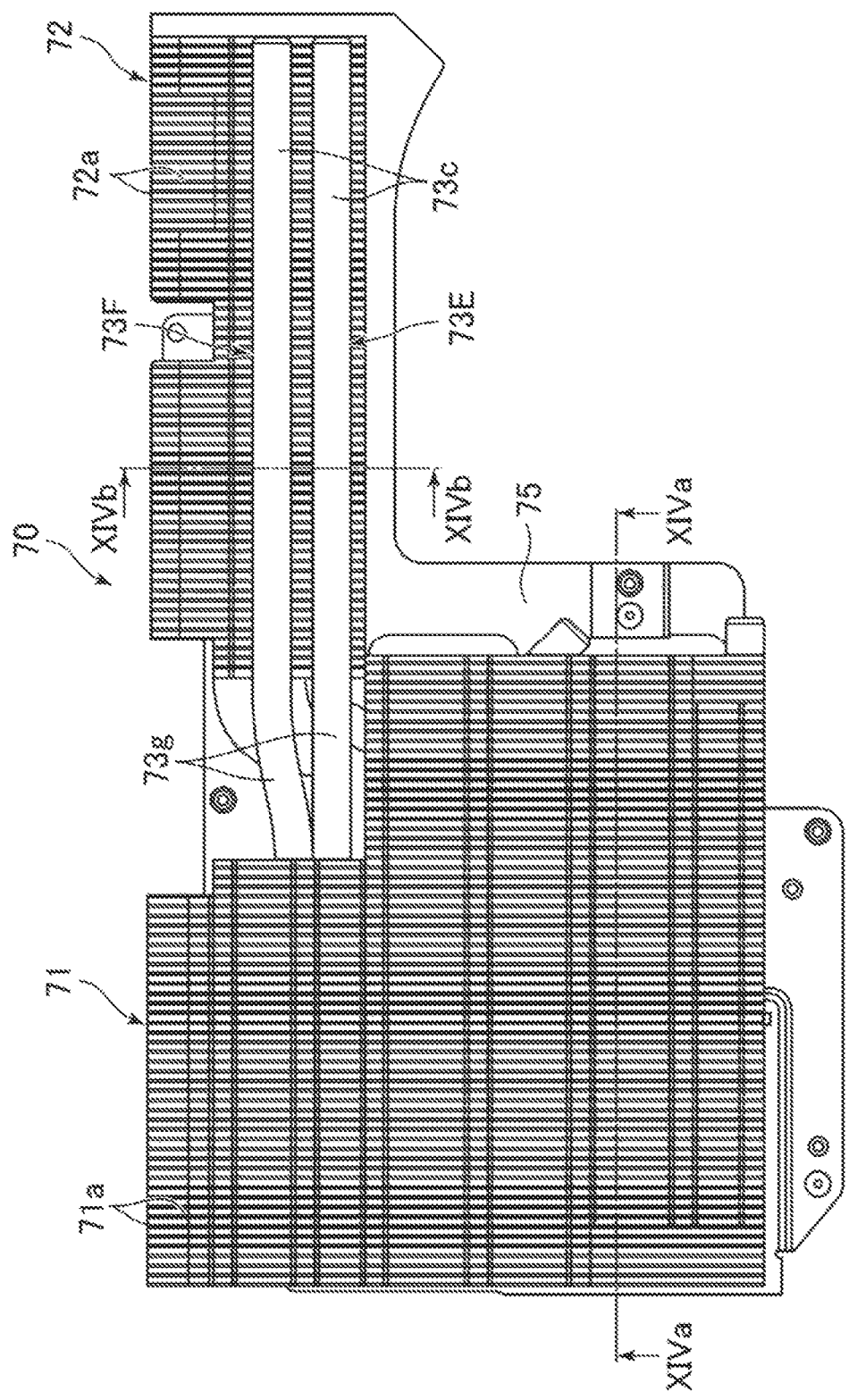

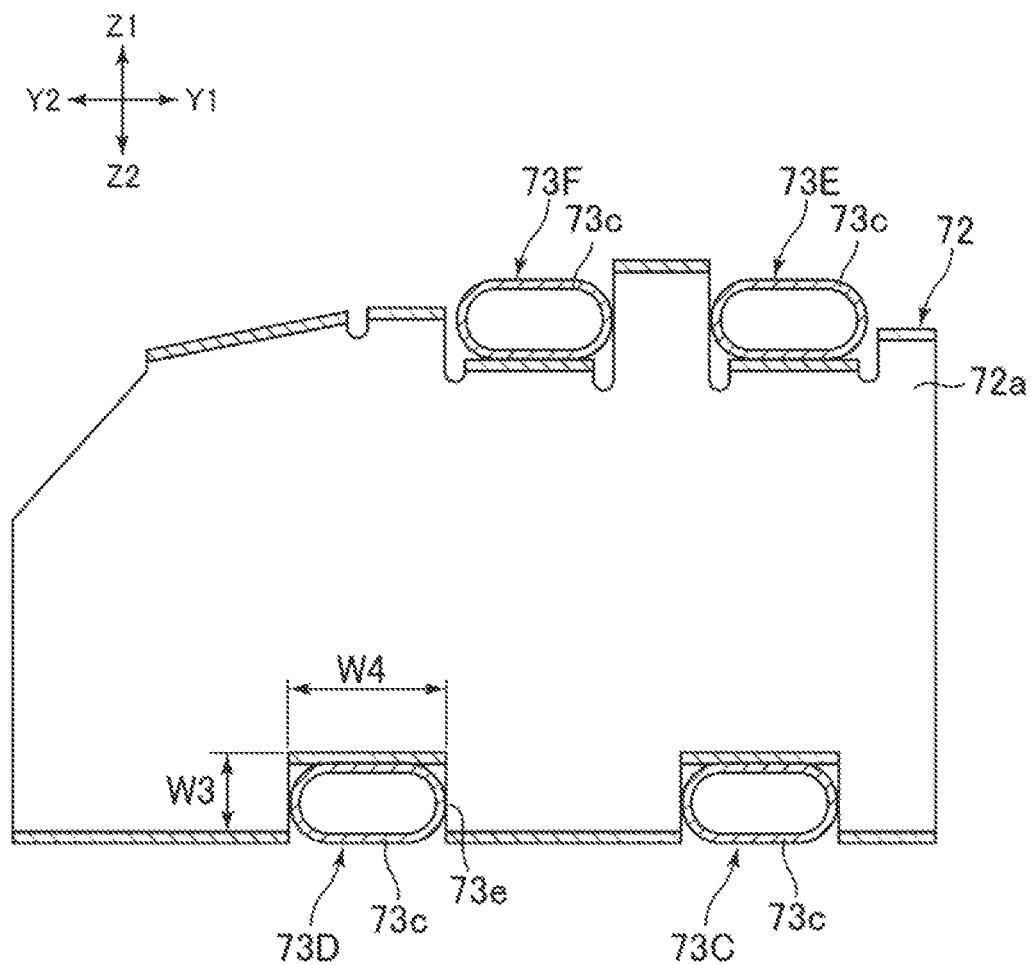

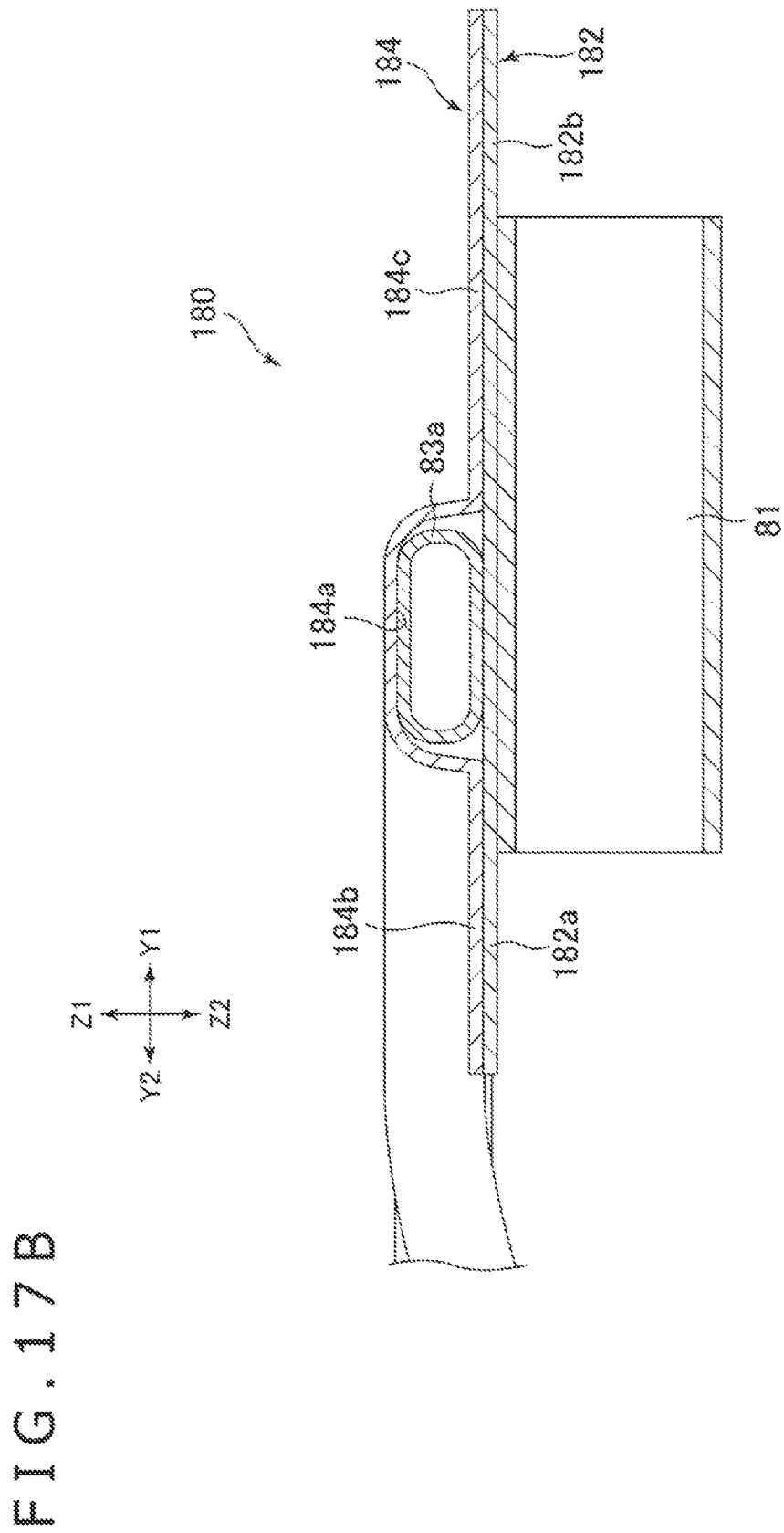

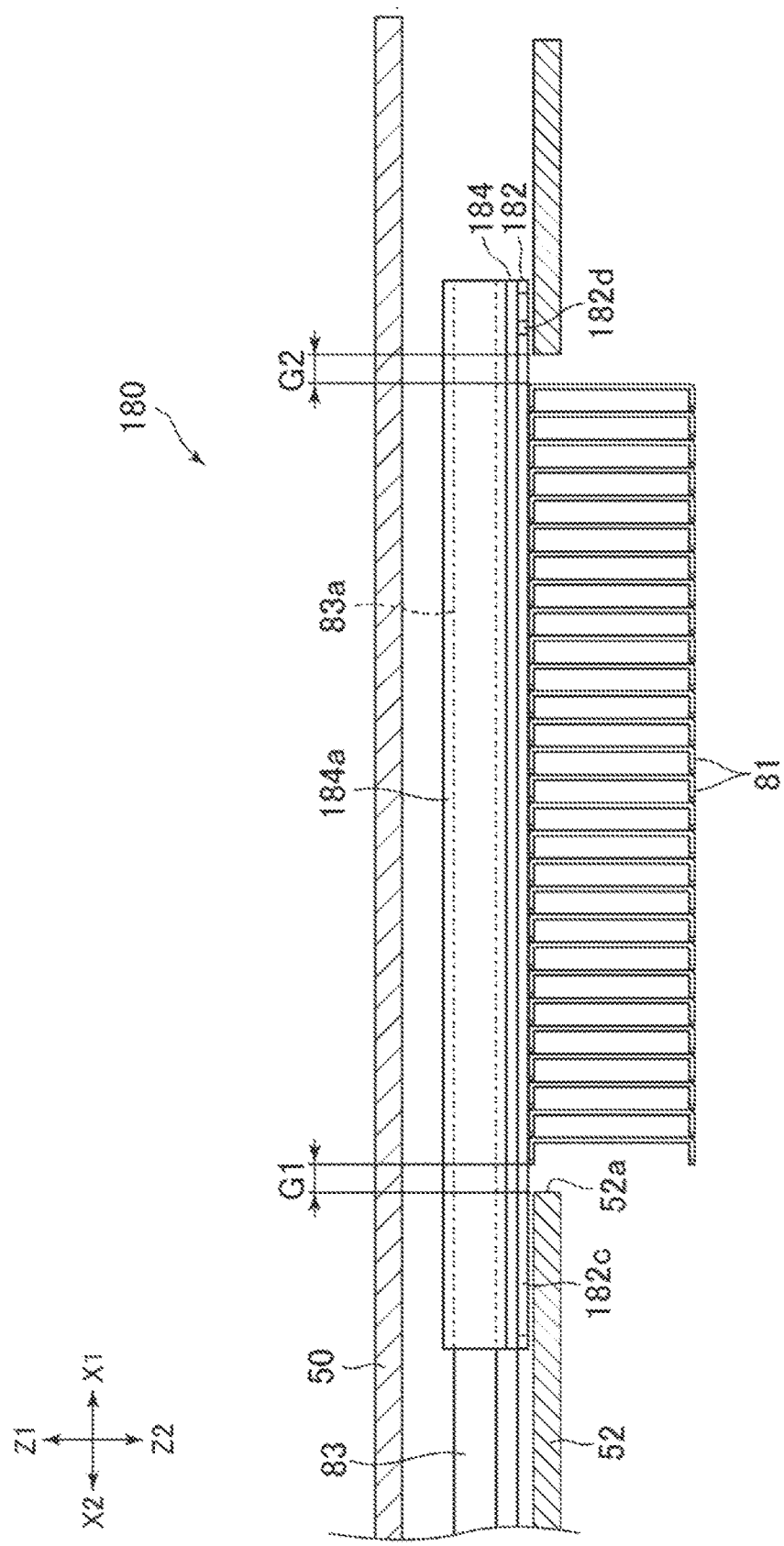

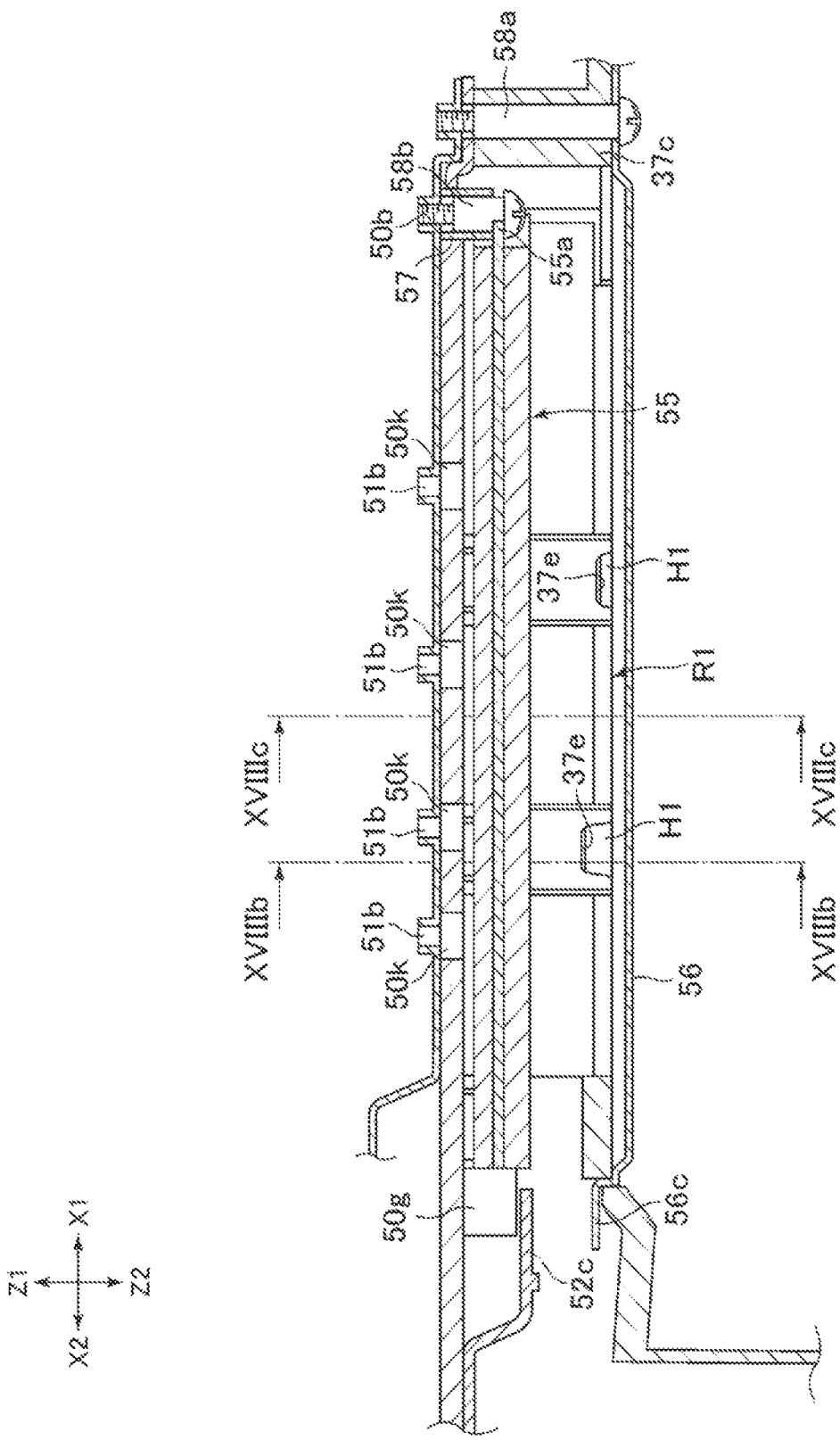

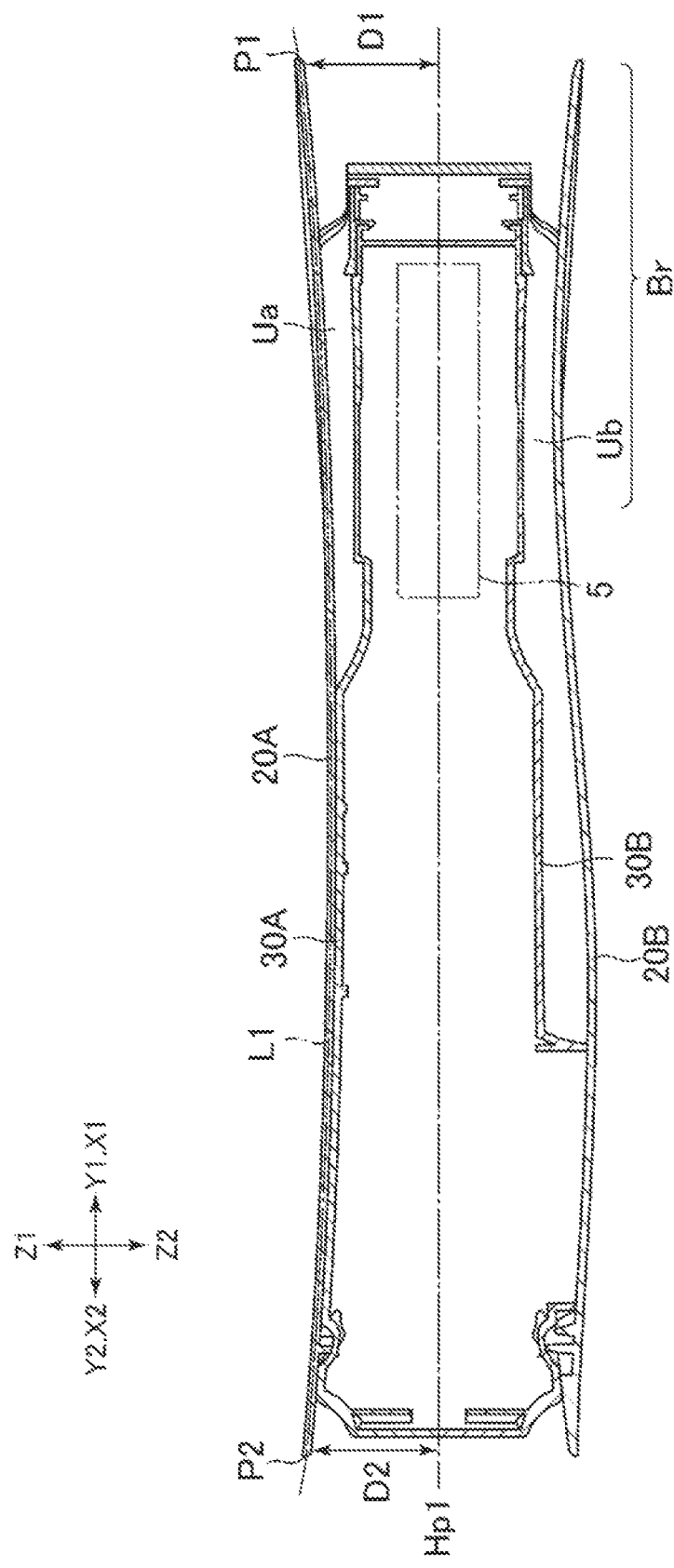

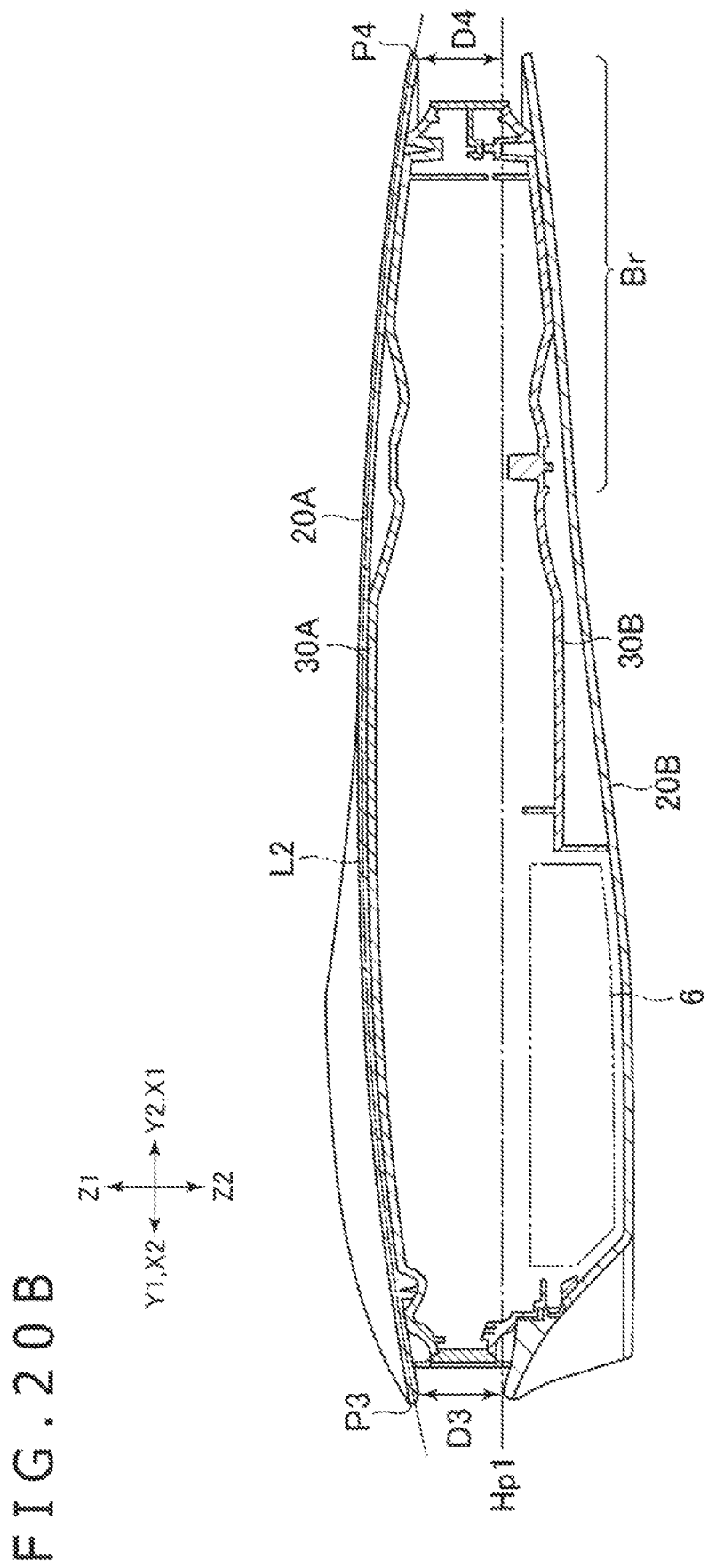

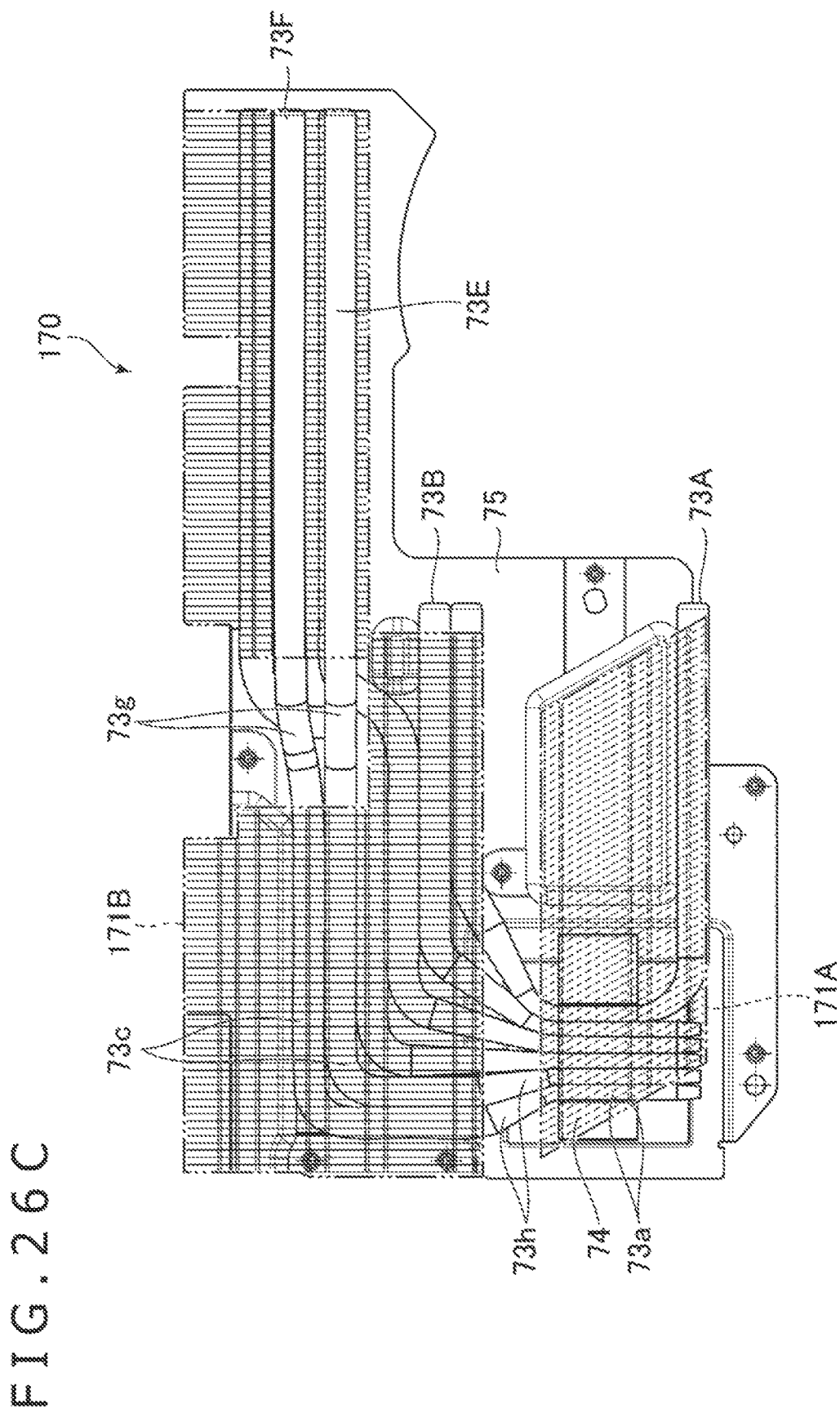
F I G . 2 6 C

ELECTRONIC APPARATUS AND EXTERIOR PANEL THEREOF

TECHNICAL FIELD

The present disclosure relates to an exterior member of an electronic apparatus.

BACKGROUND ART

PCT Patent Publication No. WO2014/185311 discloses an electronic apparatus that functions as a game machine. The electronic apparatus has, as exterior members thereof, an upper cover that covers the upper side of internal devices such as a circuit board, a power supply unit, and a heat sink, and a lower cover that covers the lower side of the internal devices.

SUMMARY

An electronic apparatus proposed in the present disclosure includes an exterior member having a first external surface that faces a first direction. The first external surface has, on a peripheral portion of the first external surface, a first position, a second position defined on an opposite side of a center of the first external surface from the first position, a third position, and a fourth position defined on an opposite side of the center of the first external surface from the third position. A line that connects the first position and the second position to each other and is formed along the first external surface is a curve bulging to one side in the first direction, and a line that connects the third position and the fourth position to each other and is formed along the first external surface is a curve bulging to another side in the first direction. According to this electronic apparatus, an external appearance is improved, and the strength of the exterior member is ensured easily. For example, a bending or a deformation occurring in the exterior member can be reduced when an external force acts on the exterior member. Incidentally, in the electronic apparatus, the first external surface may be the external surface of a housing that houses an internal device such as a circuit board, or may be the external surface of a cover or a panel attached to the external surface of the housing.

An exterior panel proposed in the present disclosure is an exterior panel that is to be attached to a housing of an electronic apparatus and arranged in a first direction with respect to the housing. The exterior panel has, on a peripheral portion of the exterior panel, a first position, a second position defined on an opposite side of a center of the exterior panel from the first position, a third position, and a fourth position defined on an opposite side of the center of the exterior panel from the third position. A line that connects the first position and the second position to each other and is formed along the first external surface is a curve bulging to one side in the first direction, and a line that connects the third position and the fourth position to each other and is formed along the first external surface is a curve bulging to another side in the first direction. According to this exterior panel, an external appearance is improved, and the strength of the exterior panel is ensured easily. For example, a bending or a deformation occurring in the exterior member can be reduced when an external force acts on the exterior member.

BRIEF DESCRIPTION OF DRAWINGS

FIG. 6B is a plan view illustrating positional relation between an air flow passage and parts formed on the upper side of a circuit board.

FIG. 7B is a sectional view of the apparatus main body, the sectional view being obtained in a cutting plane indicated by a line VIIb-VIIb in FIG. 6B.

FIG. 7C is a sectional view of the apparatus main body, the sectional view being obtained in a cutting plane indicated by a line VIIc-VIIc in FIG. 6B.

FIG. 8B is a bottom view illustrating positional relation between an air flow passage and parts formed on the lower side of the circuit board.

FIG. 13A is a plan view of a heat radiating device disposed on the upper side of the circuit board, the heat radiating device being illustrated in FIG. 3.

FIG. 14B is a sectional view of the heat radiating device, the sectional view being obtained in a cutting plane indicated by a line XIVb-XIVb in FIG. 13A.

FIG. 17B is a sectional view obtained in a cutting plane indicated by a line XVIIb-XVIIb in FIG. 17A.

FIG. 17C is a side view of the heat radiating device according to the modification.

FIG. 18A is a sectional view obtained in a cutting plane indicated by a line XVIIIa-XVIIIa in FIG. 8A.

FIG. 20A is a sectional view of the exterior panels and the housing, the sectional view being obtained in a cutting plane indicated by a line XXa-XXa in FIG. 1D.

FIG. 20B is a sectional view of the exterior panels and the housing, the sectional view being obtained in a cutting plane indicated by a line XXb-XXb in FIG. 1D.

FIG. 26C is a plan view of the heat radiating device illustrated in FIG. 26A, in which heat sinks are omitted.

DESCRIPTION OF EMBODIMENTS

An embodiment of the present disclosure will hereinafter be described with reference to the drawings. FIGS. 1A to 1H and the like illustrate an electronic apparatus 1 as an example of the embodiment. In the following description, X1 and X2 illustrated in FIGS. 1A to 1H will be set as a right direction and a left direction, respectively, Y1 and Y2 will be set as a forward direction and a rearward direction, respectively, and Z1 and Z2 will be set as an upward direction and a downward direction, respectively. However, these directions are defined to describe the shape, relative positional relation, movement, and the like of elements (parts, members, and portions) of the electronic apparatus 1 and do not limit the attitude of the electronic apparatus 1 at a time of usage. For example, while FIG. 1A and the like illustrate the electronic apparatus 1 in a horizontal placement attitude, the electronic apparatus 1 may be disposed in a vertical placement attitude at a time of usage. (The "vertical placement attitude" is an attitude in which the right side surface or left side surface of the electronic apparatus 1 is a lower side.)

The electronic apparatus 1 is, for example, an entertainment device that functions as a game device or an audio-visual apparatus. The electronic apparatus 1 outputs, to a display device such as a television, moving image data generated by executing a game program, video and audio data obtained through a network, and video and audio data obtained from a recording medium such as an optical disk. The electronic apparatus may, for example, be a personal computer.

[General Configuration]

Figure 2A:
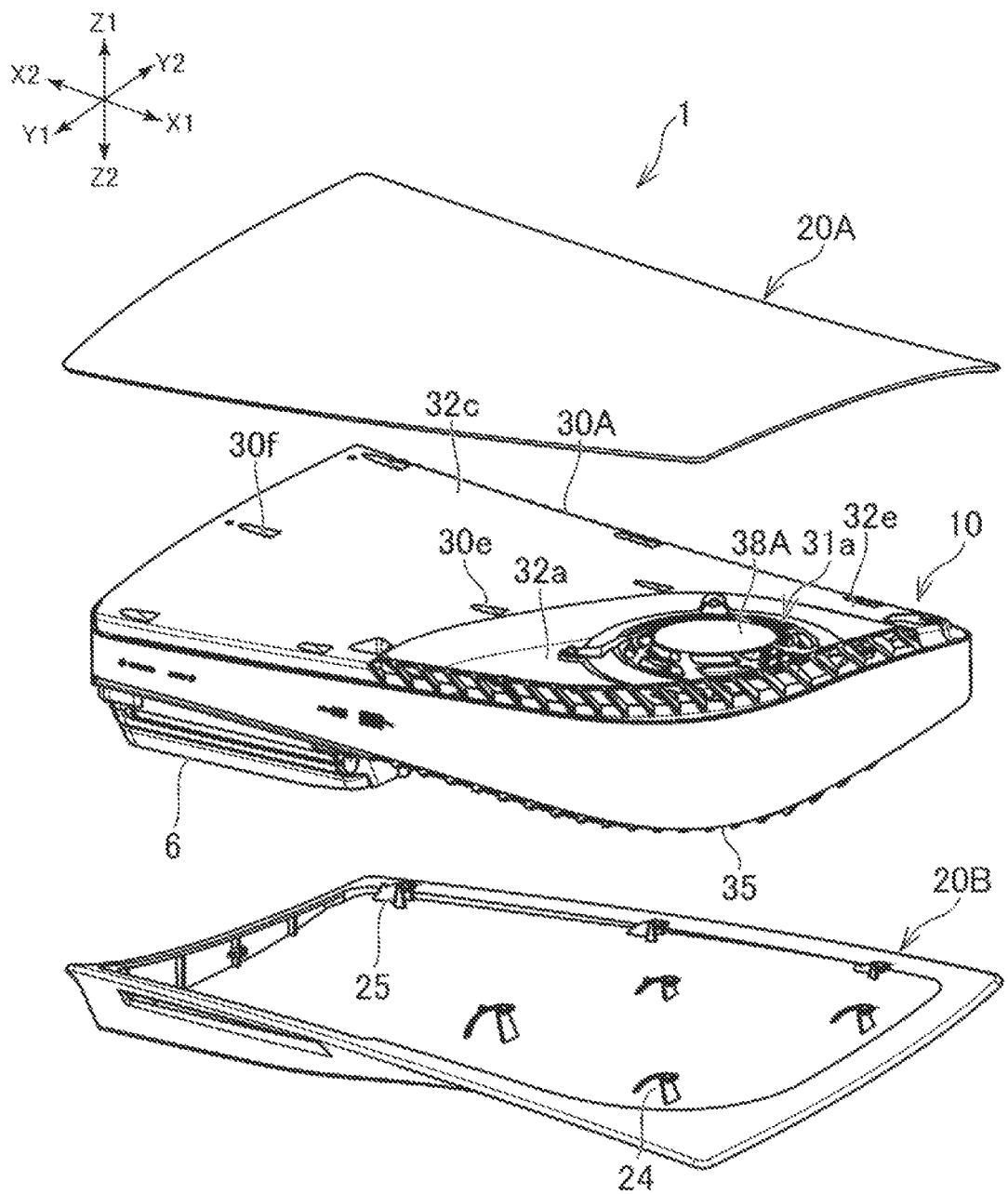
FIG. 2A is an exploded perspective view illustrating an apparatus main body and upper and lower exterior panels that are included in the electronic apparatus, in a disassembled state.
Figure 3:
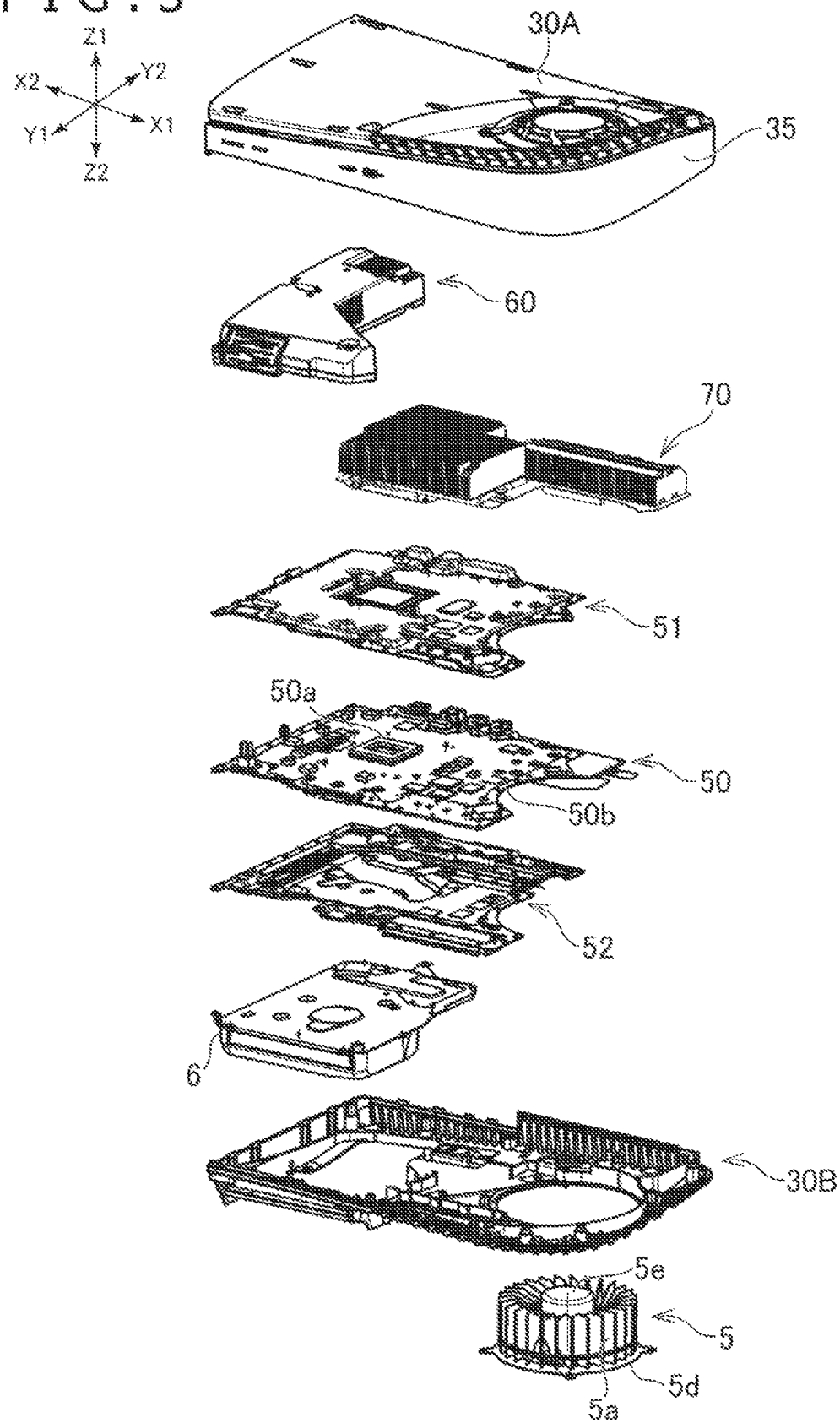
FIG. 3 is an exploded perspective view illustrating internal devices of the electronic apparatus.

As illustrated in FIG. 2A, the electronic apparatus 1 includes an apparatus main body 10, an upper exterior panel 20A that covers the upper side of the apparatus main body 10, and a lower exterior panel 20B that covers the lower side of the apparatus main body 10. As illustrated in FIG. 3, the apparatus main body 10 includes a circuit board 50, internal devices such as a heat radiating device 70, and a housing 30 that houses the internal devices. The housing 30 includes an upper housing member 30A that covers the upper side of the circuit board 50, and a lower housing member 30B that covers the lower side of the circuit board 50. These housings are combined with each other in an upward-downward direction. The upper housing member 30A forms the upper surface of the apparatus main body 10. The lower housing member 30B forms the lower surface of the apparatus main body 10. The upper exterior panel 20A may be detachable from the upper housing member 30A. The lower exterior panel 20B may be detachable from the lower housing member 30B. The exterior panels 20A and 20B and the housing members 30A and 30B include, for example, a resin such as an acrylonitrile butadiene styrene (ABS) resin or a polycarbonate.

Figure 1A:
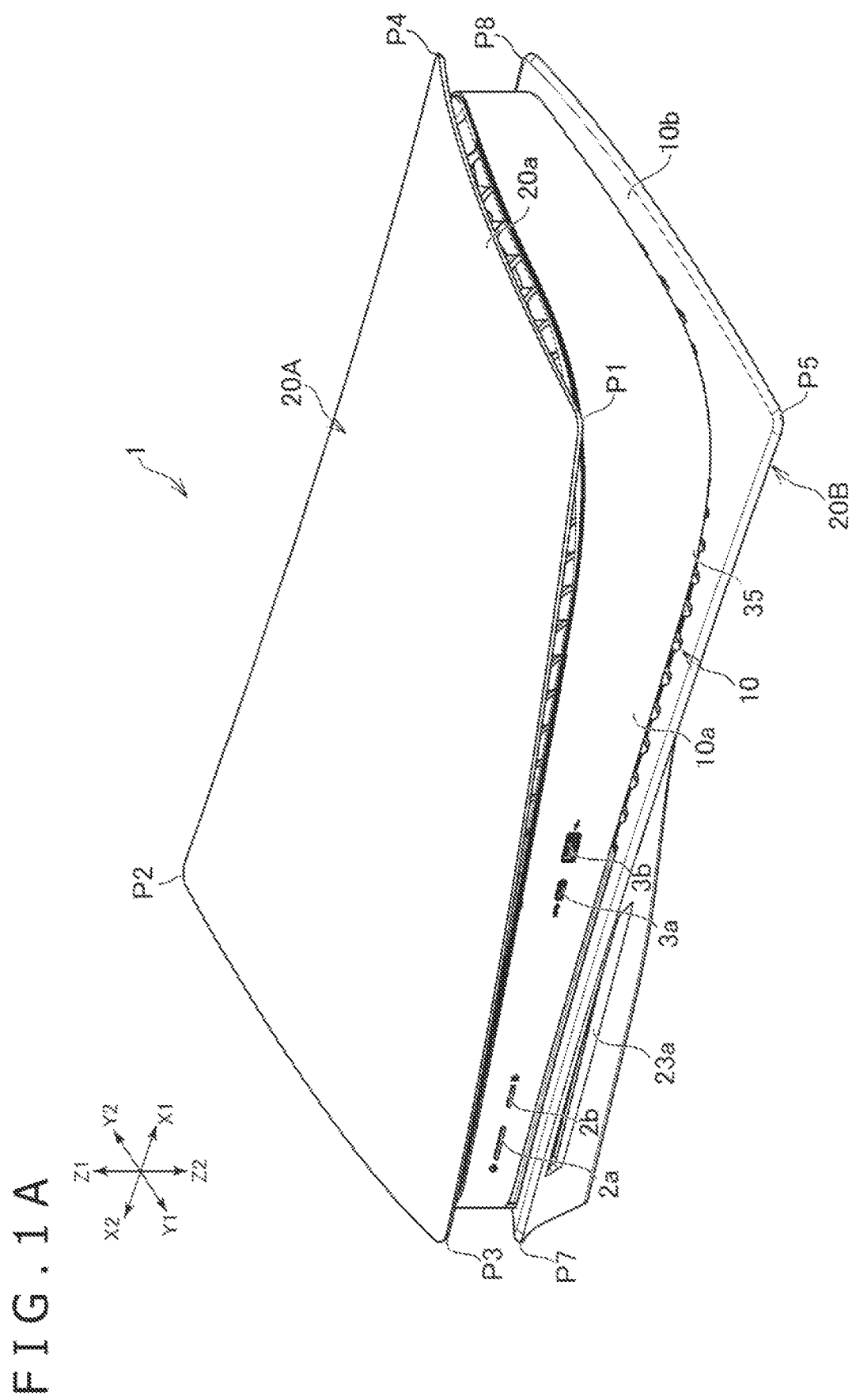
FIG. 1A is a perspective view illustrating an example of an electronic apparatus according to an embodiment of the present disclosure.

As illustrated in FIG. 1A, the apparatus main body 10 may have a power button 2a and an optical disk ejecting button 2b in the front surface of the apparatus main body 10. The apparatus main body 10 may also have connectors 3a and 3b in the front surface thereof. Further, the apparatus main body 10 may have connectors 4a to 4e (see FIG. 1G) in the back surface of the apparatus main body 10.

As illustrated in FIG. 3, the apparatus main body 10 includes, as internal devices, a cooling fan 5, the heat radiating device 70, and an optical disk drive 6 in addition to the circuit board 50 and a power supply unit 60. As will be described later, the heat radiating device 70 includes heat sinks 71 and 72 (see FIG. 6B) and heat pipes 73A to 73F (see FIG. 13B). The upper surface of the circuit board 50 is covered by an upper board shield 51 that blocks electromagnetic waves from electronic parts mounted on the upper surface. The lower surface of the circuit board 50 is covered by a lower board shield 52 that blocks electromagnetic waves from electronic parts mounted on the lower surface. The board shields 51 and 52 are respectively attached to the upper surface and lower surface of the circuit board 50. The board shields 51 and 52 are a metallic plate. The material of the metallic plates may be, for example, iron, stainless steel, aluminum, or the like.

[Outline of Part Layout]

The power supply unit 60 and the heat radiating device 70 are, for example, disposed on the upper side of the circuit board 50 (more specifically, on the upper side of the upper board shield 51). An integrated circuit 50a (see FIG. 3) that functions as a central processing unit (CPU), a graphics processing unit (GPU), or the like is mounted on the upper surface of the circuit board 50. The integrated circuit 50a is a heat generating device and is connected to the heat radiating device 70. The power supply unit 60 is also a heat generating device. An airflow generated by the cooling fan 5 is supplied to the heat radiating device 70 and the power supply unit 60. The layout of internal devices such as the heat radiating device 70, the power supply unit 60, and the cooling fan 5 is not limited to the example of the electronic apparatus 1.

The optical disk drive 6 is, for example, disposed on the lower side of the circuit board 50 (more specifically, on the lower side of the lower board shield 52). A heat radiating device 80 (see FIG. 7A) may be disposed on the lower side of the circuit board 50. An electronic part (for example, a power transistor that generates driving power for the integrated circuit 50a) is mounted on the lower surface of the circuit board 50. The heat radiating device 80 may be connected to this electronic part.

[Cooling Fan]

Figure 7A:
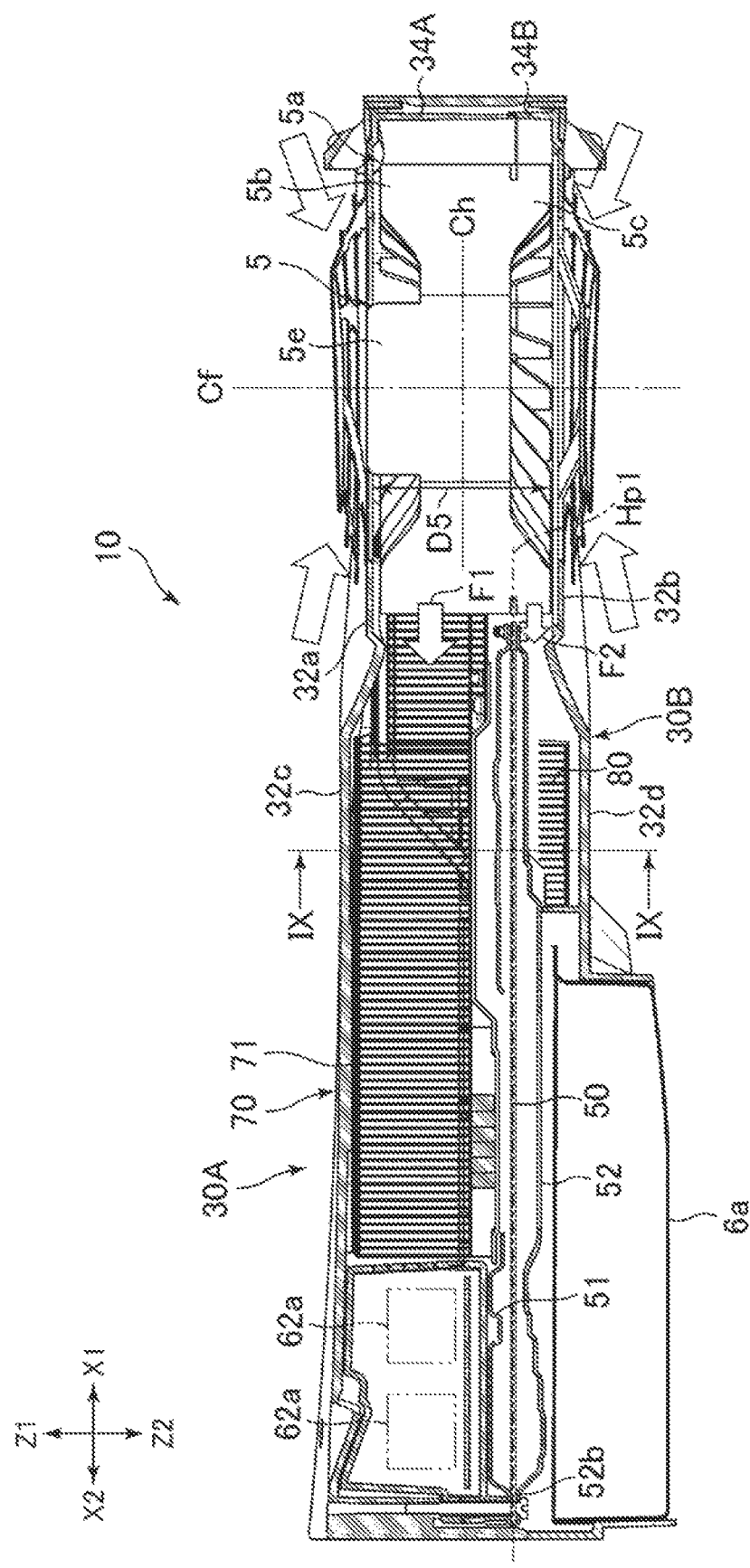
FIG. 7A is a sectional view of the apparatus main body, the sectional view being obtained in a cutting plane indicated by a line VIIa-VIIa in FIG. 6B.

As illustrated in FIG. 7A, the cooling fan 5 is disposed such that a rotational center line Cf of the cooling fan 5 is along the thickness direction of the circuit board 50 (upward-downward direction in the electronic apparatus 1). In addition, the cooling fan 5 is disposed on the outside of an outer edge of the circuit board 50. The cooling fan 5 is, for example, disposed on the right side of a right edge of the circuit board 50. In the description here, the upward-downward direction of the electronic apparatus 1 is a direction along a normal to the circuit board 50. In addition, directions referred to in the present specification do not limit the attitude of the electronic apparatus 1 at a time of usage. Hence, in a case where the electronic apparatus 1 is disposed in a vertical placement attitude, for example, the rotational center line Cf of the cooling fan 5 is a line along a left-right direction.

The cooling fan 5 may have a part located above a horizontal plane Hp1 including the circuit board 50 and a part located below the horizontal plane Hp1 including the circuit board 50. More specifically, a plurality of fins 5a that rotate about the rotational center line Cf may each have a part 5b located above the horizontal plane Hp1 and a part 5c located below the horizontal plane Hp1. This arrangement of the cooling fan 5 can generate an airflow F1 along the upper surface of the circuit board 50 and an airflow F2 along the lower surface of the circuit board 50. It is therefore possible to cool heat generating devices arranged or mounted on the upper side of the circuit board 50 and heat generating devices arranged or mounted on the lower side of the circuit board 50 without increasing the number of parts.

Figure 2B:
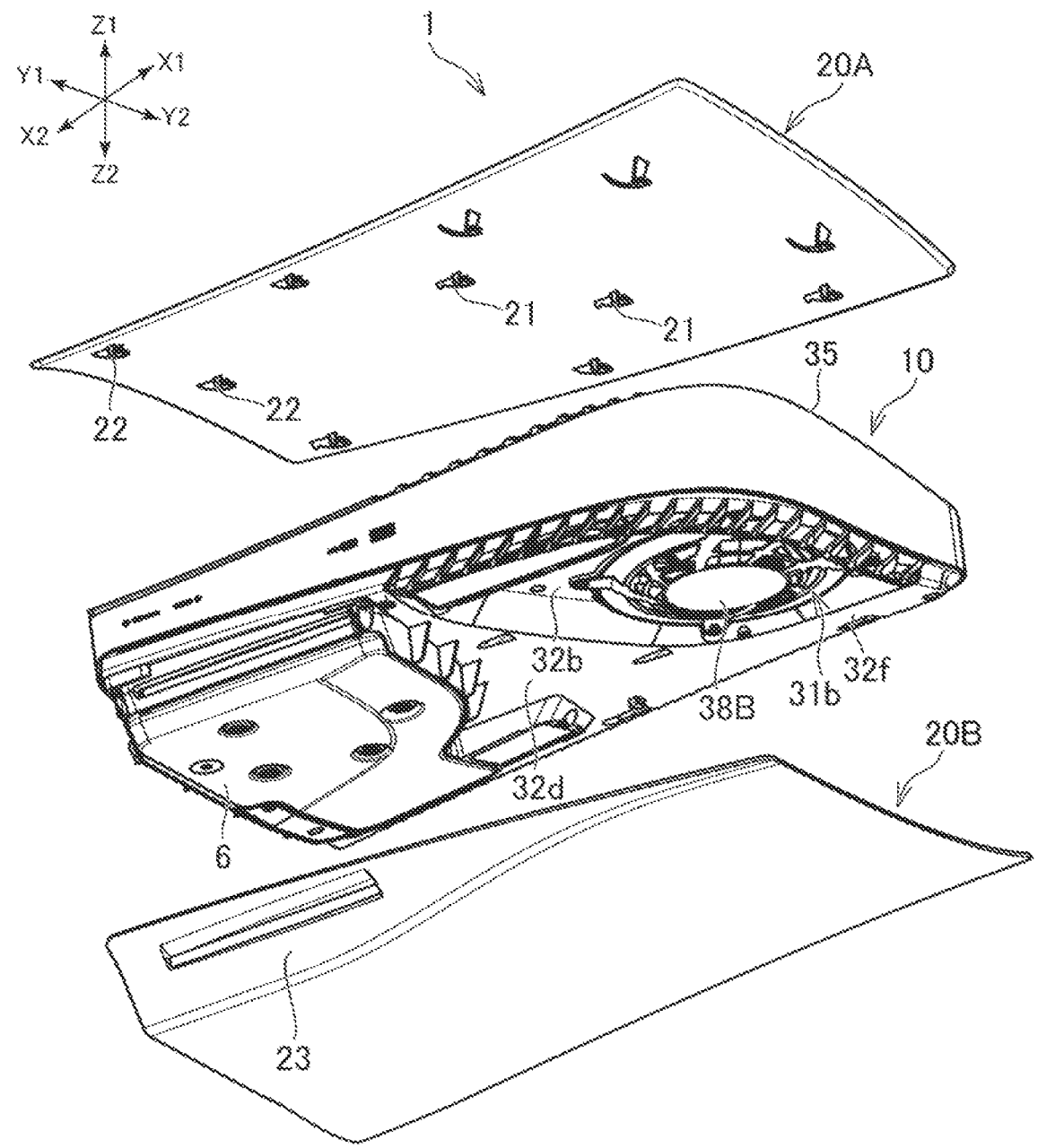
FIG. 2B is an exploded perspective view illustrating the apparatus main body and the upper and lower exterior panels that are included in the electronic apparatus, in a disassembled state.

As illustrated in FIG. 2A, the upper housing member 30A has an upper inlet port 31a located on the upper side of the cooling fan 5. As illustrated in FIG. 2B, the lower housing member 30B has a lower inlet port 31b located on the lower side of the cooling fan 5. By thus respectively forming the inlet ports 31a and 31b in the upper surface and lower surface of the housing 30, it is possible to take air into the inside of the housing 30 efficiently.

An amount of heat generation of the heat generating devices arranged on the upper surface of the circuit board 50 may be larger than an amount of heat generation of the heat generating devices arranged on the lower surface of the circuit board 50. For example, a total amount of heat generation of the integrated circuit 50a and the power supply unit 60 arranged on the upper surface of the circuit board 50 may be larger than a total amount of heat generation of electronic parts 50c (for example, a power transistor and an integrated circuit such as a memory) arranged on the lower surface of the circuit board 50. When the heat generating devices are thus arranged, a center Ch of the cooling fan 5 in the upward-downward direction may be located above the horizontal plane Hp1 including the circuit board 50, as illustrated in FIG. 7A. This enables a large amount of air to be supplied to the devices that generate a large amount of heat.

As illustrated in FIG. 7A, a distance D5 between the upper inlet port 31a and the lower inlet port 31b corresponds to a width in the upward-downward direction of the cooling fan 5. Therefore, air is drawn in from the inlet ports 31a and 31b and smoothly flows in the radial direction of the cooling fan 5. In the example of the electronic apparatus 1, a lower portion (specifically, a base plate 5d, see FIG. 3) of the cooling fan 5 is attached to the edge of the lower inlet port 31b. On the other hand, an upper end (specifically, an upper end of a rotor 5e) of the cooling fan 5 is located at substantially the same height as the edge of the inlet port 31a.

A distance in the upward-downward direction between the upper housing member 30A and the lower housing member 30B at the positions of the inlet ports 31a and 31b, that is, the distance D5 (see FIG. 7A) between the inlet ports 31a and 31b, may be smaller than a distance between the upper housing member 30A and the lower housing member 30B at other positions. In the example of the electronic apparatus 1, the upper housing member 30A has a recessed plate portion 32a (see FIG. 2A) in an upper surface thereof. The recessed plate portion 32a is recessed to the circuit board 50 side with respect to another portion 32c in the upper surface. (In the description here, the other portion 32c will be referred to as a "main plate portion.") The upper inlet port 31a is formed in the recessed plate portion 32a. The heat radiating device 70, the power supply unit 60, and the like are arranged between the main plate portion 32c and the circuit board 50.

Similarly to the upper housing member 30A, the lower housing member 30B has a recessed plate portion 32b in a lower surface thereof. As illustrated in FIG. 2B, the recessed plate portion 32b is recessed with respect to another portion 32d in the lower surface. (In the description here, the other portion 32d will be referred to as a "main plate portion.") The lower inlet port 31b is formed in the recessed plate portion 32b. Fins 81 (see FIG. 8A and FIG. 8B) of the heat radiating device 80 are arranged between the main plate portion 32d and the circuit board 50.

Then, a distance between the upper and lower recessed plate portions 32a and 32b corresponds to the height of the cooling fan 5. According to this structure, it is possible to secure a sufficient distance between the upper and lower main plate portions 32c and 32d and secure a sufficient space for the heat radiating devices 70 and 80 arranged between the upper and lower main plate portions 32c and 32d while making the distance between the inlet ports 31a and 31b correspond to the height of the cooling fan 5.

As illustrated in FIG. 3, the cooling fan 5 includes the rotor 5e having the plurality of fins 5a and the base plate 5d that supports the rotor 5e. The rotor 5e is rotatable relative to the base plate 5d. As illustrated in FIG. 8B, the base plate 5d may, for example, have a ring-shaped peripheral portion 5f, a central portion 5g located on the inside of the peripheral portion 5f, and bridges 5i that couple the peripheral portion 5f and the central portion 5g to each other. Such a base plate 5d may be attached to the lower housing member 30B. Specifically, the ring-shaped peripheral portion 5f may be attached to the edge of the lower inlet port 31b.

Because such a base plate 5d is located on the lower side of the cooling fan 5, the air resistance of an upper portion of the cooling fan 5 is smaller than the air resistance of a lower portion of the cooling fan 5. As described above, the amount of heat generation of the heat generating devices arranged on the upper surface of the circuit board 50 is larger than the amount of heat generation of the heat generating devices arranged on the lower surface of the circuit board 50. That is, the cooling fan 5 is disposed such that the upper portion of the cooling fan 5 having a small air resistance corresponds to a flow passage in which the devices that generate a large amount of heat are arranged.

The circuit board 50 may have a curved edge 50b (see FIG. 15) curved in the shape of an arc as a right edge of the circuit board 50. The cooling fan 5 is disposed on the inside of the curved edge 50b. According to this arrangement of the circuit board 50 and the cooling fan 5, an airflow can be generated on both the upper surface and lower surface of the circuit board 50 while an increase in size of the electronic apparatus 1 is suppressed.

[Positional Relation Between Cooling Fan and Heat Sink]

The power supply unit 60 and the heat radiating device 70 may be abreast of each other in the left-right direction. For example, as illustrated in FIG. 6B, a first heat sink 71 is disposed on the right of the power supply unit 60. The cooling fan 5 may be disposed such that the center line Cf of the cooling fan 5 is located on the right of a right end of the first heat sink 71. In the example of the electronic apparatus 1, the whole of the cooling fan 5 is located on the right of the right end of the first heat sink 71. According to this layout, the first heat sink 71 and the cooling fan 5 do not interfere with each other even when a size in a front-rear direction of the first heat sink 71 is increased. It is therefore possible to suppress an increase in size in the front-rear direction of the whole of the electronic apparatus 1 while securing a sufficient size in the front-rear direction of the first heat sink 71. In the description here, the front-rear direction of the heat sink 71 is a direction in which air passes through the heat sink 71. The left-right direction is a direction orthogonal to the direction in which air passes through the heat sink 71. In addition, the directions referred to in the present specification do not limit the attitude of the electronic apparatus 1 at a time of usage. Hence, for example, the power supply unit 60 and the heat radiating device 70 may be arranged next to each other in the front-rear direction, and the cooling fan 5 and the heat sink 71 may also be arranged next to each other in the front-rear direction. In such a case, a size in the left-right direction of the heat sink 71 can be increased.

As illustrated in FIG. 6B, the cooling fan 5 is located rearward of a front end 61n of a power supply unit case 61 to be described later. In addition, the center line Cf of the cooling fan 5 is located rearward of a front end of the first heat sink 71.

As illustrated in FIG. 6B, a second heat sink 72 (heat radiating device) may be disposed on the right of the first heat sink 71. Then, at least a part of the cooling fan 5 may be located in front of the second heat sink 72. According to this arrangement of the cooling fan 5 and the second heat sink 72, air flowing rearward from the cooling fan 5 can also be used effectively.

As illustrated in FIG. 6B, a width of the second heat sink 72 in the front-rear direction may be smaller than a width of the first heat sink 71 in the front-rear direction. Then, the cooling fan 5 may be disposed in front of the second heat sink 72. According to this arrangement of the heat sinks 71 and 72 and the cooling fan 5, it is also possible to make effective use of air flowing rearward from the cooling fan 5 while suppressing an increase in size in the front-rear direction of the electronic apparatus 1.

As will be explained later in detail, the heat radiating device 70 has a plurality of heat pipes 73A to 73F (see FIG. 13B). The two heat sinks 71 and 72 are thermally connected to each other by the plurality of heat pipes 73. In addition, the two heat sinks 71 and 72 are fixed to a common base plate 75 (see FIG. 13A).

Incidentally, unlike the example of the electronic apparatus 1, the first heat sink 71 and the second heat sink 72 may not be coupled to each other by heat transfer means such as the heat pipes. For example, the second heat sink 72 may be used to cool a heat generating part (for example, an electronic part) different from the integrated circuit 50a to which the first heat sink 71 is connected. In addition, the part disposed on the right of the first heat sink 71 and in the rear of the cooling fan 5 may not be the heat sink 72. For example, a heat generating part (for example, an electronic part) to be cooled may be disposed in the rear of the cooling fan 5.

[Air Flow Passages Between Housings and Exterior Panels]

The upper surface of the housing 30 is covered by the upper exterior panel 20A. A clearance Ua (see FIG. 20A) that allows air to flow to the upper inlet port 31a may be formed between the upper surface of the housing 30 and the upper exterior panel 20A. (The clearance Ua will hereinafter be referred to as an upper flow passage.) As described above, the upper surface of the upper housing member 30A has the recessed plate portion 32a (see FIG. 2A) recessed with respect to the main plate portion 32c. The recessed plate portion 32a is, for example, formed in a right front portion of the upper housing member 30A, and the upper inlet port 31a is formed in the recessed plate portion 32a. For example, the upper flow passage Ua is secured between the recessed plate portion 32a and the upper exterior panel 20A.

Figure 1B:
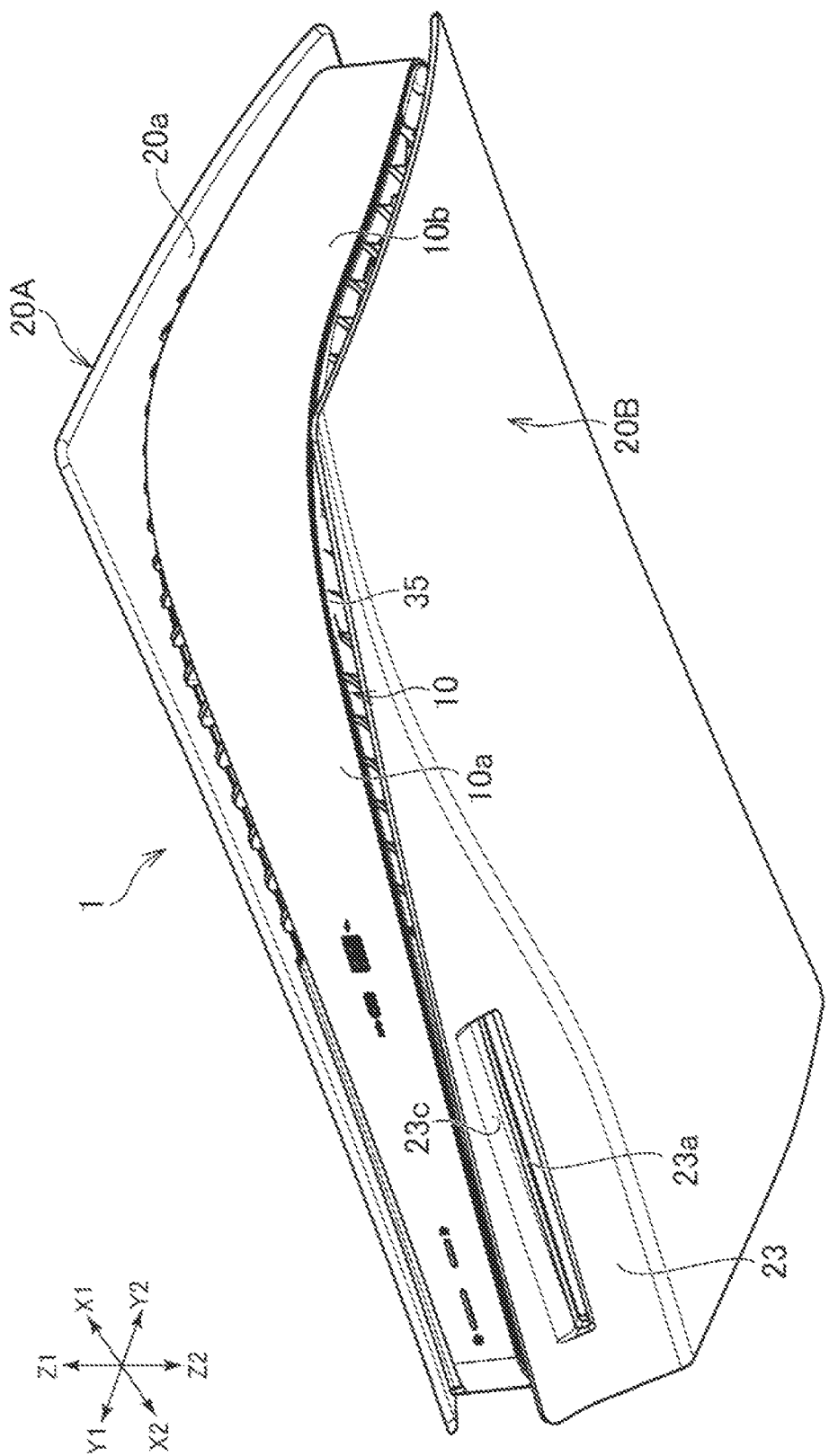
FIG. 1B is a perspective view illustrating the electronic apparatus.
Figure 1C:
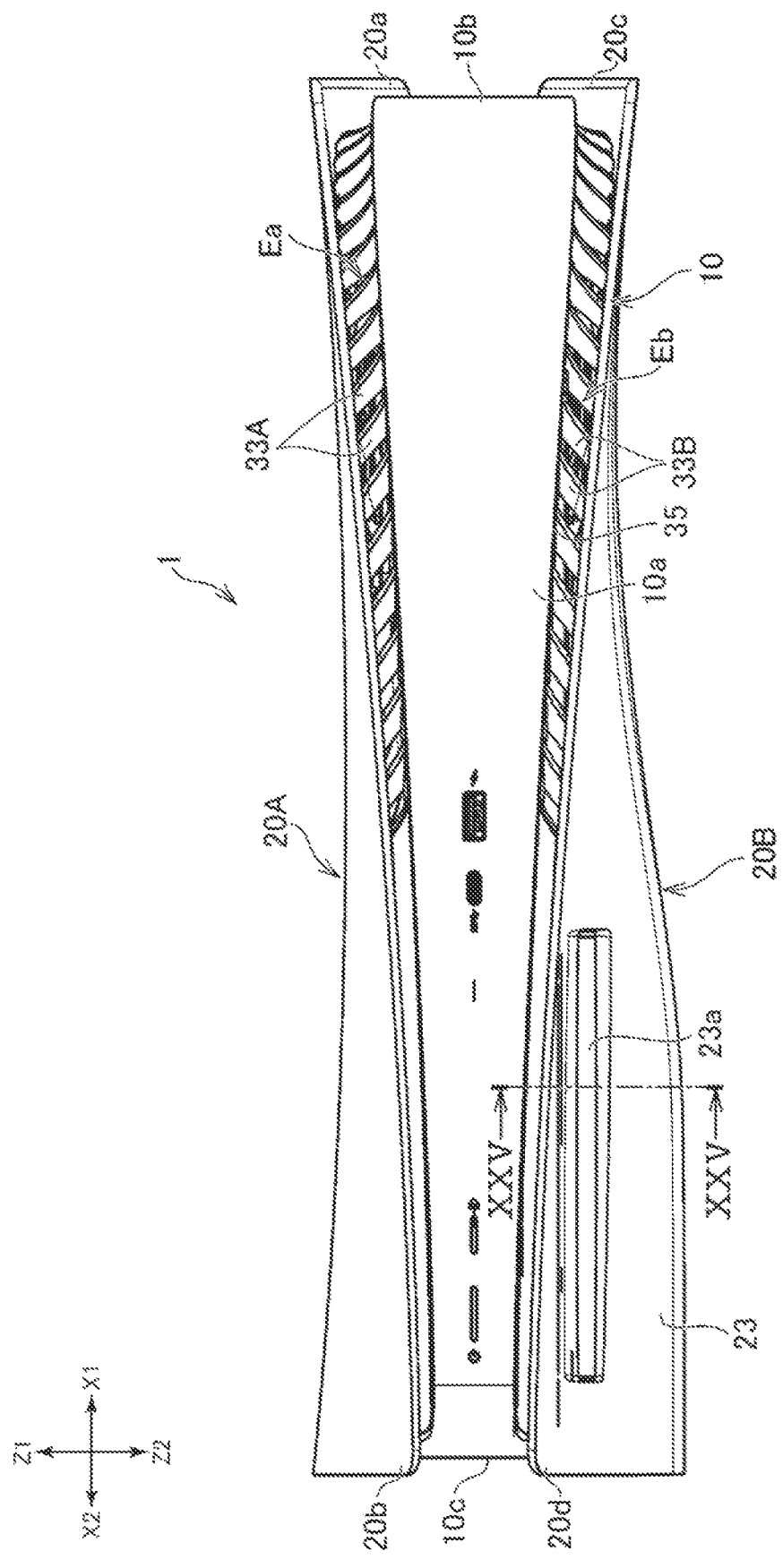
FIG. 1C is a front view illustrating the electronic apparatus.

The upper flow passage Ua may, for example, open toward the front side and/or the right side of the electronic apparatus 1. That is, an inlet port may be provided between a front edge of the upper surface of the upper housing member 30A (specifically, a front edge of the recessed plate portion 32a) and a front edge of the upper exterior panel 20A, or an inlet port may be provided between a right edge of the upper surface of the upper housing member 30A (specifically, a right edge of the recessed plate portion 32a) and a right edge of the upper exterior panel 20A. In the example of the electronic apparatus 1, as illustrated in FIG. 1C and FIG. 1E, there is provided an inlet port Ea which continues from the upper surface of the upper housing member 30A and the front edge of the upper exterior panel 20A to the right edge of the upper exterior panel 20A. The inlet port Ea may, for example, continue from a center in the left-right direction of the front edge of the upper exterior panel 20A to a rear portion of the right edge of the upper exterior panel 20A. The upper housing member 30A may have louvers 33A in the inlet port Ea.

The lower surface of the housing 30 is covered by the lower exterior panel 20B. The lower surface of the housing 30 and the lower exterior panel 20B of the electronic apparatus 1 may have the same structure as the above-described structure of the housing 30 and the upper exterior panel 20A.

That is, a clearance Ub (see FIG. 20A) that allows air to flow to the lower inlet port 31b may be formed between the lower surface of the housing 30 and the lower exterior panel 20B. (The clearance Ub will hereinafter be referred to as a lower flow passage Ub.) As described above, the lower surface of the lower housing member 30B has the recessed plate portion 32b (see FIG. 2B) recessed with respect to the main plate portion 32d. The recessed plate portion 32b is, for example, formed in a right front portion of the lower housing member 30B, and the lower inlet port 31b is formed in the recessed plate portion 32b. For example, the lower flow passage Ub is secured between the recessed plate portion 32b and the lower exterior panel 20B.

The lower flow passage Ub may also, for example, open toward the front side and/or the right side of the electronic apparatus 1. That is, an inlet port may be provided between a front edge of the lower surface of the lower housing member 30B (specifically, a front edge of the recessed plate portion 32b) and a front edge of the lower exterior panel 20B, or an inlet port may be provided between a right edge of the lower surface of the lower housing member 30B (specifically, a right edge of the recessed plate portion 32b) and a right edge of the lower exterior panel 20B. In the example of the electronic apparatus 1, as illustrated in FIG. 1C and FIG. 1E, there is provided an inlet port Eb which continues from the lower surface of the lower housing member 30B and the front edge of the lower exterior panel 20B to the right edge of the lower exterior panel 20B. The inlet port Eb may, for example, continue from a center in the left-right direction of the front edge of the lower exterior panel 20B to a rear portion of the right edge of the lower exterior panel 20B. The lower housing member 30B may have louvers 33B in the inlet port Eb.

A part other than the recessed plate portion 32a in the upper surface of the upper housing member 30A, that is, the main plate portion 32c, and the upper exterior panel 20A are in proximity to each other. The main plate portion 32c and the upper exterior panel 20A may be in contact with each other, or a clearance having a smaller width in the upward-downward direction than the upper flow passage Ua may be formed between the main plate portion 32c and the upper exterior panel 20A.

The airflows formed by driving the cooling fan 5 are discharged rearward from an exhaust port M (see FIG. 1G and FIG. 6A) formed in the back surface of the housing 30. Louvers 33C and 33D may be formed in the exhaust port M. As illustrated in FIG. 2A, the main plate portion 32c may have a part 32e located on the rear side of the recessed plate portion 32a. According to this structure, the main plate portion 32c can prevent the air exhausted rearward from the exhaust port M from flowing toward the inlet port 31a again.

A part other than the recessed plate portion 32b in the lower surface of the lower housing member 30B, that is, the main plate portion 32d, and the lower exterior panel 20B are in proximity to each other. The main plate portion 32d and the lower exterior panel 20B may be in contact with each other, or a clearance having a smaller width in the upward-downward direction than the lower flow passage Ub may be formed between the main plate portion 32d and the lower exterior panel 20B. As illustrated in FIG. 2B, the main plate portion 32d may have a part 32f located on the rear side of the recessed plate portion 32b. According to this structure, the main plate portion 32d can prevent the air exhausted rearward from the exhaust port M from flowing toward the inlet port 31b again.

The external surface of the electronic apparatus 1 is curved such that a width in the upward-downward direction of the electronic apparatus 1 is increased in a right front portion of the electronic apparatus 1 in which the inlet ports 31a and 31b are formed. In other words, the exterior panels 20A and 20B are curved such that a distance between the exterior panels 20A and 20B is increased in the right front portion of the electronic apparatus 1. This external shape of the electronic apparatus 1 makes it easy to secure sufficient widths in the upward-downward direction of the above-described flow passages Ua and Ub. The curves of the exterior panels 20A and 20B will be explained later in detail.

Incidentally, the positions of the inlet ports 31a and 31b formed in the housing 30 and the positions of the inlet ports Ea and Eb formed between the housing 30 and the exterior panels 20A and 20B are not limited to the example illustrated in the electronic apparatus 1. For example, the inlet ports 31a and 31b may be formed in a left portion of the housing 30. In addition, the inlet ports 31a and 31b may be formed in only either the upper surface or the lower surface of the housing 30. The positions of the inlet ports Ea and Eb may be changed as appropriate according to the positions of the inlet ports 31a and 31b.

Figure 6A:
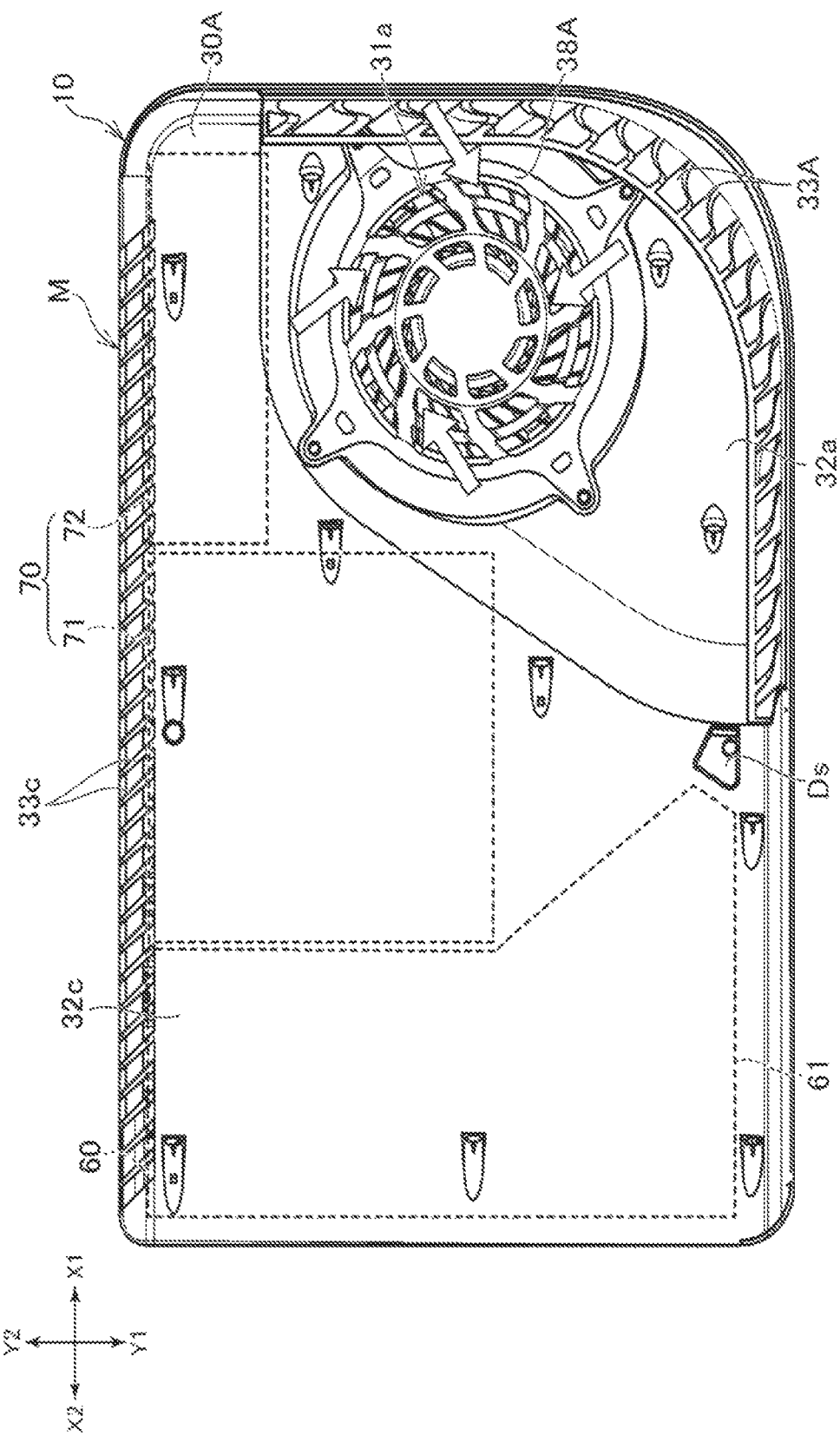
FIG. 6A is a plan view of the apparatus main body.

As illustrated in FIG. 6A, the electronic apparatus 1 may have a fan guard 38A that is attached to the edge of the inlet port 31a and covers the upper side of the cooling fan 5. Similarly, the electronic apparatus 1 may have a fan guard 38B that is attached to the edge of the inlet port 31b and covers the lower side of the cooling fan 5.

Figure 10A:
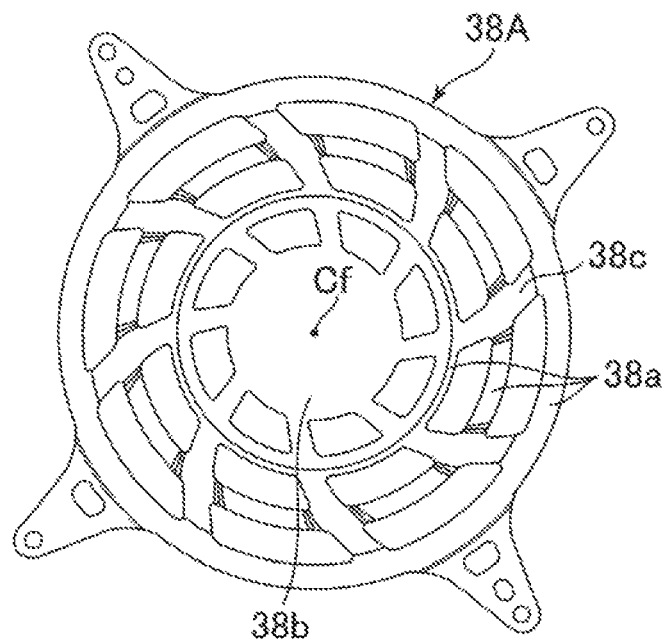
FIG. 10A is a plan view of a fan guard.

As illustrated in FIG. 10A, the fan guard 38A includes a plurality of rings 38a, a central portion 38b located in the center of the plurality of ring 38a, and a plurality of spokes 38c extending from the outside rings 38a to the central portion 38b. In the example of the electronic apparatus 1, the cooling fan 5 rotates in a clockwise direction as viewed in plan. The spokes 38c are inclined so as to conform to the direction of rotation of the cooling fan 5. Specifically, the spokes 38c are inclined with respect to a radial direction so as to advance in the clockwise direction toward the center Cf. According to this structure, the spokes 38c can avoid becoming an air resistance.

Figure 10B:
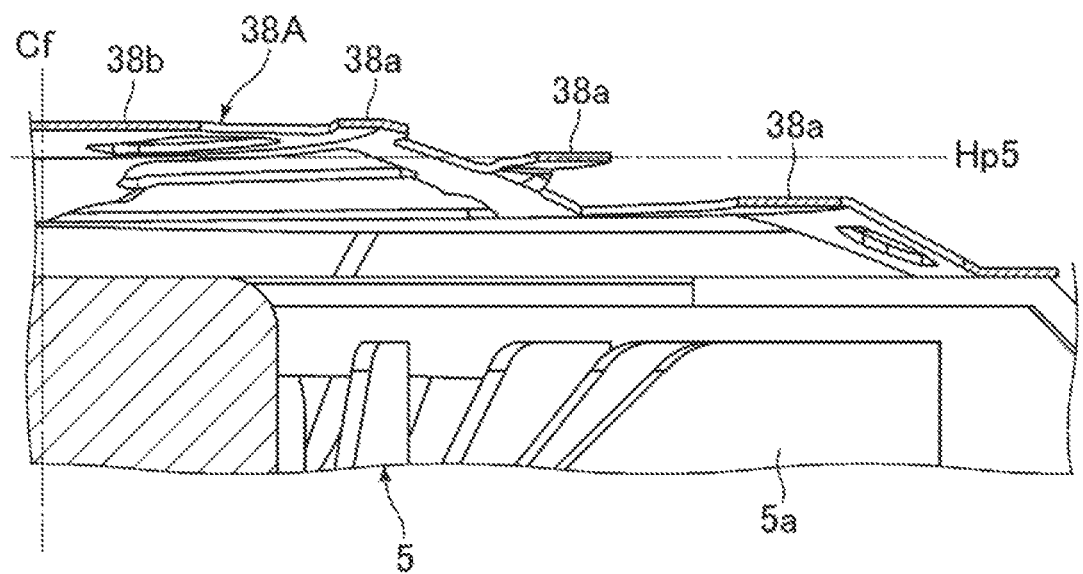
FIG. 10B is a sectional view of the fan guard and a cooling fan, the sectional view being indicated by a line Xb-Xb in FIG. 10A.

As illustrated in FIG. 10B, the positions of the plurality of rings 38a and the position of the central portion 38b are raised toward the center Cf. In addition, the spokes 38c extend obliquely so as to be raised toward the center Cf. This can increase the area of openings formed between the rings 38a and the spokes 38c.

As described above, the spokes 38c extend obliquely so as to be raised toward the center Cf. On the other hand, each of the rings 38a may have a cross section along a plane perpendicular to the rotational center line Cf of the cooling fan 5 (plane Hp5 in FIG. 10B). This can increase the area of the openings formed between the rings 38a and the spokes 38c. The upper exterior panel 20A is disposed on the upper side of the fan guard 38A. As described above, the upper exterior panel 20A is curved. The fan guard 38A may be curved in conformity with the curve of the upper exterior panel 20A.

The fan guard 38B that covers the lower side of the cooling fan 5 may have the same structure as the upper fan guard 38A. That is, the fan guard 38B may be obtained by inverting the upper surface and lower surface of the fan guard 38A.

[Power Supply Unit]

As illustrated in FIG. 7B, the power supply unit 60 includes a power supply circuit 62 and a power supply unit case 61 that houses the power supply circuit 62. The power supply unit case 61 has a wall portion 61a located in front of the first heat sink 71. A plurality of air intake holes 61b may be formed in the wall portion 61a. (The wall portion 61a will hereinafter be referred to as an "intake air wall.") As illustrated in FIG. 6B, the heat sinks 71 and 72 have a plurality of fins 71a and 72a abreast of one another in the left-right direction. Therefore, air passes through the heat sinks 71 and 72 in the front-rear direction. The intake air wall 61a is disposed obliquely with respect to the front-rear direction and the left-right direction. The external surface of the intake air wall 61a faces the first heat sink 71. Here, the "external surface of the intake air wall 61a faces the first heat sink 71" means that a straight line extending from the external surface and perpendicular to the external surface intersects the first heat sink 71. The cooling fan 5 is disposed so as to send air to the intake air wall 61a. In the example of the electronic apparatus 1, the cooling fan 5 is separated rightward from the external surface of the intake air wall 61a. An airflow from the cooling fan 5 to the intake air wall 61a is formed by flow passage walls 34A and 34B to be described later.

According to the shape and disposition of the power supply unit case 61, as illustrated in FIG. 6B, a part of the air reaching the intake air wall 61a passes through the air intake holes 61b and enters the inside of the power supply unit case 61. In addition, another part of the air reaching the intake air wall 61a moves to the first heat sink 71 while guided by the intake air wall 61a. That is, the intake air wall 61a makes it possible to secure an airflow to be supplied to the first heat sink 71, and cool the power supply unit 60 by a cold air (air not warmed by another heat generating device or heat radiating device) at the same time. When the power supply unit 60 can be cooled by the cold air, a clearance between circuit parts 62a and 62b included in the power supply circuit 62 (for example, a transformer and a capacitor) can be reduced, so that the power supply unit 60 can be miniaturized.

The power supply unit case 61 includes a case rear portion 61c located on the left side of the first heat sink 71 and a case front portion 61d extending frontward beyond the position of the front end of the first heat sink 71. In the example of the electronic apparatus 1, the intake air wall 61a is a right side wall of the case front portion 61d and extends obliquely frontward and rightward from a right side wall 61f of the case rear portion 61c. On the other hand, a left side wall 61e of the power supply unit case 61 extends frontward in a straight manner from the case rear portion 61c to the case front portion 61d. Hence, a width in the left-right direction of the case front portion 61d increases gradually toward the front.

Figure 11A:
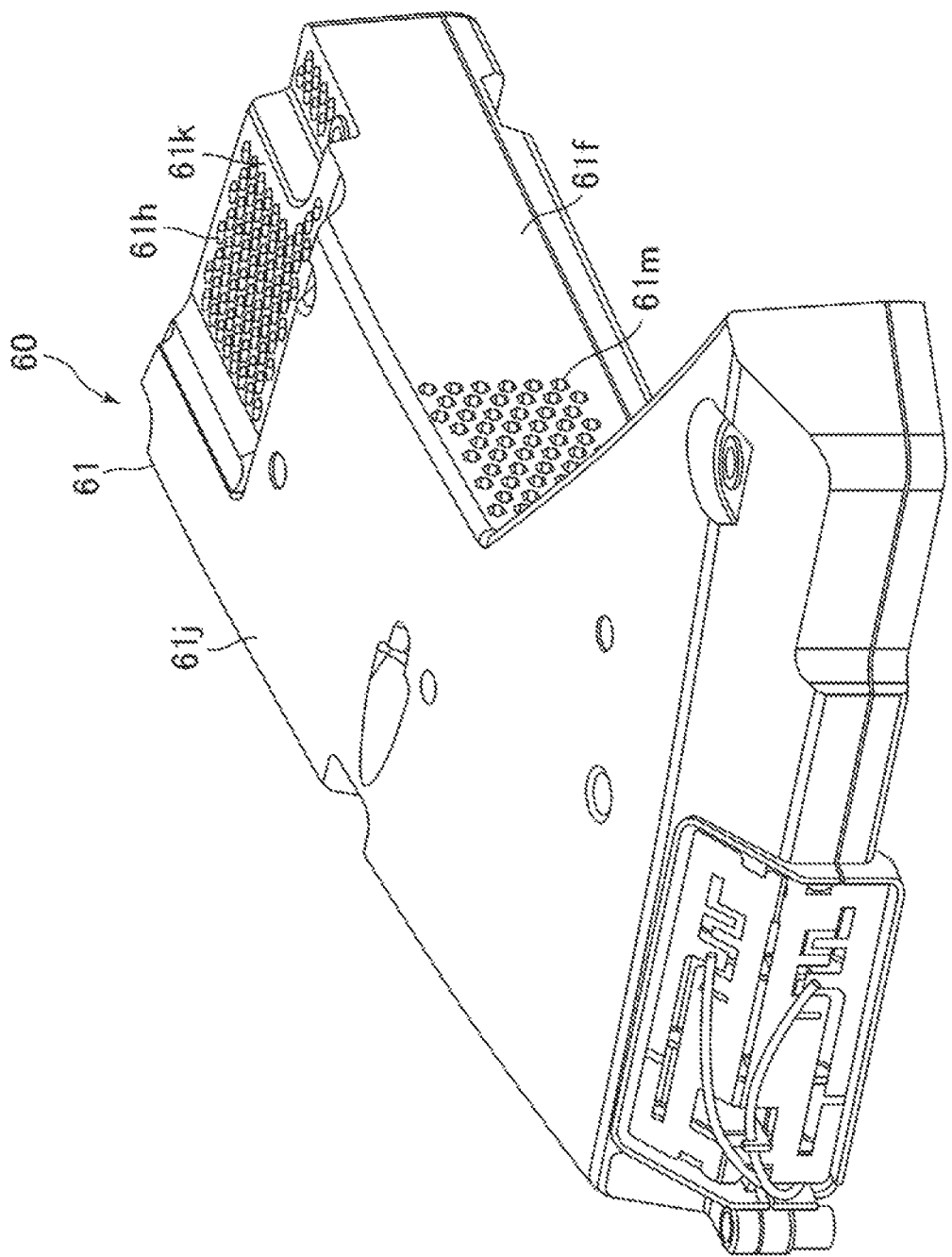
FIG. 11A is a perspective view of a power supply unit.
Figure 11B:
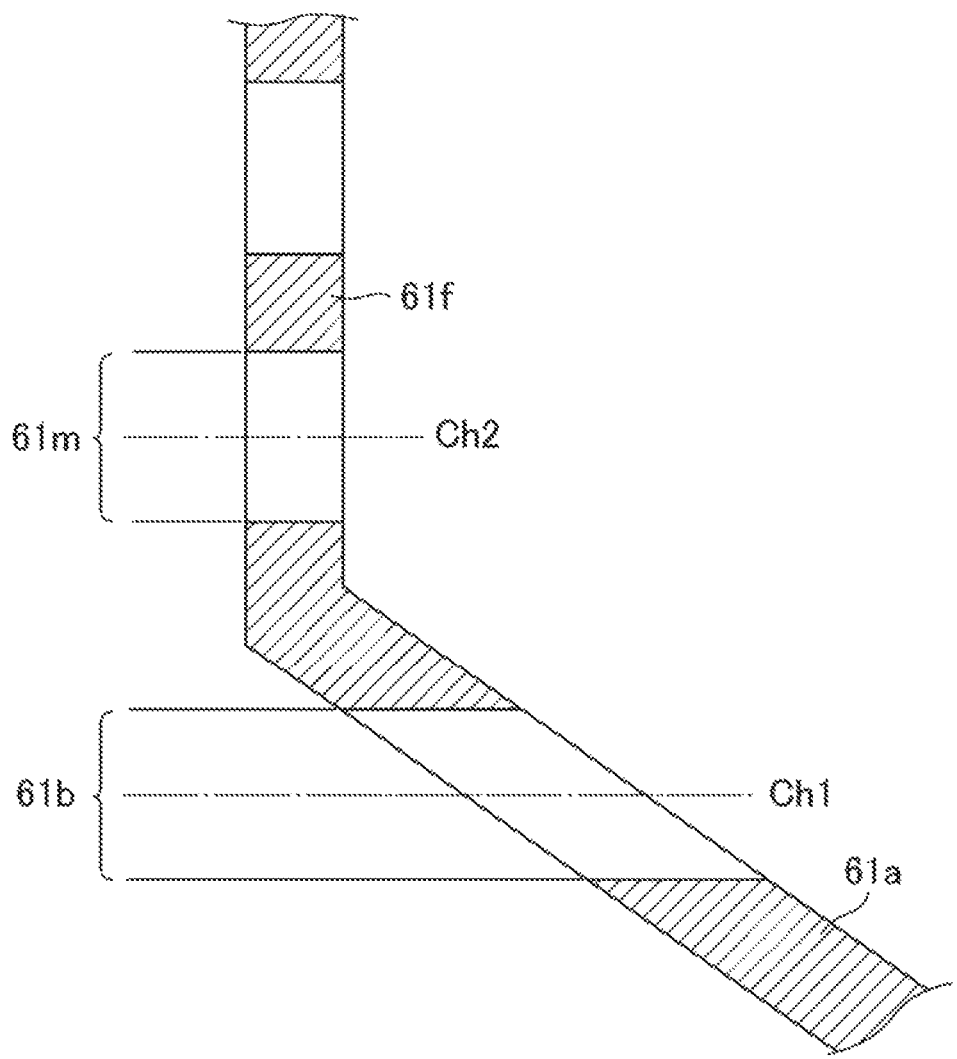
FIG. 11B is a sectional view of an intake air wall and a side wall.

As illustrated in FIG. 11B, the air intake holes 61b may be formed obliquely with respect to the intake air wall 61a. That is, a center line Ch1 of an air intake hole 61b may be inclined with respect to the intake air wall 61a. For example, the center line Ch1 of the air intake hole 61b may be along the left-right direction. This makes it easy for the air discharged from the cooling fan 5 to pass through the intake air wall 61a. Incidentally, the structure of the air intake hole 61b is not limited to the example of the electronic apparatus 1. The center line Ch1 of the air intake hole 61b may be inclined with respect to both the left-right direction and the front-rear direction in conformity with the direction of the airflow. For example, the center line Ch1 may extend obliquely frontward and rightward from the intake air wall 61a.

As illustrated in FIG. 11A and FIG. 11B, air intake holes 61m may also be formed in the right side wall 61f of the case rear portion 61c. In such a case, a direction in which the air intake holes 61m penetrate the right side wall 61f, that is, the direction of a center line Ch2 of an air intake hole 61m, may be the same as that of the air intake holes 61b in the intake air wall 61a. This can facilitate formation of the two kinds of air intake holes 61b and 61m.

As illustrated in FIG. 7B, a part of the power supply circuit 62 may be disposed in a space provided within the case front portion 61d and secured by the inclination of the intake air wall 61a, that is, a space Sf (see FIG. 6B) formed on the inside of the intake air wall 61a. Circuit parts 62b included in the power supply circuit 62 are housed in this space and are located in front of the first heat sink 71. According to such a layout, it is possible to make effective use of the volume of the power supply unit case 61.

The circuit parts 62b arranged in the space formed on the inside of the intake air wall 61a may have a smaller size than other parts 62a. This can facilitate an airflow within the power supply unit case 61.

A plurality of exhaust holes 61g and 61h may be formed in the case rear portion 61c. More specifically, as illustrated in FIG. 7C, the plurality of exhaust holes 61g may be formed in a rear wall 61i of the case rear portion 61c, and the plurality of exhaust holes 61h may be formed in a rear portion 61k of an upper wall 61j of the power supply unit case 61. In the example of the electronic apparatus 1, the rear portion 61k of the upper wall 61j is recessed with respect to a front portion of the upper wall 61j. Due to this recess, an air flow passage Se is secured between the upper housing member 30A and the rear portion 61k.

The positions of the exhaust holes 61g and 61h are not limited to the example illustrated in the electronic apparatus 1. For example, the exhaust holes 61h formed in the upper wall 61j may not be present. A plurality of exhaust holes may be formed in a rearmost portion of the left side wall 61e.

[Flow Passage Walls Defining Air Flow Passage]

Figure 4:
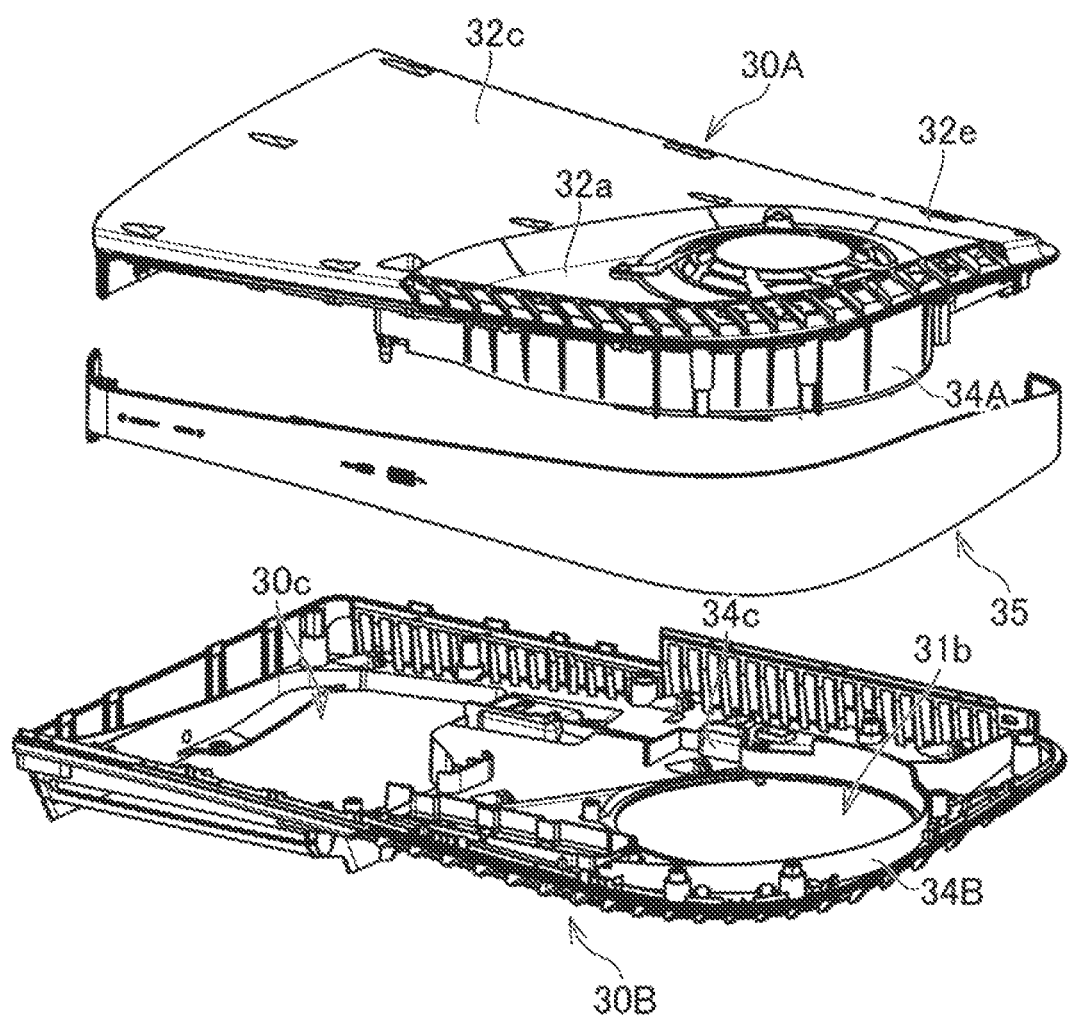
FIG. 4 is an exploded perspective view of a housing and a front cover that are included in the apparatus main body.

The heat radiating device 70 includes the first heat sink 71 and the second heat sink 72 abreast of each other in the left-right direction. The cooling fan 5 is located in front of the second heat sink 72. As illustrated in FIG. 4 and FIG. 6B, the upper housing member 30A may have a flow passage wall 34A that defines the flow passage of the airflow sent out from the cooling fan 5 and guides the airflow toward the first heat sink 71. The flow passage wall 34A has a part curved along the outer circumference of the cooling fan 5. In the example of the electronic apparatus 1, the whole of the flow passage wall 34A is curved.

As illustrated in FIG. 6B, as a distance from a starting point 34a of the flow passage wall 34A increases in the extending direction of the flow passage wall 34A, a distance from the cooling fan 5 to the flow passage wall 34A (distance in the radial direction of the cooling fan 5) increases. The flow passage wall 34A extends from the periphery of the cooling fan 5 toward the intake air wall 61a of the power supply unit case 61. The intake air wall 61a is located on an extension of an end 34*b* of the flow passage wall 34A. Such a flow passage wall 34A enables the air from the cooling fan 5 to be sent to the intake air wall 61*a* smoothly.

The intake air wall 61*a* may be curved similarly to the flow passage wall 34A. For example, the flow passage wall 34A is formed along a curve defined by a predetermined function. The intake air wall 61*a* may be disposed along the same curve. For example, the flow passage wall 34A is formed along a clothoid curve having the rotational center line Cf of the cooling fan 5 as an origin. In such a case, the intake air wall 61*a* may also be curved along the same clothoid curve. Thus, a smooth airflow is formed from the cooling fan 5 to the intake air wall 61*a* and the first heat sink 71. Incidentally, the curve on which the curving of the flow passage wall 34A and the intake air wall 61*a* is based may be, for example, an involute curve, a logarithmic spiral, a Nielsen spiral, or the like instead of the clothoid curve.

The flow passage wall 34A surrounds the periphery of the cooling fan 5 located on the outside of the outer edge of the circuit board 50. The flow passage wall 34A extends downward from a part forming the upper surface of the apparatus main body 10 in the upper housing member 30A (the part is the recessed plate portion 32*a* in the example of the electronic apparatus 1). A lower edge of the flow passage wall 34A may reach the lower housing member 30B.

In the example of the electronic apparatus 1, as illustrated in FIG. 4 and FIG. 8B, a flow passage wall 34B that projects upward is formed on the lower housing member 30B. Similarly to the flow passage wall 34A, the flow passage wall 34B defines the flow passage of the airflow sent out from the cooling fan 5. The flow passage wall 34B has a part curved along the periphery of the cooling fan 5. In the example of the electronic apparatus 1, similarly to the flow passage wall 34A, the whole of the flow passage wall 34B is curved.

As illustrated in FIG. 7B, the lower edge of the flow passage wall 34A of the upper housing member 30A is connected to the flow passage wall 34B of the lower housing member 30B in the upward-downward direction. The flow passage walls 34A and 34B are connected to each other to form one wall extending along the periphery of the cooling fan 5. In the example of the electronic apparatus 1, the flow passage walls 34A and 34B function as a wall on the front side of the cooling fan 5.

The structure of the flow passage walls 34A and 34B is not limited to the example of the electronic apparatus 1. For example, only either the upper housing member 30A or the lower housing member 30B may have a flow passage wall formed thereon. Then, the flow passage wall formed on the one housing member may extend upward or downward until reaching the other housing member.

As illustrated in FIG. 4, the electronic apparatus 1 has a front exterior panel 35 that covers the flow passage walls 34A and 34B as a part of exterior members. The front exterior panel 35 is located on the front side and right side of the curved flow passage walls 34A and 34B and covers the whole of the flow passage walls 34A and 34B. Due to the presence of the front exterior panel 35, a degree of freedom can be secured for the shape of the flow passage walls 34A and 34B. A circuit board mounted with switches operated by the power button 2*a* and the optical disk ejecting button 2*b* may be attached to the front exterior panel 35, or a circuit board mounted with the connectors 3*a* and 3*b* may be attached to the front exterior panel 35.

[Air Flow Passage on Lower Side of Circuit Board]

As described above, the power supply unit 60 and the heat radiating device 70 are arranged on the upper surface of the circuit board 50, and the power supply unit 60 and the heat radiating device 70 are abreast of each other in the left-right direction. The air sent out from the cooling fan 5 passes through the heat radiating device 70 and the power supply unit case 61. Hence, an airflow is formed in the whole of a space between the circuit board 50 and the upper housing member 30A. On the other hand, the lower side of the circuit board 50 may be provided with a member that reduces the width of an air flow passage between the circuit board 50 and the lower housing member 30B. Then, the width of the air flow passage between the lower surface of the circuit board 50 and the lower housing member 30B may be narrower than the width of the air flow passage between the upper surface of the circuit board 50 and the upper housing member 30A. This facilitates securing of a speed of an airflow formed on the lower side of the circuit board 50.

In the example of the electronic apparatus 1, the optical disk drive 6 is disposed on the lower side of the circuit board 50. The optical disk drive 6 reduces the width of the air flow passage between the circuit board 50 and the lower housing member 30B.

As illustrated in FIG. 8B, the optical disk drive 6 is separated leftward from the cooling fan 5 as viewed in plan of the electronic apparatus 1. The optical disk drive 6 has a disk drive case 6*a*. A spindle motor (not illustrated) that rotates an optical disk, a pickup module (not illustrated), and the like are arranged within the disk drive case 6*a*.

Figure 8A:
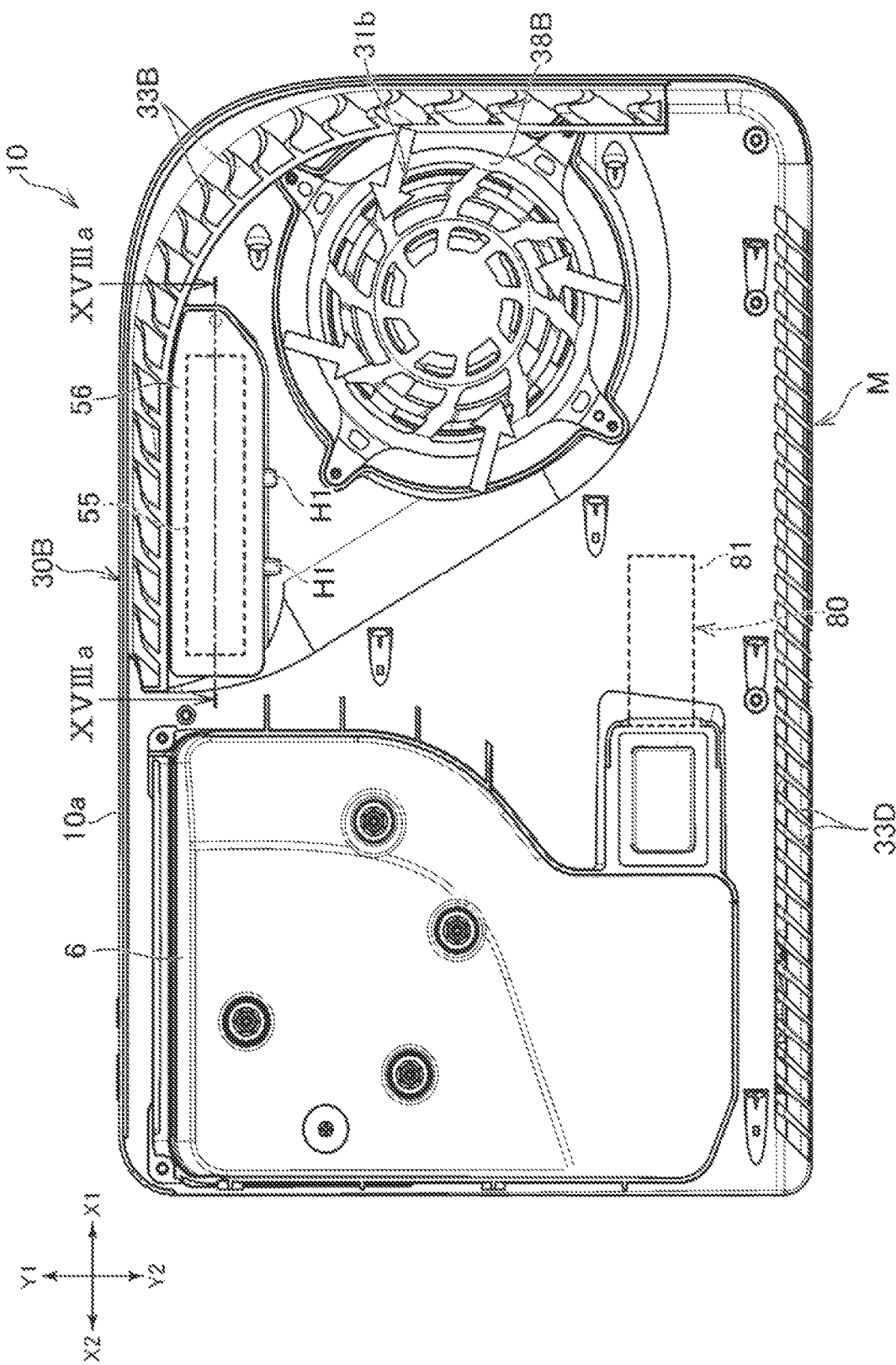
FIG. 8A is a bottom view of the apparatus main body.

As illustrated in FIG. 8B, an air flow passage Sb from the cooling fan 5 to the exhaust port M (see FIG. 8A) is formed between the cooling fan 5 and the disk drive case 6*a*. The disk drive case 6*a* limits the air flow passage Sb to a right region on the circuit board 50. The disk drive case 6*a* has a right side wall 6*b* that faces the cooling fan 5 and that extends in the front-rear direction at a position separated leftward from the cooling fan 5. The air flow passage Sb is formed between the right side wall 6*b* and the cooling fan 5. The plurality of fins 81 included in the heat radiating device 80 are arranged at a midpoint of the air flow passage Sb.

A wall defining the air flow passage Sb may be formed on the lower housing member 30B. As illustrated in FIG. 4 and FIG. 8B, for example, the lower housing member 30B may have a flow passage wall 34*c* that extends from the periphery of the cooling fan 5 toward the heat radiating device 80. In the example of the electronic apparatus 1, the flow passage wall 34*c* extends from a starting point of the above-described flow passage wall 34B curved on the periphery of the cooling fan 5, toward the heat radiating device 80.

Incidentally, the electronic apparatus 1 may not have the optical disk drive 6. In such a case, a wall may limit the air flow passage Sb. A wall portion formed on the lower housing member 30B may be used as a member that reduces the width of the air flow passage between the circuit board 50 and the lower housing member 30B as compared with the air flow passage between the circuit board 50 and the upper housing member 30A.

As illustrated in FIG. 4, an opening 30*c* corresponding in size and shape to the disk drive case 6*a* is formed in the lower housing member 30B. The lower surface of the disk drive case 6*a* may be exposed downward from the opening 30*c*. According to this structure, the width in the upward-downward direction of the electronic apparatus 1 can be reduced by the thickness of the lower housing member 30B.

[Dust Collecting Chamber]

As illustrated in FIG. 6B, a dust collecting chamber Ds may be provided to the flow passage wall 34A. The dust collecting chamber Ds captures dust included in the airflow formed on the upper side of the circuit board 50 and collects the captured dust. According to this structure, it is possible to reduce an amount of dust entering devices arranged downstream of the dust collecting chamber Ds, the devices being the first heat sink 71, the power supply unit 60, and the like.

Figure 5:
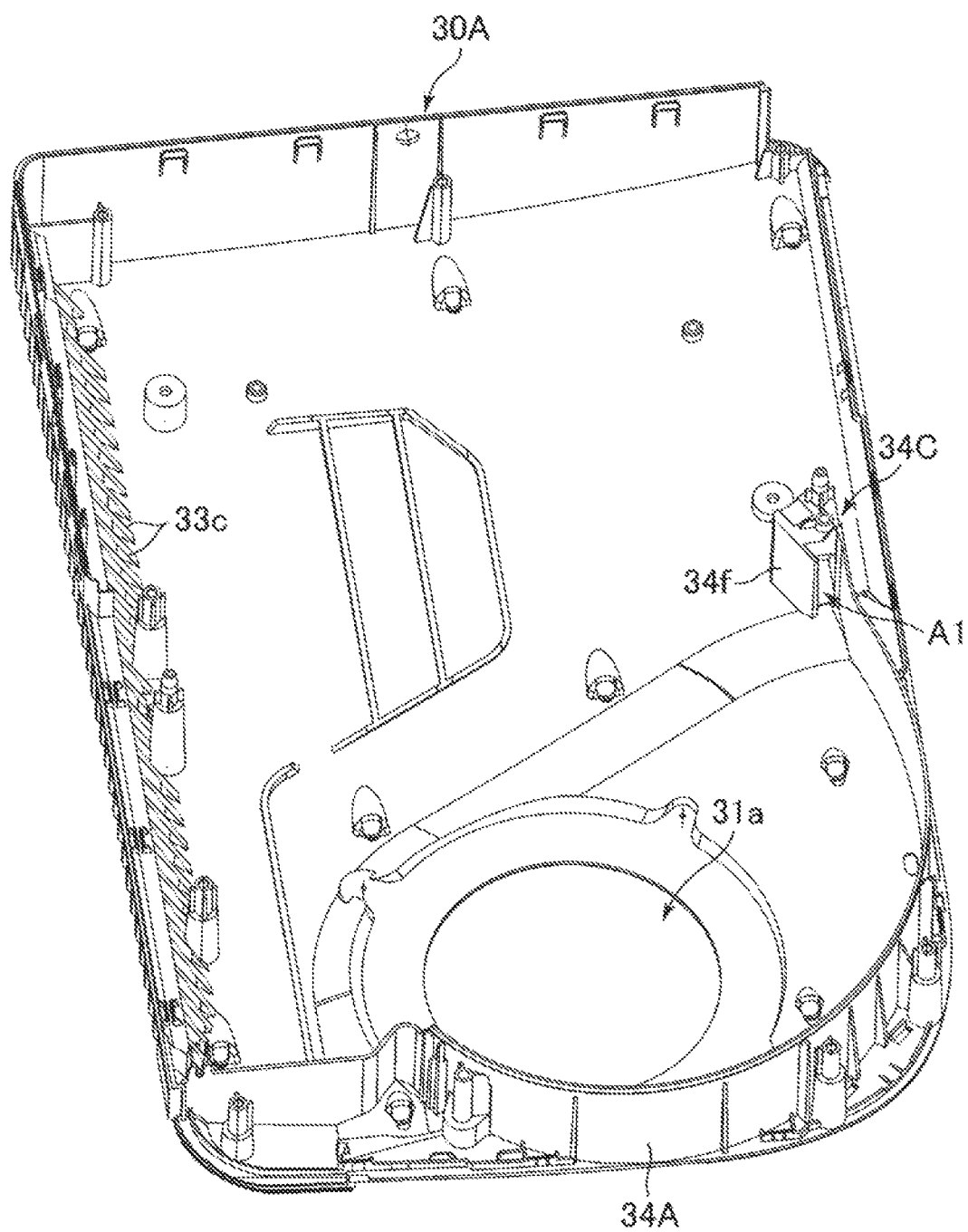
FIG. 5 is a perspective view illustrating the inside of an upper housing member.

The dust collecting chamber Ds is defined by a dust collecting chamber wall 34C (see FIG. 5). The dust collecting chamber wall 34C is in a box shape opening in two directions to be described later. The dust collecting chamber wall 34C is, for example, formed integrally with the upper housing member 30A. This makes it possible to secure the dust collecting chamber Ds without increasing the number of parts. In addition, because the upper housing member 30A is a member that covers the whole of the internal devices, a degree of freedom of the position of the dust collecting chamber Ds can be secured when the dust collecting chamber wall 34C is formed integrally with the upper housing member 30A.

As viewed in plan of the electronic apparatus 1, the cooling fan 5 rotates in the clockwise direction about the rotational center line Cf. In the example of the electronic apparatus 1, the flow passage wall 34A extends in the clockwise direction from the starting point 34*a* of the flow passage wall 34A along the periphery of the cooling fan 5. The whole of the flow passage wall 34A is curved. The dust collecting chamber Ds may be provided to the thus curved flow passage wall 34A. More specifically, the dust collecting chamber Ds may be located at an end portion of the flow passage wall 34A. The position of the dust collecting chamber Ds is not limited to the example of the electronic apparatus 1. The dust collecting chamber Ds may be provided at a midpoint of the flow passage wall 34A.

Two devices each of which is a heat generating device or a heat radiating device may be disposed downstream of the air flow passage formed by the flow passage wall 34A. The dust collecting chamber Ds may be located upstream of the two devices. In the example of the electronic apparatus 1, the power supply unit 60 and the first heat sink 71 are located downstream of the air flow passage defined by the flow passage wall 34A. The dust collecting chamber Ds is located upstream of the power supply unit 60 and the first heat sink 71. In such a manner, sending dust to the two devices can be prevented by the one dust collecting chamber Ds. In the example of the electronic apparatus 1, the dust collecting chamber Ds is located between the intake air wall 61*a* of the power supply unit case 61 and the flow passage wall 34A.

Figure 12:
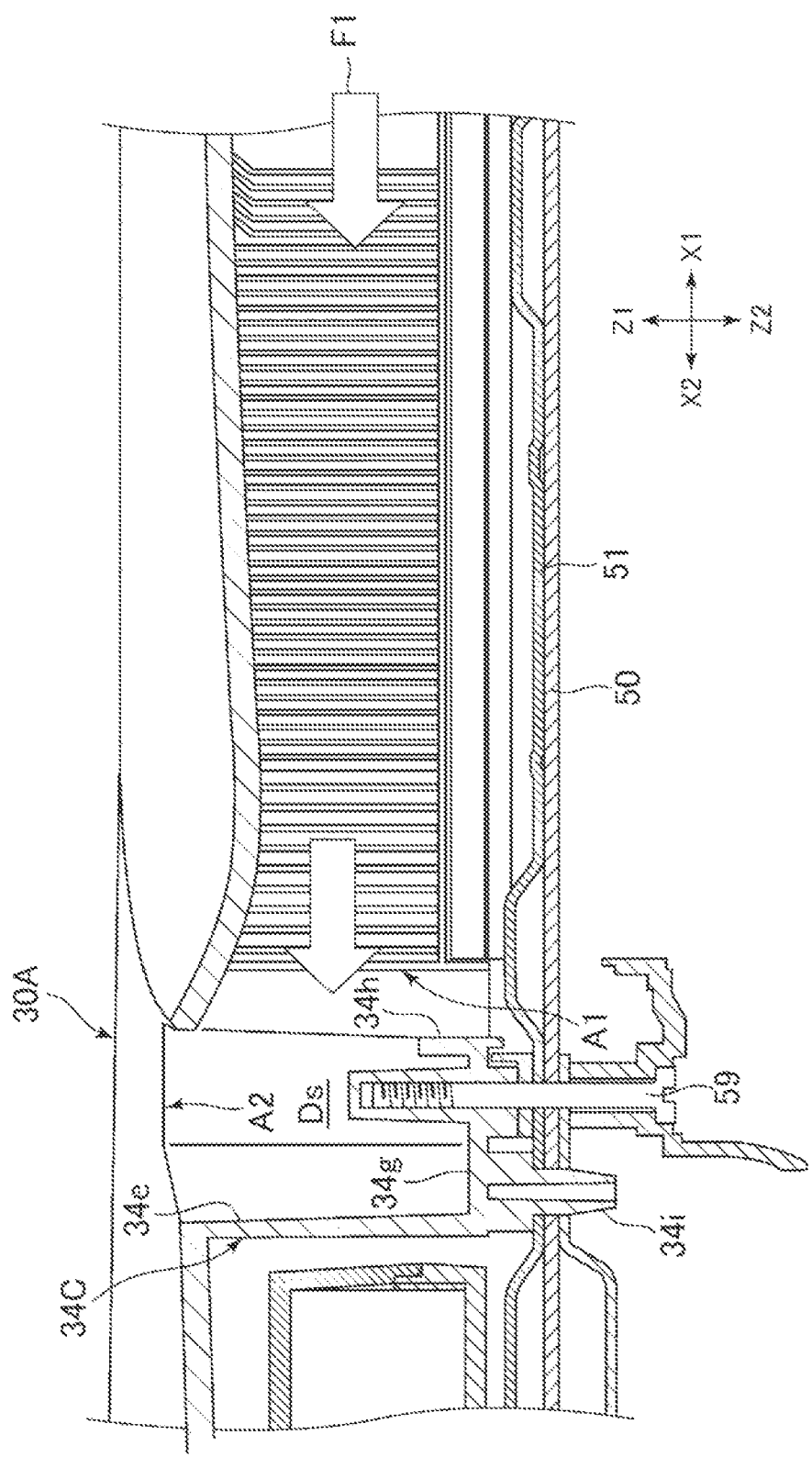
FIG. 12 is a sectional view of the apparatus main body, the sectional view being obtained in a cutting plane indicated by a line XII-XII in FIG. 6B.

As illustrated in FIG. 12, the dust collecting chamber Ds has a first opening A1 that opens in a direction along the circuit board 50 toward an air flow passage Sa defined by the flow passage wall 34A and the intake air wall 61*a*. Dust included in air flowing through the air flow passage Sa is captured from the first opening A1 into the dust collecting chamber Ds. The dust collecting chamber Ds also has a second opening A2 that opens to the outside of the air flow passage Sa in a direction intersecting the circuit board 50. According to this structure of the dust collecting chamber Ds, the dust can be collected in the dust collecting chamber Ds, and the collected dust can be discharged through the second opening A2 by relatively simple work.

The direction in which the second opening A2 opens is, for example, a direction orthogonal to the circuit board 50. The second opening A2 opens to the outside of the housing 30, more specifically, to the upper side of the upper housing member 30A. The upper exterior panel 20A covers the second opening A2 and prevents exposure of the second opening A2 to the outside. A user can expose the second opening A2 by removing the upper exterior panel 20A from the upper housing member 30A and extract the dust collected in the dust collecting chamber Ds. For example, the dust collected in the dust collecting chamber Ds can be sucked by a vacuum cleaner. In addition, because the upper exterior panel 20A is used as a member that covers the second opening A2, an increase in the number of parts can be suppressed.

The dust collecting chamber wall 34C defining the dust collecting chamber Ds has a side wall 34*e* (see FIG. 12) that extends downward from an edge of the second opening A2. As illustrated in FIG. 6B, a part 34*f* of the side wall 34*e* is located between the flow passage wall 34A and the intake air wall 61*a* and faces the air flow passage Sa. (The part 34*f* will hereinafter be referred to as an "inner wall.") The inner wall 34*f* may be curved in conformity with the flow passage wall 34A. For example, the inner wall 34*f* may be formed along the curve of a function defining the curve of the flow passage wall 34A (for example, a clothoid curve). Further, in another example, as indicated by a broken line in FIG. 6B, the inner wall 34*f* may extend to the inside of the curve of the function defining the curve of the flow passage wall 34A (for example, the clothoid curve). This can enlarge the first opening A1 and increase an amount of air entering the dust collecting chamber Ds.

As illustrated in FIG. 12, the dust collecting chamber wall 34C may have a bottom portion 34*g* located at a lower edge of the side wall 34*e*. The dust captured in the dust collecting chamber Ds is collected on the bottom portion 34*g*. The bottom portion 34*g* may have a bank portion 34*h* along the edge of the first opening A1. According to this, it is possible to prevent the dust collected on the bottom portion 34*g* from returning to the air flow passage Sa. The bottom portion 34*g* may be attached to the circuit board 50 by a boss 34*i* and a screw 59.

Incidentally, when the upper exterior panel 20A is attached to the upper housing member 30A, a clearance may be formed between the edge of the second opening A2 and the upper exterior panel 20A. This facilitates formation of an airflow that enters the dust collecting chamber Ds from the first opening A1 and that is discharged to the outside from the dust collecting chamber Ds through the second opening A2.

Incidentally, the structure of the dust collecting chamber Ds is not limited to the example of the electronic apparatus 1. For example, instead of using the upper exterior panel 20A as a cover that covers the second opening A2, a dedicated cover (lid) that covers the second opening A2 may be provided to the second opening A2. In another example, the dust collecting chamber Ds may be formed in the power supply unit case 61 instead of being formed in the upper housing member 30A.

Figure 26A:
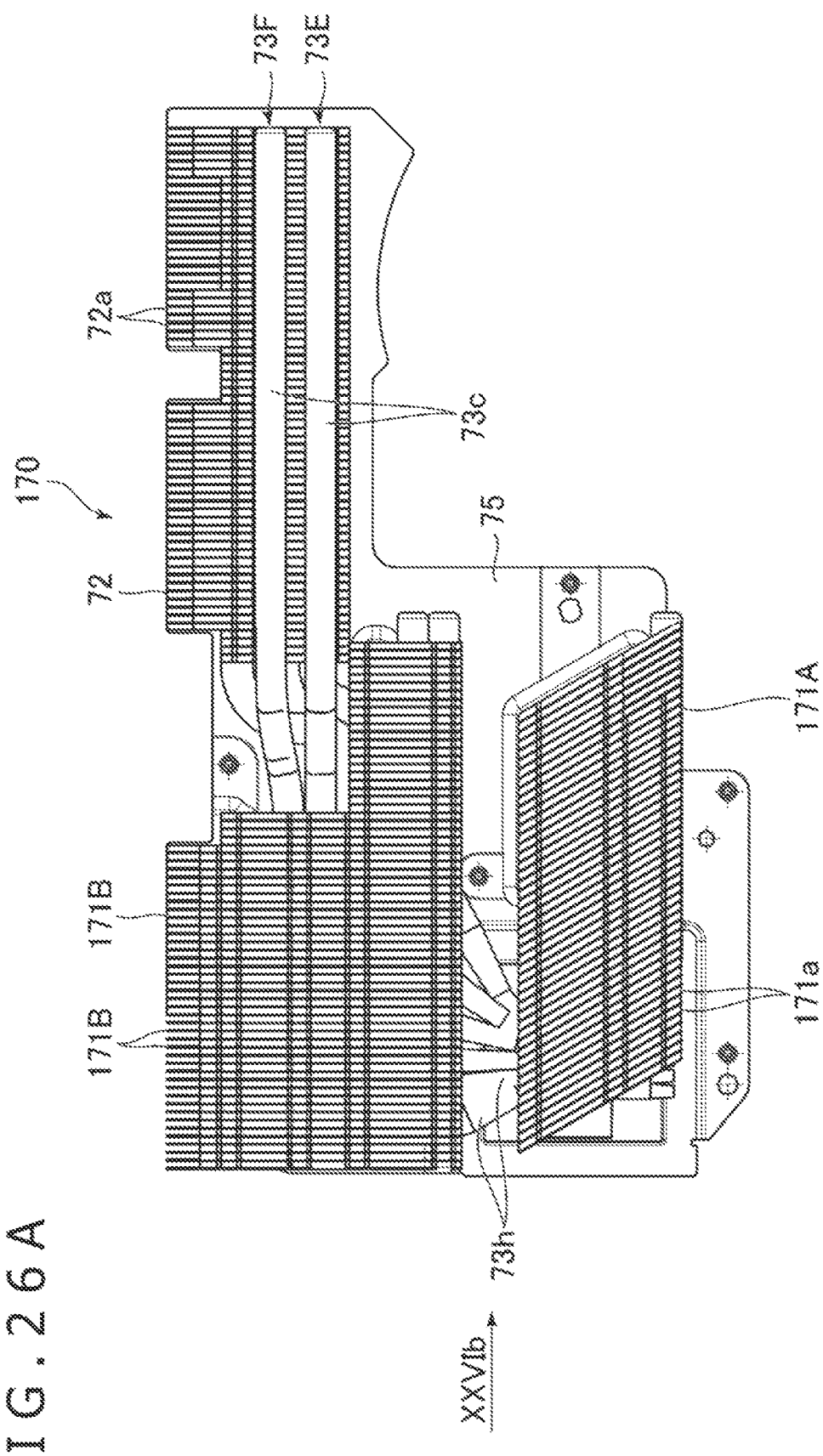
FIG. 26A is a plan view illustrating a modification of the heat radiating device illustrated in FIG. 13A.
Figure 26B:
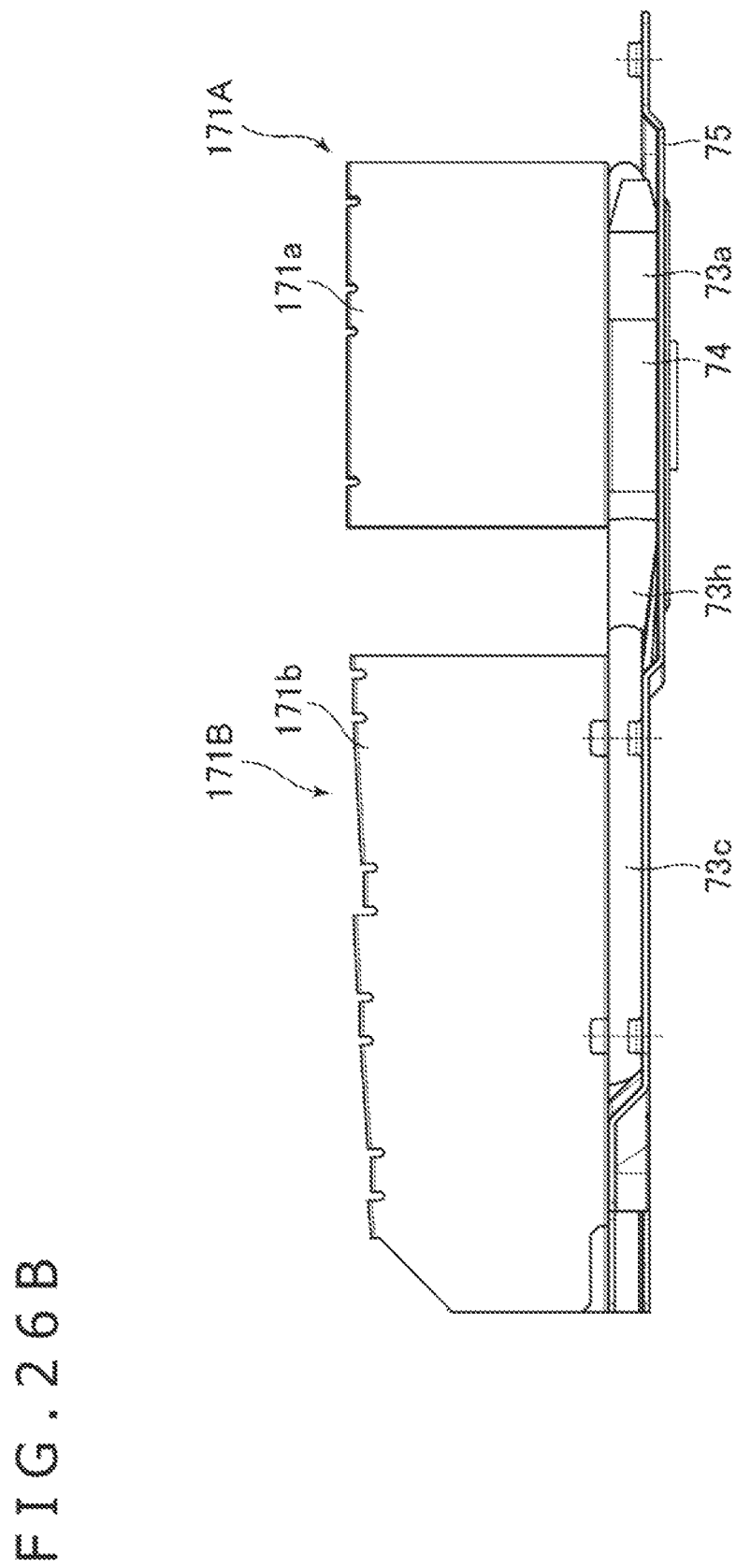
FIG. 26B is a side view of the heat radiating device illustrated in FIG. 26A and is a view of the heat radiating device as viewed in a direction of an arrow indicated by XXVIb in the figure.
Figure 27:
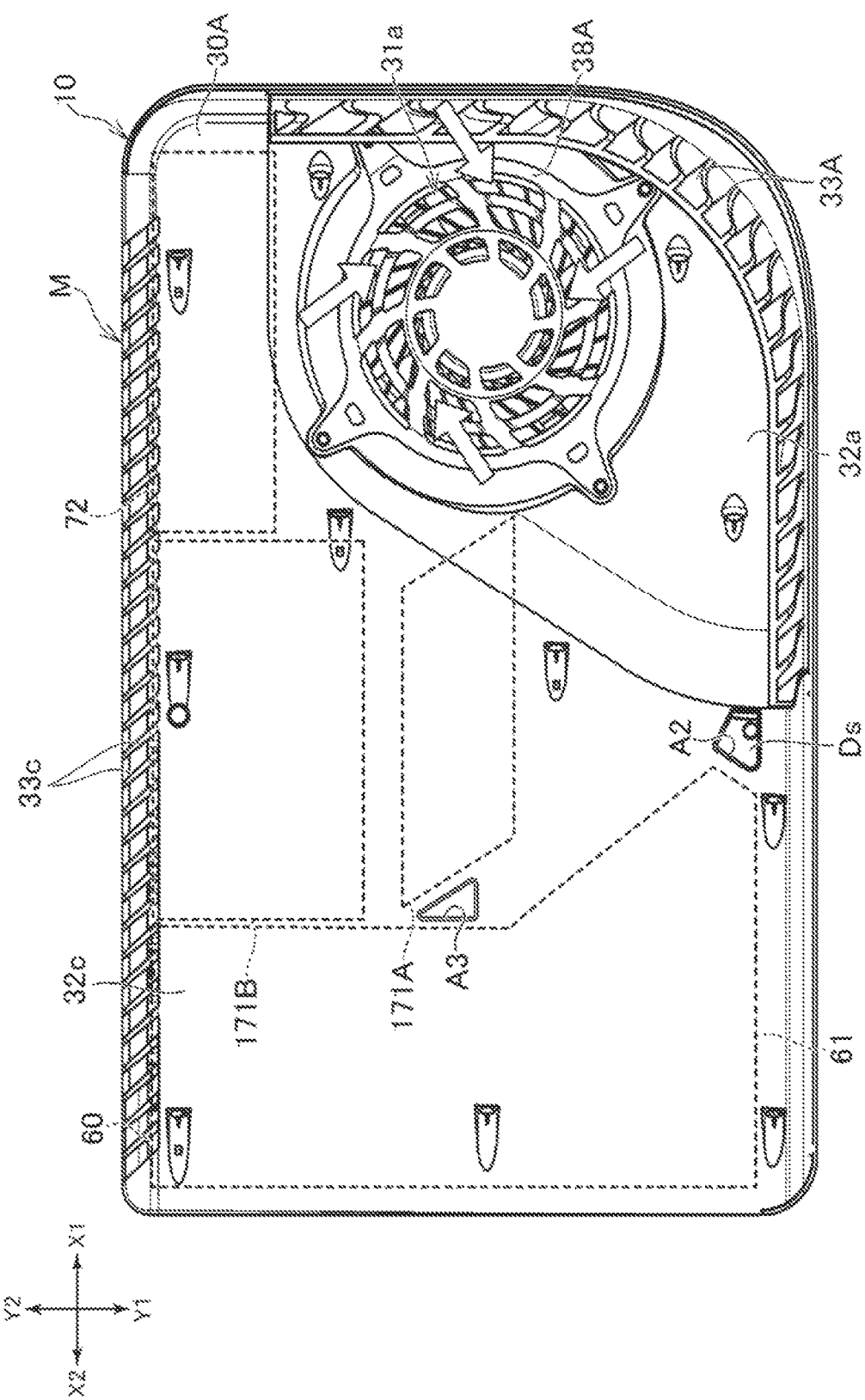
FIG. 27 is a plan view of an apparatus main body including the heat radiating device illustrated in FIG. 26A.

As illustrated in FIG. 27, a third opening A3 may be formed in the upper housing member 30A in addition to the second opening A2 of the dust collecting chamber Ds. In an example illustrated in FIG. 27, the upper housing member 30A covers a heat radiating device 170 (see FIGS. 26A to 26C) to be described later as a modification of the heat radiating device 70. Fins 171*a* of a heat sink 171A on a front side are inclined with respect to the front-rear direction and the left-right direction. Therefore, a substantially triangular space is generated between a fin 171*c* located at an end portion in the heat sink 171A and the right wall portion 61*f* of the power supply unit case 61. The third opening A3 is located directly above this space. According to this structure, dust collected in the space between the heat sink 171A on the front side and the right wall portion 61f of the power supply unit case 61 can be extracted through the third opening A3. For example, the dust collected in this space can be sucked by a vacuum cleaner.

[Heat Radiating Device on Upper Side]

Figure 13B:
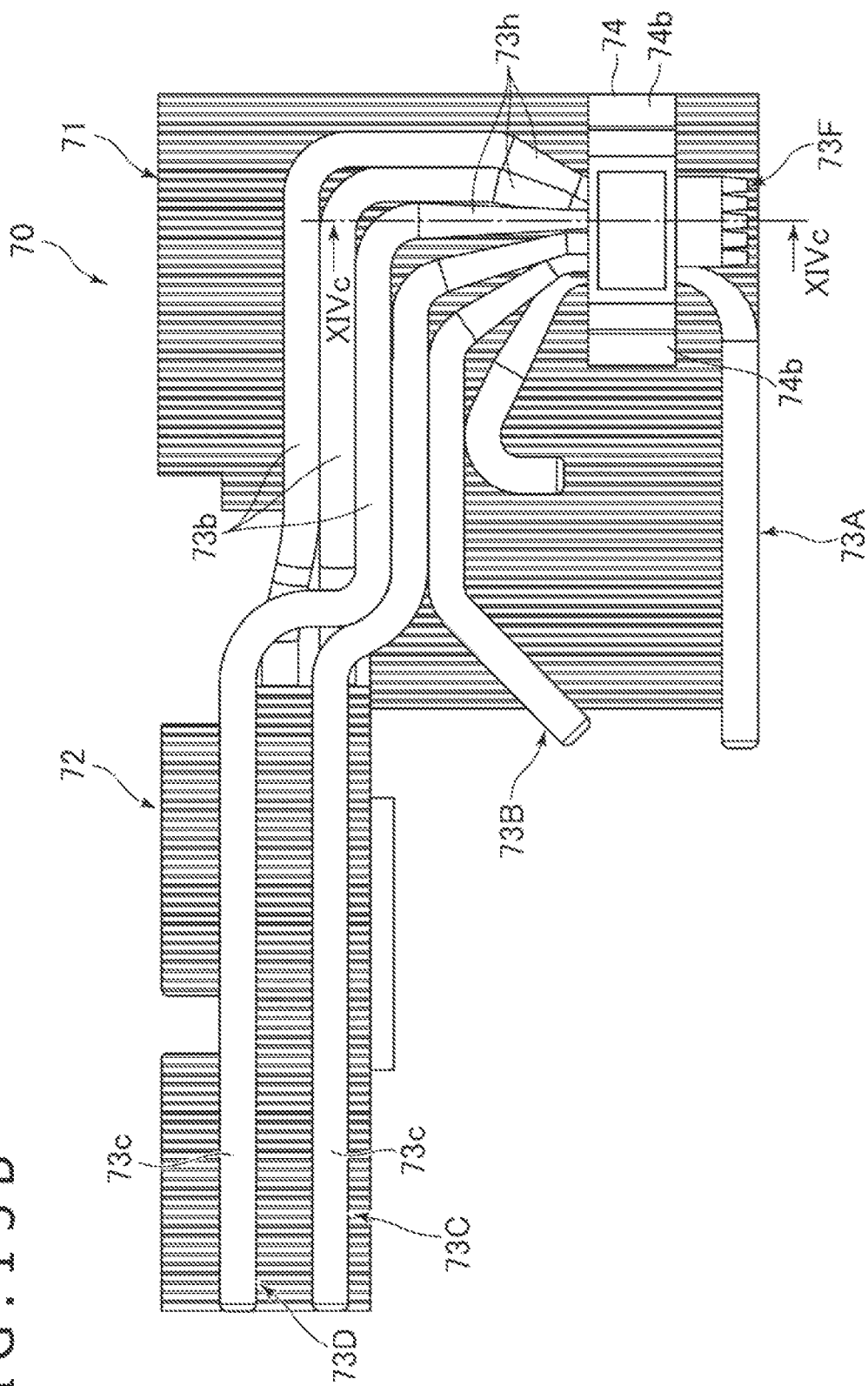
FIG. 13B is a bottom view of the heat radiating device illustrated in FIG. 13A, in which a base plate that supports fins is omitted.

As illustrated in FIG. 13B, the heat radiating device 70 has the plurality of heat pipes 73A to 73F in addition to the heat sinks 71 and 72. In the example of the electronic apparatus 1, the heat radiating device 70 has six heat pipes 73A to 73F. However, the number of heat pipes may be two or three, or may be larger than six. In the following description, in cases where the plurality of heat pipes 73A to 73F are not distinguished from each other, a reference numeral 73 is used for the plurality of heat pipes 73A to 73F. In addition, as illustrated in FIG. 13A, the heat radiating device 70 may have the base plate 75. The heat sinks 71 and 72 are fixed to the upper side of the base plate 75. The fins 71a and 72a of the heat sinks 71 and 72 are, for example, fixed to the base plate 75 by solder.

Figure 14A:
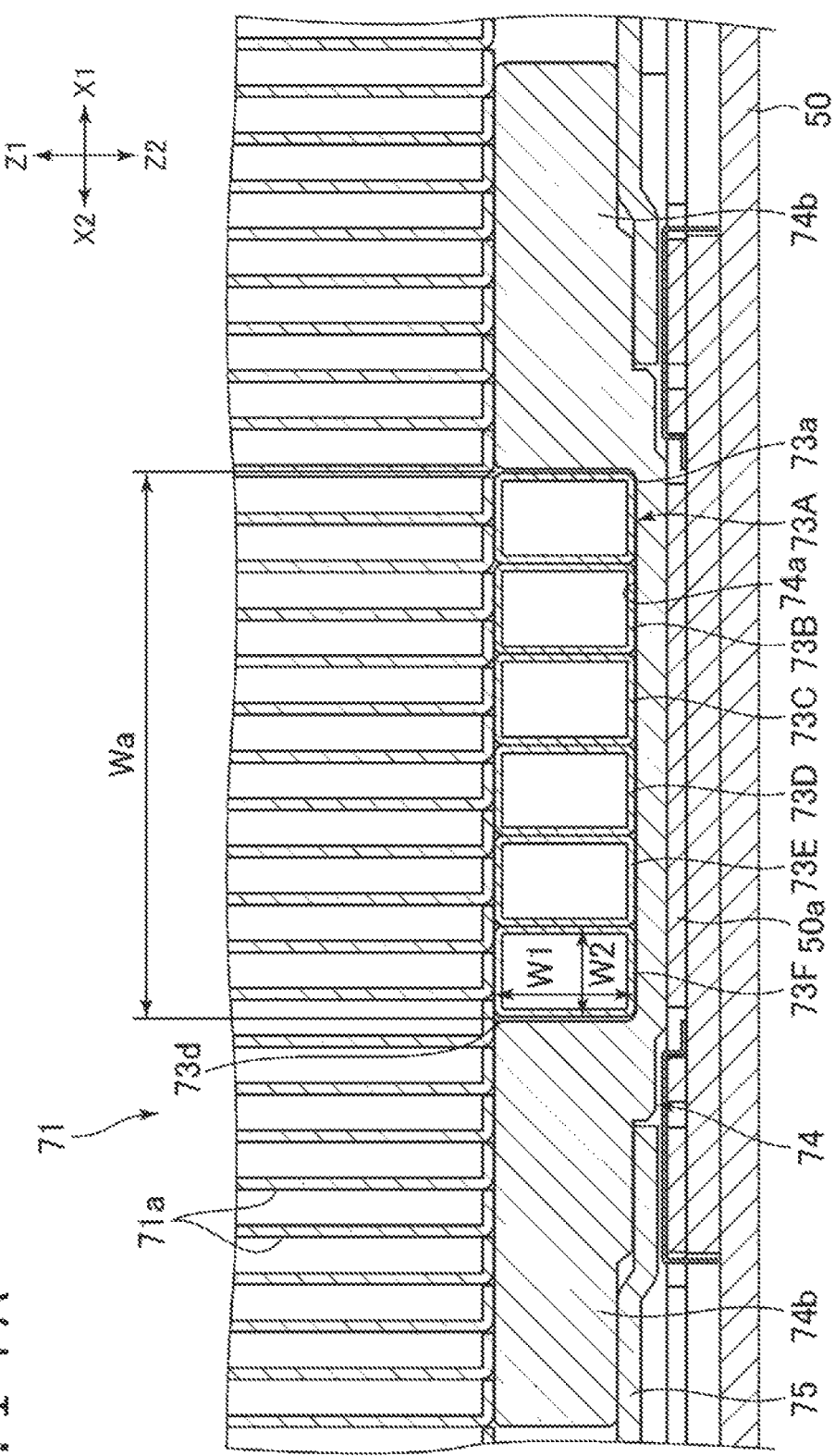
FIG. 14A is a sectional view of the heat radiating device and the circuit board, the sectional view being obtained in a cutting plane indicated by a line XIVa-XIVa in FIG. 13A.

As illustrated in FIG. 14A, each heat pipe 73 has a heat receiving portion 73a thermally connected to the integrated circuit 50a mounted on the circuit board 50. Here, the "heat receiving portion 73a thermally connected to the integrated circuit 50a" means that the heat receiving portion 73a and the integrated circuit 50a are in direct contact with each other or connected to each other via a metallic part having a high thermal conductivity such as copper or aluminum such that the heat of the integrated circuit 50a is transmitted to the heat receiving portion 73a. In the example of the electronic apparatus 1, the heat receiving portion 73a is a part located directly above the integrated circuit 50a. The heat radiating device 70 may have a heat transfer member 74 disposed between the heat pipe 73 and the integrated circuit 50a. The heat receiving portion 73a may be connected to the integrated circuit 50a via the heat transfer member 74.

As illustrated in FIG. 14A, the heat receiving portions 73a of the plurality of heat pipes 73 are abreast of each other in the left-right direction and may be in contact with the heat receiving portions 73a of adjacent heat pipes 73. The cross section of the heat receiving portions 73a is substantially rectangular, and the heat receiving portions 73a have an upper surface, a lower surface, a left side surface, and a right side surface. Those side surfaces of the heat receiving portions 73a are in contact with those of adjacent heat receiving portions 73a. Two adjacent heat receiving portions 73a may be in direct contact with each other or may be in contact with each other via a layer of a thermally conductive grease or the like.

As illustrated in FIG. 14A, each heat receiving portion 73a has a width W1 in the upward-downward direction and has a width W2 in the left-right direction. The width W1 in the upward-downward direction is larger than the width W2 in the left-right direction. According to this structure, it becomes easy to increase the number of heat pipes 73. As a result, it becomes easy to increase the size of the heat sinks 71 and 72 to which the heat of the integrated circuit 50a is transmitted through the heat pipes 73. In the example of the electronic apparatus 1, the width W2 in the left-right direction is smaller than ¾ of the width W1 in the upward-downward direction. The width W2 in the left-right direction may be smaller than ⅔ of the width W1 in the upward-downward direction. The width W2 in the left-right direction may be larger than ½ of the width W1 in the upward-downward direction.

As illustrated in FIG. 14A, a total width Wa (width in the left-right direction) of the heat receiving portions 73a of the plurality of heat pipes 73 may correspond to a width in the left-right direction of the integrated circuit 50a. More specifically, a difference in width between the total width Wa and the integrated circuit 50a may be smaller than the thickness of one heat pipe 73 (the width W2 in the left-right direction of a heat receiving portion 73a). In the example of the electronic apparatus 1, this difference is smaller than half of the thickness of one heat pipe 73. Because the total width Wa thus corresponds to the width of the integrated circuit 50a, all of the heat pipes 73 can be made to function effectively.

As illustrated in FIG. 14A, the heat transfer member 74 has two side portions 74b separated from each other in the left-right direction and a groove 74a formed between the two side portions 74b. The width of the groove 74a in the left-right direction corresponds to the total width Wa of the heat receiving portions 73a of the plurality of heat pipes 73. The heat receiving portions 73a of all of the heat pipes 73 are arranged within the groove 74a. The side surfaces of heat receiving portions 73a located at a respective right and left ends may be in contact with the inner surface (side portion 74b) of the groove 74a of the heat transfer member 74. The depth of the groove 74a corresponds to the width W1 in the upward-downward direction of the heat receiving portions 73a. Therefore, the height of the upper surfaces of the heat receiving portions 73a and the height of the upper surfaces of the side portions 74b substantially coincide with each other. Lower edges of the fins 71a included in the heat sink 71 are fixed to the upper surfaces of the side portions 74b. The fins 71a are fixed to the upper surfaces of the side portions 74b by solder, for example. According to the side portions 74b, heat can also be transmitted to the fins 71a located on the right side and left side of the heat receiving portions 73a.

The width in the upward-downward direction and the width in the left-right direction of the heat pipes 73 may be changed in the extending direction of the heat pipes 73. Then, the heat pipes 73 may include a part whose width in the upward-downward direction is smaller than the width in the left-right direction in contrast to the heat receiving portions 73a. This can facilitate bending of the heat pipes 73 and improve conductivity of heat from the heat pipes 73 to the heat sinks 71 and 72. In the example of the electronic apparatus 1, the width in the upward-downward direction of all of the heat pipes 73 changes in the extending direction of the heat pipes 73. Unlike the example of the electronic apparatus 1, the width in the upward-downward direction of only a part of the heat pipes 73 may be changed in the extending direction of the heat pipes 73.

As illustrated in FIG. 13B, each of the heat pipes 73 has parts 73b and 73c in contact with the heat sinks 71 and 72 at positions separated from the heat receiving portion 73a (see FIG. 14A) in the extending direction of the heat pipe 73. In the following, the part 73b in contact with the first heat sink 71 will be referred to as a first heat radiating portion, and the part 73c in contact with the second heat sink 72 will be referred to as a second heat radiating portion. For example, as illustrated in FIG. 14B, the heat pipes 73C and 73D have a second heat radiating portion 73c that extends rightward on the lower side of the second heat sink 72 and is connected to the lower edge of each fin 72a. The heat pipes 73E and 73F have a second heat radiating portion 73c that extends rightward on the upper side of the second heat sink 72 and is connected to the upper edge of each fin 72a. In addition, as illustrated in FIG. 13B, the heat pipes 73A to 73F have a first heat radiating portion 73b in contact with the lower edge of the first heat sink 71.

A width possessed by the second heat radiating portions 73c in a direction orthogonal to the extending direction of the second heat radiating portions 73c and the upward-downward direction may be larger than a width possessed by the second heat radiating portions 73c in the upward-downward direction. In the example of the electronic apparatus 1, as illustrated in FIG. 14B, the second heat radiating portions 73c have a width W3 in the upward-downward direction and have a width W4 in the front-rear direction. Then, the width W4 in the front-rear direction is larger than the width W3 in the upward-downward direction. This makes it possible to transmit heat from the second heat radiating portions 73c to the second heat sink 72 efficiently.

Similarly, a width possessed by the first heat radiating portions 73b in a direction orthogonal to the extending direction of the first heat radiating portions 73b and the upward-downward direction may be larger than a width possessed by the first heat radiating portions 73b in the upward-downward direction. This can improve thermal conductivity from the first heat radiating portions 73b to the first heat sink 71.

In each of the heat pipes 73, the width W1 in the upward-downward direction of the heat receiving portion 73a is larger than the width in the upward-downward direction of the heat radiating portions 73b and 73c (W1>W3). On the other hand, the width of the heat radiating portions 73b and 73c in a direction orthogonal to the extending direction of the heat radiating portions 73b and 73c and the upward-downward direction (for example, the width W4 of the second heat radiating portions 73c) is larger than the width of the heat receiving portions 73a in a direction orthogonal to the extending direction of the heat receiving portions 73a and the upward-downward direction (that is, the width W2) (W4>W2). According to this structure, it is possible to avoid a change in outer circumferential length of the cross section of each heat pipe 73.

Incidentally, the heat radiating portions 73b and 73c may not be arranged on the upper side or lower side of the heat sinks 71 and 72. For example, the second heat radiating portions 73c may extend in the left-right direction on the front side or the rear side of the second heat sink 72. In such a case, the width in the upward-downward direction of the second heat radiating portions 73c may be larger than the width in the front-rear direction. Further, in another example, holes that penetrate the respective fins 72a of the second heat sink 72 in the left-right direction may be formed in the fins 72a. Then, the second heat radiating portions 73c may be inserted into the through holes. In such a case, the upper surfaces and/or lower surfaces of the second heat radiating portions 73c may be in contact with edges of the through holes of the heat sink 72. Then, the width in the front-rear direction of the second heat radiating portions 73c may be larger than the width in the upward-downward direction.

The radius of curvature of an angular portion 73d of a heat receiving portion 73a (see FIG. 14A) may be smaller than the radius of curvature of an angular portion or a side portion of the heat radiating portions 73b and 73c (for example, a side portion 73e illustrated in FIG. 14B). Thus, the cross section of the heat receiving portion 73a approaches a rectangle, so that the plurality of heat pipes 73 can be arranged on the upper side of the integrated circuit 50a efficiently.

Figure 14C:
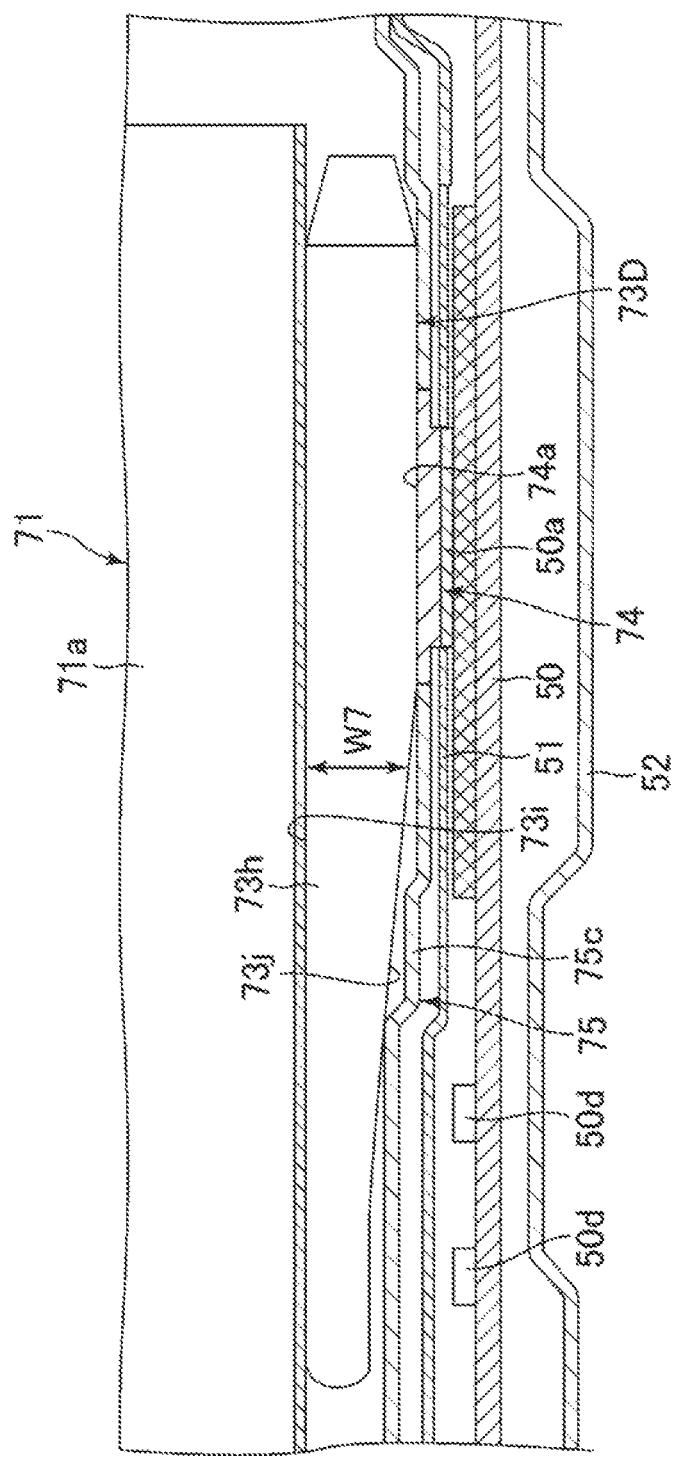
FIG. 14C is a sectional view of the heat radiating device and the circuit board, the sectional view being obtained in a cutting plane indicated by a line XIVc-XIVc in FIG. 13B.

As illustrated in FIG. 14C, each of the heat pipes 73 has an intermediate portion 73h located between the integrated circuit 50a mounted on the circuit board 50 and the first heat sink 71. The intermediate portion 73h is a part located between the heat receiving portion 73a and the first heat radiating portion 73b. As viewed in plan of the heat radiating device 70, the intermediate portions 73h of the plurality of heat pipes 73 spread in a direction orthogonal to the extending direction of each heat receiving portion 73a (left-right direction in the example of the electronic apparatus 1) (see FIG. 13B).

As illustrated in FIG. 14C, an upper surface 73i of the intermediate portion 73h is connected to the lower edge of a fin 71a of the first heat sink 71. The upper surface 73i is parallel with the circuit board 50 and the lower edge of the fin 71a. On the other hand, a lower surface 73j of the intermediate portion 73h may be inclined such that a width W7 in the upward-downward direction of the intermediate portion 73h is gradually decreased with an increase in distance from the heat receiving portion 73a. This can improve a degree of freedom of the layout of the electronic parts 50c below the intermediate portion 73h. Incidentally, the lower surface 73j of the intermediate portion 73h may not necessarily be inclined. A plurality of steps may be formed in the lower surface 73j such that the width W7 in the upward-downward direction of the intermediate portion 73h is gradually decreased.

The base plate 75 has a bottom portion 75c located under the intermediate portion 73h. A plurality of steps may be formed in the bottom portion 75c to bias the lower surface 73j of the intermediate portion 73h to the heat sink 71 side.

As described above, the second heat radiating portions 73c of the heat pipes 73E and 73F are arranged along the upper side of the second heat sink 72. Therefore, as illustrated in FIG. 13A, the two heat pipes 73E and 73F may have a curved portion 73g bending upward from the lower side of the first heat sink 71 to the upper side of the second heat sink 72.

Figure 9:
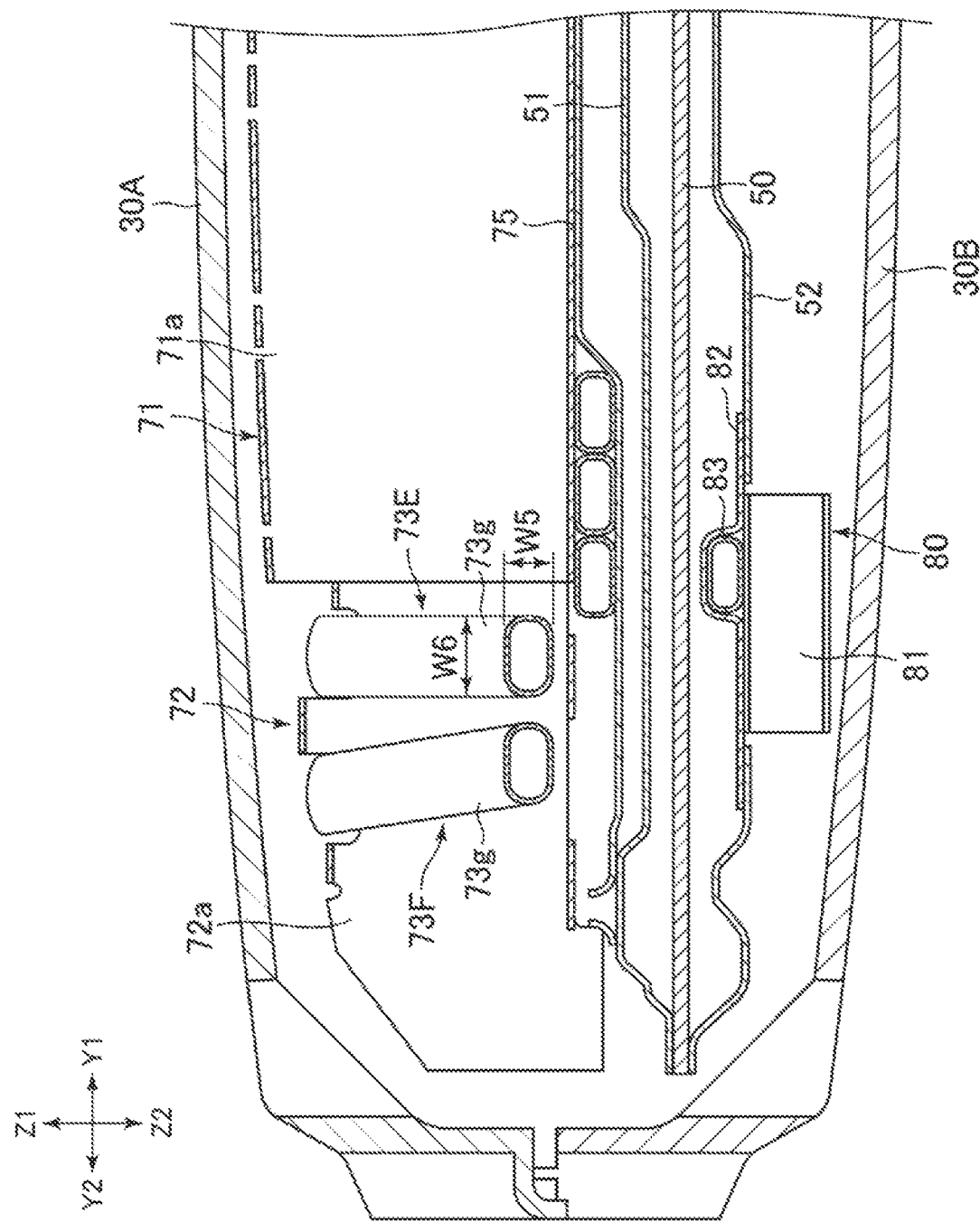
FIG. 9 is a sectional view of the apparatus main body, the sectional view being obtained in a cutting plane indicated by a line IX-IX in FIG. 7A.

As illustrated in FIG. 9, the curved portion 73g has a width W5 in the upward-downward direction. In addition, the curved portion 73g has a width W6 in a direction orthogonal to the extending direction of the curved portion 73g and the upward-downward direction (front-rear direction in the example illustrated in FIG. 9). Then, the width W6 may be larger than the width W5 in the upward-downward direction. According to this structure of the heat pipes 73E and 73F, the heat pipes 73E and 73F are bent upward easily.

Incidentally, the direction in which the curved portion 73g is bent is not limited to the upward-downward direction. For example, in a case where the second heat radiating portion 73c is disposed on the front side or the rear side of the second heat sink 72, the curved portion 73g may be bent to the front side or the rear side. In such a case, the width of the curved portion 73g in the upward-downward direction may be larger than the width of the curved portion 73g in the front-rear direction.

FIGS. 26A to 26C is a diagram illustrating the heat radiating device 170 as a modification of the heat radiating device 70. FIG. 27 is a plan view of the apparatus main body 10 having the heat radiating device 170. In FIG. 27, the heat radiating device 170 is covered by the upper housing member 30A.

In the heat radiating device 170, the first heat sink 71 illustrated in FIG. 13A and the like is separated into two heat sinks 171A and 171B (two fin blocks) in a direction along the airflow (front-rear direction in the example of the electronic apparatus 1), as illustrated in FIG. 26A. The heat sinks 171A and 171B are fixed to the common base plate 75. In addition, the heat sinks 171A and 171B are coupled to each other by common heat pipes 73 having heat receiving portions 73a thermally connected to the integrated circuit 50a mounted on the circuit board 50. The heat sink 171A on the front side is located leftward of the center line Cf of the cooling fan 5, and a line along the left-right direction passes through the center line Cf and the heat sink 171A (see FIG. 27). The heat transfer member 74 and the heat receiving portions 73a of the heat pipes 73 are fixed to the heat sink 171A on the front side (fin block on the front side). The heat sink 171A on the front side is connected to the integrated circuit 50a through the heat transfer member 74 and the heat receiving portions 73a. The heat sink 171B on the rear side (fin block on the rear side) is located in the rear of the heat sink 171A. The heat radiating portions 73c of the plurality of heat pipes 73 are fixed to the heat sink 171B on the rear side. The second heat sink 72 and the heat sink 171B on the rear side are abreast of each other in the left-right direction.

In the following description, the heat sink 171A on the front side will be referred to as a first front heat sink, the heat sink 171B will be referred to as a first rear heat sink, and the heat sink 72 will be referred to as a second heat sink as in the example of FIG. 13A.

As illustrated in FIG. 26A, the front edge of the first rear heat sink 171B is separated rearward from the rear edge of the first front heat sink 171A, and a gap Gn is secured between the front edge of the first rear heat sink 171B and the rear edge of the first front heat sink 171A. According to this structure, air that has passed through the rear edge of the first front heat sink 171A is mixed in the gap Gn (that is, the flow of the air is disturbed in the gap Gn), and thereafter, the air enters the first rear heat sink 171B. Therefore, the air into which heat is to be radiated is distributed to the whole of the first rear heat sink 171B easily. As a result, it is possible to make effective use of the first rear heat sink 171B and thus improve cooling performance.

As illustrated in FIG. 26A, in the heat radiating device 170, the heat sinks 171A and 171B have a plurality of fins 171a and 171b, respectively, abreast of one another in the left-right direction. The fins 171a included in the first front heat sink 171A are inclined with respect to both the front-rear direction and the left-right direction. The wall 61a that sends air to the first front heat sink 171A (the intake air wall of the power supply unit case 61, see FIG. 6B) is formed in front of the first front heat sink 171A. Each of the fins 171a may be inclined in the same direction as the wall 61a. This enables air to pass through the heat sink 171A smoothly. In the example of the electronic apparatus 1, the wall 61a extends obliquely rearward and leftward from the front edge of the wall 61a. Similarly to the wall 61a, each of the fins 171a extends obliquely rearward and leftward from the front edge of the fin 171a. The fins 171a and the wall 61a may not be parallel with each other.

On the other hand, each of the fins 171b of the first rear heat sink 171B is arranged along the front-rear direction. Therefore, the fins 171a of the first front heat sink 171A are inclined with respect to the fins 171b of the first rear heat sink 171B.

The gap Gn preferably secures a size necessary for air to be mixed. The gap Gn may, for example, be larger than ⅕ of the width in the front-rear direction of the first front heat sink 171A. The gap Gn may be larger than ¼ of the width in the front-rear direction of the first front heat sink 171A.

In the example illustrated in FIG. 26A, the intermediate portions 73h of the plurality of heat pipes 73 are exposed in the gap Gn. As illustrated in FIG. 26B, the upper surfaces of the heat receiving portions 73a of the heat pipes 73 and the upper surfaces of the heat transfer member 74 are in contact with the lower edges of the fins 171a of the first front heat sink. The heat radiating portions 73c of the plurality of heat pipes 73 are in contact with the lower edges of the fins 171b of the first rear heat sink 171B. Hence, in the example illustrated in FIGS. 26A to 26C, the heat sinks 171A and 171B are both in contact with parts of the heat pipes 73 in which the widths W1 and W3 (FIG. 14A and FIG. 14B) in the upward-downward direction of the heat pipes 73 are uniform.

[Heat Radiating Device on Lower Side]

Figure 15:
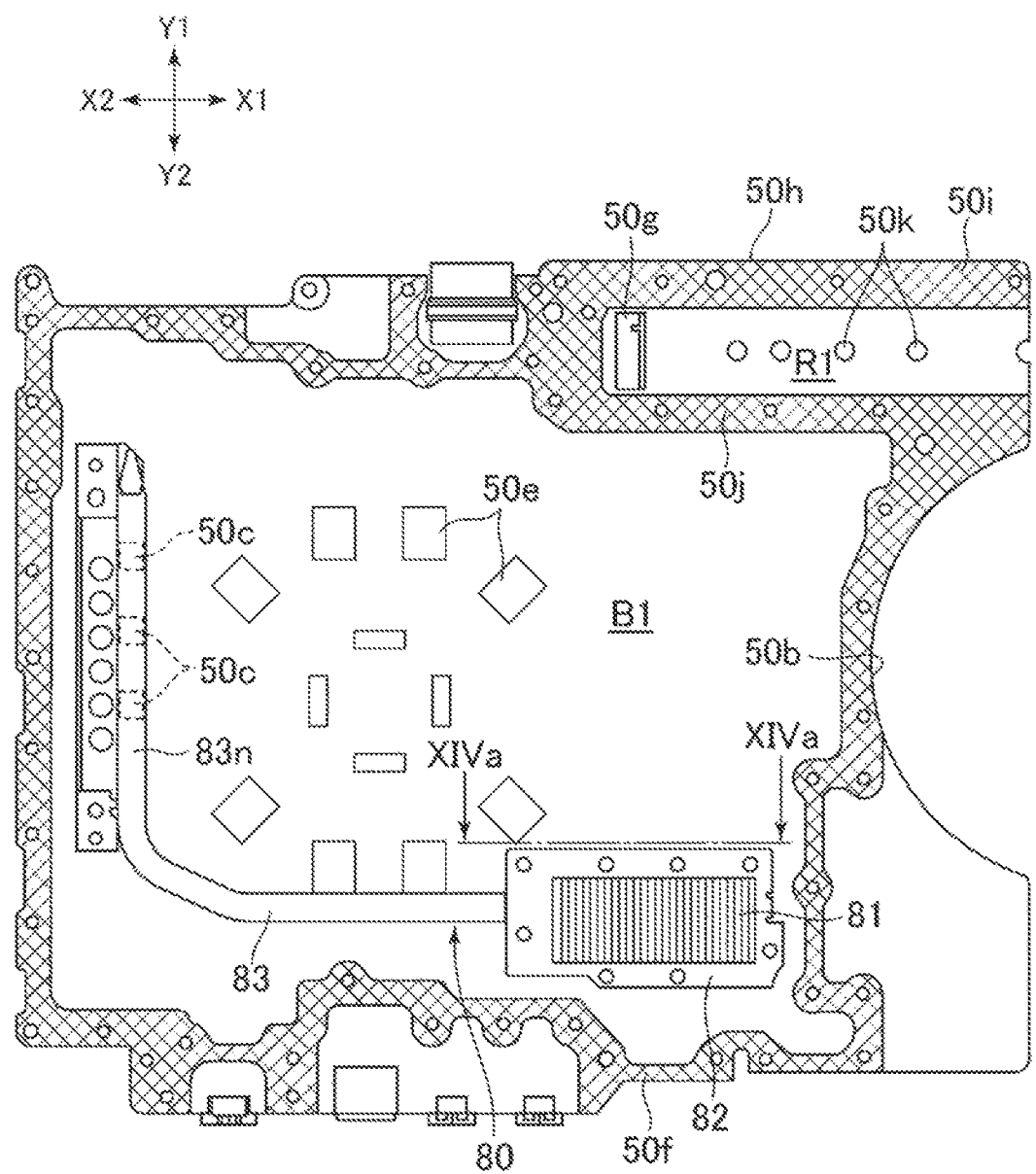
FIG. 15 is a view illustrating the lower surface of the circuit board.
Figure 16A:
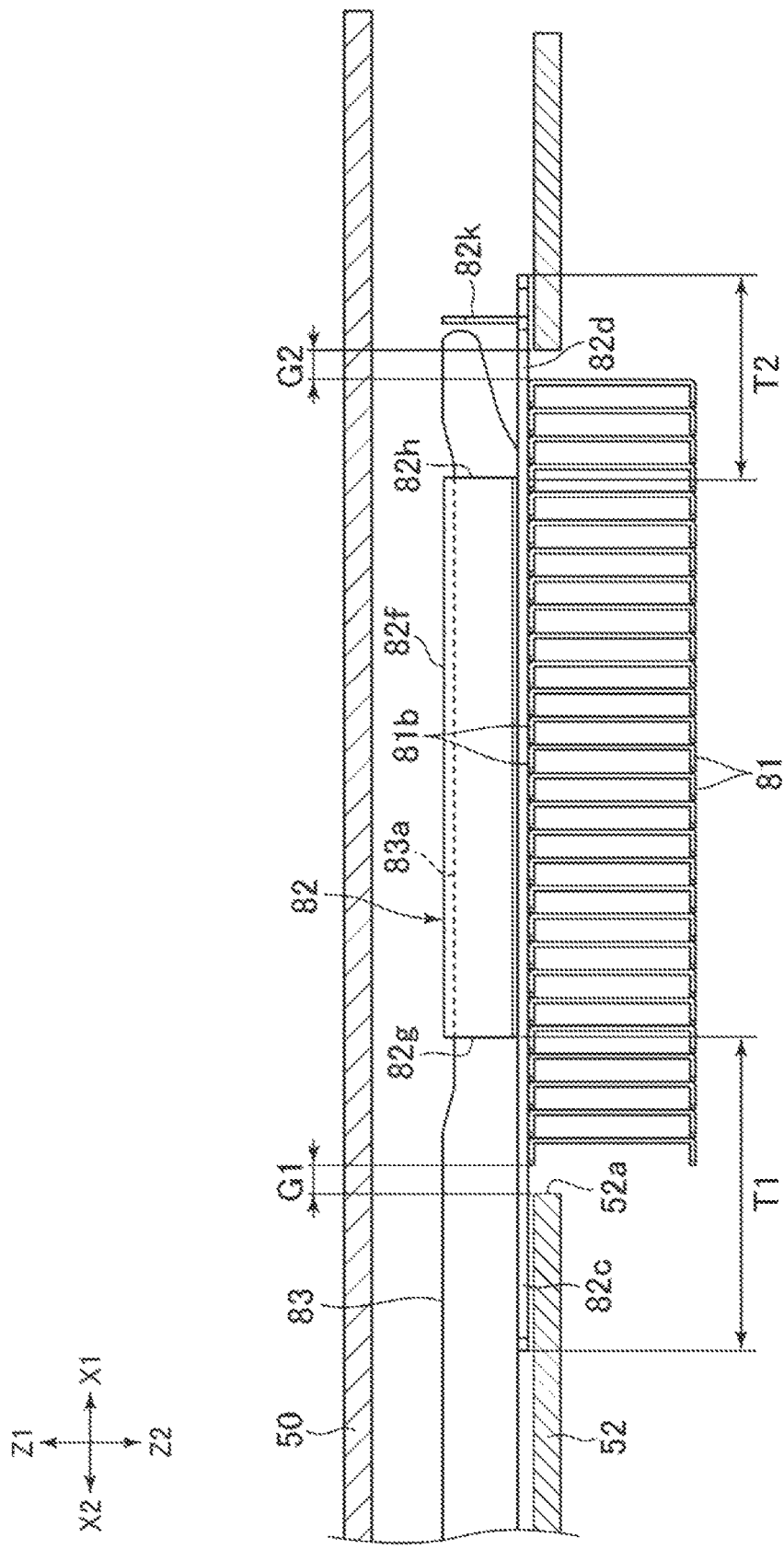
FIG. 16A is a sectional view of the circuit board and a board shield, the sectional view being indicated by a line XVIa-XVIa in FIG. 15, and illustrates a side surface of the heat radiating device.

As illustrated in FIG. 15, the heat radiating device 80 disposed on the lower surface of the circuit board 50 includes a base plate 82, a plurality of fins 81, and a heat pipe 83. As illustrated in FIG. 16A, the heat pipe 83 is disposed between the lower board shield 52 and the circuit board 50. An opening 52a is formed in the lower board shield 52. The fins 81 are arranged on the inside of the opening 52a and are exposed to the outside of the lower board shield 52 (lower side of the lower board shield 52 in the example of the electronic apparatus 1). The fins 81 are arranged in the above-described air flow passage Sb (see FIG. 8B) formed between the circuit board 50 and the lower housing member 30B.

The base plate 82 is, for example, a metallic plate of copper, aluminum, stainless steel, or the like. The base plate 82 is formed by pressing the metallic plate. That is, parts possessed by the base plate 82 are formed by one metallic plate. The plurality of fins 81 are supported by the base plate 82. The fins 81 are, for example, fixed to the lower surface of the base plate 82 by solder, for example.

As illustrated in FIG. 15, the heat pipe 83 has a heat receiving portion 83n at a position separated from the fins 81. The heat pipe 83 is in an L-shape, for example. The heat receiving portion 83n is disposed between the optical disk drive 6 and the circuit board 50 described above. The fins 81 are arranged in a region not overlapping the optical disk drive 6 (region on the right side of the optical disk drive 6 in the example of the electronic apparatus 1). In a process of manufacturing the circuit board 50 (process of mounting electronic parts on the circuit board 50), a jig may be pressed against the surface of the circuit board 50 to suppress a warp in the circuit board 50. The heat pipe 83 may have a shape in conformity with a region against which the jig is pressed.

The heat receiving portion 83n is in contact with the electronic parts 50c mounted on the lower surface of the circuit board 50. The electronic parts 50c are, for example, power transistors that generate driving power for the integrated circuit 50a (specifically, a CPU) mounted on the upper surface of the circuit board 50, from power supplied from the power supply unit 60. The parts and devices cooled by the heat radiating device 80 are not limited to transistors, and the heat radiating device 80 may be used to cool a memory.

As illustrated in FIG. 16A, the heat pipe 83 has a connecting portion 83a on an opposite side from the heat receiving portion 83n. The connecting portion 83a is located between the fins 81 and the circuit board 50 and extends in the left-right direction. A holding recessed portion 82f extending in the left-right direction is formed in the lower surface of the base plate 82. The lower surface of the base plate 82 is recessed upward in the holding recessed portion 82f. A first through hole 82g that penetrates the base plate 82 in the left-right direction is formed at a left end of the holding recessed portion 82f. A second through hole 82h that penetrates the base plate 82 in the left-right direction is formed at a right end of the holding recessed portion 82f. The connecting portion 83a is inserted into the holding recessed portion 82f from the first through hole 82g on the left side, for example, and is held within the holding recessed portion 82*f*. The connecting portion 83*a* is, for example, fixed to the holding recessed portion 82*f* by solder. The holding recessed portion 82*f* and the connecting portion 83*a* are both a part extending linearly.

As illustrated in FIG. 16A, gaps G1 and G2 are generated between edges of the opening 52*a* of the lower board shield 52 and the fins 81. Specifically, the gap G1 is generated between the edge (left edge) of the opening 52*a* and a fin 81 located at a left end, and the gap G2 is generated between the edge (right edge) of the opening 52*a* and a fin 81 located at a right end.

As illustrated in FIG. 16A, the base plate 82 may have a plate left portion 82*c* located on the left side of the holding recessed portion 82*f*. The plate left portion 82*c* may cover the lower surface of the heat pipe 83 (surface on the board shield 52 side) and close the gap G1. This can prevent electromagnetic waves from being transmitted outside the lower board shield 52 from the gap G1. The plate left portion 82*c* may have a size larger than the gap G1 in the front-rear direction and close the whole of the gap G1.

Similarly, as illustrated in FIG. 16A, the base plate 82 may have a plate right portion 82*d* located on the right side of the holding recessed portion 82*f*. The plate right portion 82*d* may cover the lower surface of the heat pipe 83 (surface on the board shield 52 side) and close the gap G2. This can prevent electromagnetic waves from being transmitted outside the lower board shield 52 from the gap G2. The plate right portion 82*d* may have a size larger than the gap G2 in the front-rear direction and close the whole of the gap G2.

As illustrated in FIG. 16A, the plate left portion 82*c* has a width T1 larger than a distance (gap G1) between the fin 81 located at the left end among the plurality of fins 81 and the edge (left edge) of the opening 52*a* of the board shield 52. Therefore, as viewed in plan of the circuit board 50, the plate left portion 82*c* is superposed on the fin 81 located at the left end and is also superposed on the edge of the opening 52*a* of the board shield 52. As a result, electromagnetic waves can be prevented from leaking from the gap G1 effectively. In the example of the electronic apparatus 1, a plurality of fins 81 are superposed on the plate left portion 82*c*.

As illustrated in FIG. 16A, the plate right portion 82*d* has a width T2 larger than a distance (gap G2) between the fin 81 located at the right end among the plurality of fins 81 and the edge (right edge) of the opening 52*a* of the board shield 52. Therefore, as viewed in plan of the circuit board 50, the plate right portion 82*d* is superposed on the fin 81 located at the right end and is also superposed on the edge of the opening 52*a* of the board shield 52. As a result, electromagnetic waves can be prevented from leaking from the gap G2 effectively. In the example of the electronic apparatus 1, a plurality of fins 81 are also superposed on the plate right portion 82*d*.

Figure 16B:
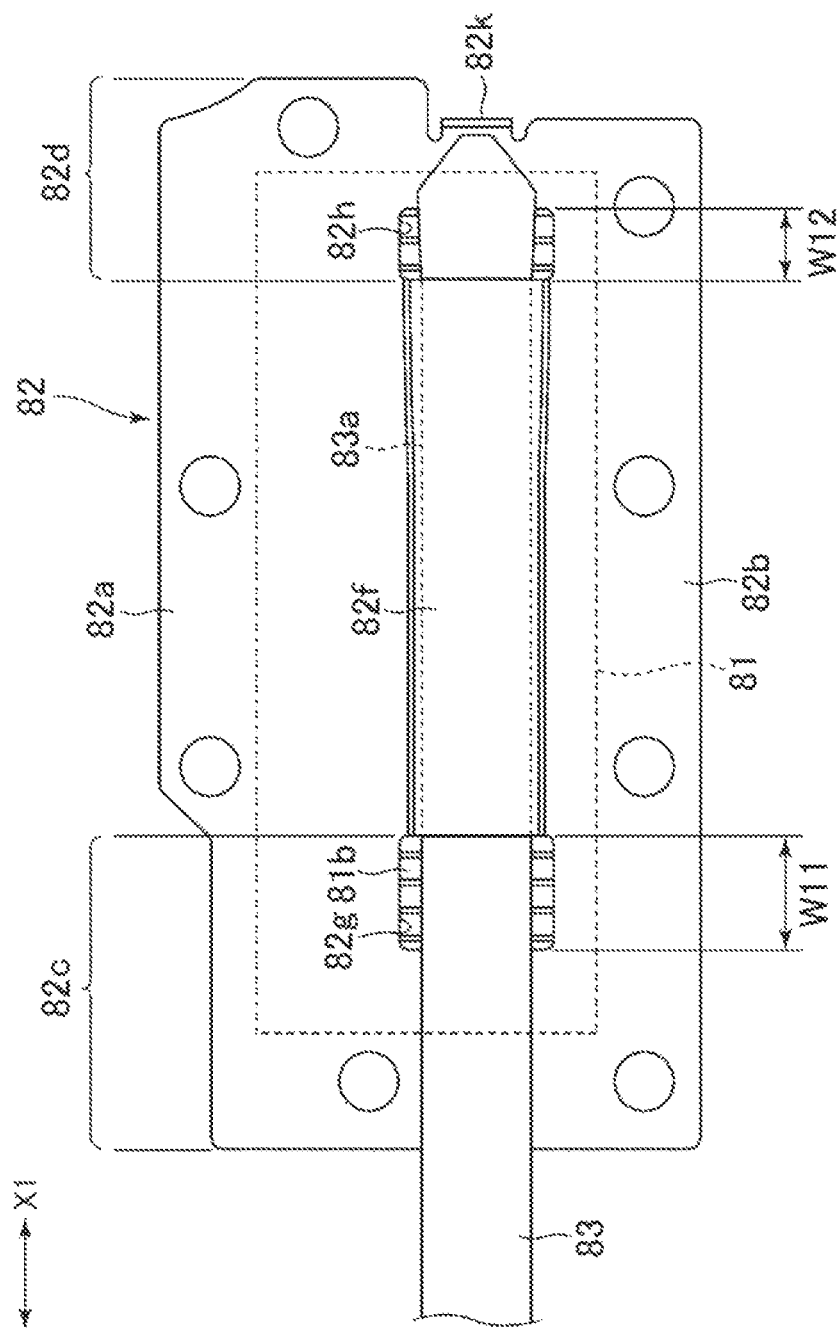
FIG. 16B is a diagram (plan view) of the heat radiating device as viewed from the circuit board side.

As illustrated in FIG. 16B, the base plate 82 has a plate front portion 82*a* and a plate rear portion 82*b* located on opposite sides from each other in the front-rear direction with the holding recessed portion 82*f* interposed therebetween. The plate front portion 82*a*, the plate rear portion 82*b*, the plate left portion 82*c*, and the plate right portion 82*d* are coupled to one another and surround the holding recessed portion 82*f*. The four parts 82*a* to 82*d* are located in the same plane along the circuit board 50. The edges of the fins 81 are fixed to the lower surface of the plate front portion 82*a* and the lower surface of the plate rear portion 82*b* by solder, for example. Heat transmitted from the heat pipe 83 to the holding recessed portion 82*f* is transmitted to the fins 81 via the plate front portion 82*a* and the plate rear portion 82*b*.

The plate front portion 82*a* extends frontward from the holding recessed portion 82*f* and is superposed on the edge of the opening 52*a* of the board shield 52. The plate rear portion 82*b* extends rearward from the holding recessed portion 82*f* and is superposed on the edge of the opening 52*a* of the board shield 52. Thus, the base plate 82 may be superposed on the entire perimeter of the edges of the opening 52*a* of the board shield 52. This can effectively prevent electromagnetic waves from leaking.

Each of the parts 82*a* to 82*d* may be fixed to the edge of the opening 52*a* of the board shield 52 by a fixture such as a screw or a rivet. The fixing structure of the base plate 82 and the lower board shield 52 is not limited to the example of the electronic apparatus 1. For example, only the plate front portion 82*a* and the plate rear portion 82*b* may be provided with a fixture for fixing the base plate 82 to the lower board shield 52.

As illustrated in FIG. 16B, a width W11 in the left-right direction of the first through hole 82*g* may be larger than a width (width in the left-right direction) of one fin 81. Similarly, a width W12 in the left-right direction of the second through hole 82*h* may be larger than the width (width in the left-right direction) of one fin 81. The first through hole 82*g* is closed by the plurality of fins 81. The second through hole 82*h* is also closed by the plurality of fins 81. Each fin 81 has, at an upper edge thereof, a fixing portion 81*b* bent to an adjacent fin 81. The fixing portion 81*b* is in contact with the adjacent fin 81, and there is no gap between the two fins 81 adjacent to each other. This can also prevent electromagnetic waves from leaking from a range between the two fins 81 adjacent to each other.

As illustrated in FIG. 16B, the base plate 82 may have a stopper 82*k* that faces an end in the left-right direction (right end in the example of the electronic apparatus 1) of the heat pipe 83, in the left-right direction. When the connecting portion 83*a* of the heat pipe 83 is inserted into the holding recessed portion 82*f* from the left side in a process of manufacturing the heat radiating device 80, the stopper 82*k* can reduce a relative positional displacement between the connecting portion 83*a* and the holding recessed portion 82*f*.

Incidentally, in the example of the electronic apparatus 1, the base plate 82 has the plate left portion 82*c* and the plate right portion 82*d* that are superposed on the edges of the opening 52*a* of the board shield 52, on the right side and left side of the holding recessed portion 82*f*, respectively. Unlike this example, only either the plate left portion 82*c* or the plate right portion 82*d* may be superposed on the edge of the opening 52*a* of the board shield 52.

Figure 17A:
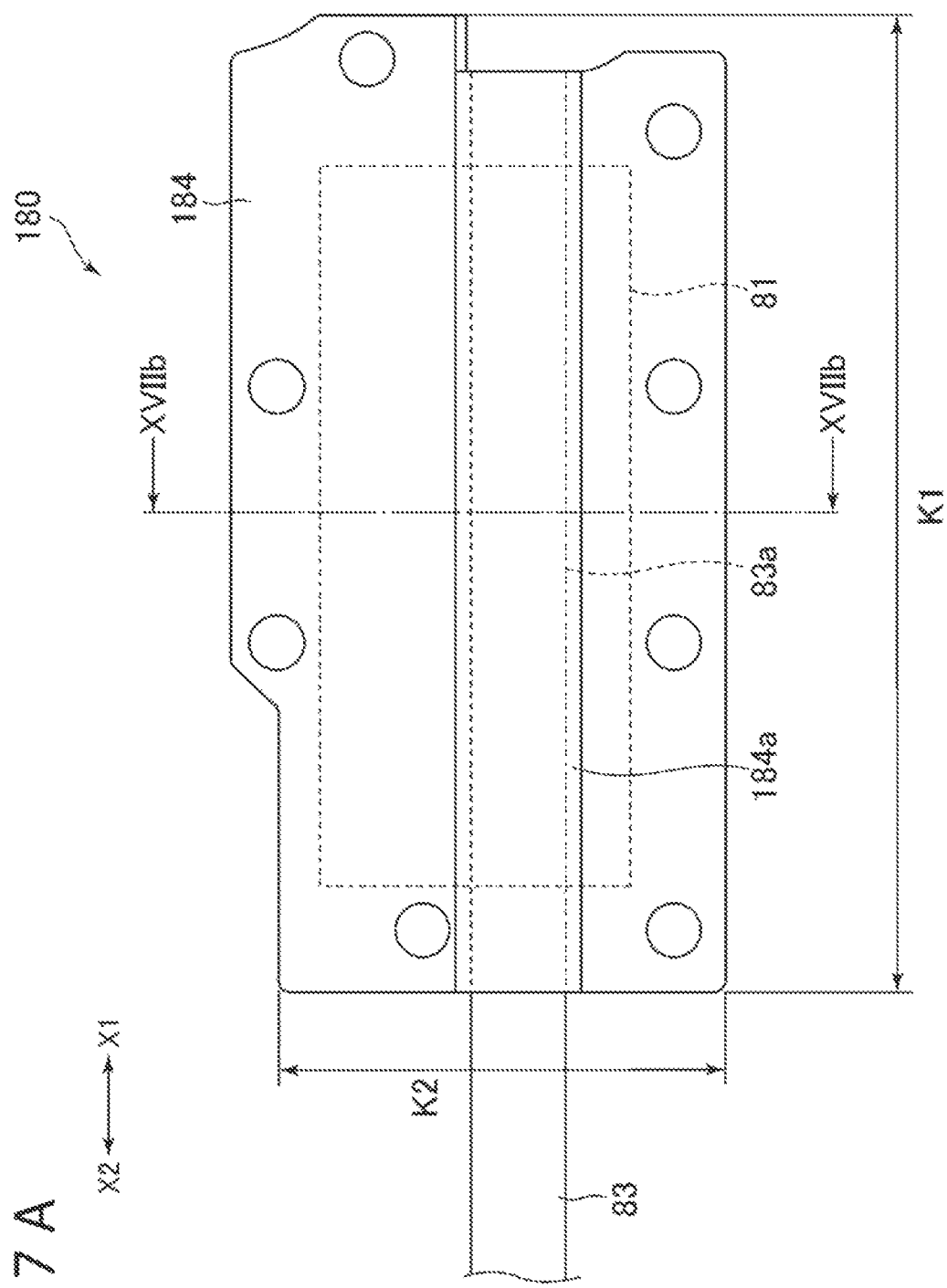
FIG. 17A is a diagram (plan view) of a heat radiating device according to a modification as viewed from the circuit board side.

Further, in another example, the base plate 82 may not have the holding recessed portion 82*f*. In such a case, the heat radiating device 80 may have a back plate that sandwiches the connecting portion 83*a* of the heat pipe 83 together with the base plate 82. FIGS. 17A to 17C are diagrams illustrating an example of such a heat radiating device.

In the example illustrated in these diagrams, a heat radiating device 180 has a base plate 182 and a back plate 184. As illustrated in FIG. 17B, the base plate 182 is disposed between the connecting portion 83*a* of the heat pipe 83 and the fins 81. The upper edges of the fins 81 are fixed to the base plate 182. Unlike the base plate 82 described above, no holding recessed portion is formed in the base plate 182. The back plate 184 covers the upper surface of the connecting portion 83*a* and is attached to the base plate 182. A holding recessed portion 184a that extends in the left-right direction is formed in the back plate 184. The connecting portion 83a of the heat pipe 83 is fitted in this holding recessed portion. The back plate 184 has a plate front portion 184b and a plate rear portion 184c located on opposite sides from each other with the holding recessed portion 184a interposed therebetween. The parts 184b and 184c are attached to the base plate 182. Incidentally, in the heat radiating device 180, unlike the heat radiating device 80, the connecting portion 83a of the heat pipe 83 may be curved, for example, instead of being linear. In such a case, the holding recessed portion 184a may be curved in conformity with the connecting portion 83a.

As illustrated in FIG. 17C, the base plate 182 has a plate left portion 182c located on the left side of the fins 81 and a plate right portion 182d located on the right side of the fins 81. The plate left portion 182c closes the gap G1. The plate right portion 182d closes the gap G2. This can prevent electromagnetic waves from leaking from the gaps G1 and G2.

As illustrated in FIG. 17C, the plate left portion 182c extends leftward beyond the edge (left edge) of the opening 52a of the board shield 52 and overlaps the board shield 52. The plate right portion 182d extends rightward beyond the edge (right edge) of the opening 52a of the board shield 52 and overlaps the board shield 52. This can prevent electromagnetic waves from leaking from the gaps G1 and G2 more effectively.

As illustrated in FIG. 17B, the base plate 182 has a plate front portion 182a and a plate rear portion 182b located on opposite sides from each other in the front-rear direction with the connecting portion 83a interposed therebetween. The plate front portion 182a and the plate rear portion 182b also respectively extend frontward and rearward beyond the edges of the opening 52a of the board shield 52 and overlap the board shield 52. Thus, the base plate 182 may be superposed on the entire perimeter of the edges of the opening 52a of the board shield 52. This can effectively prevent electromagnetic waves from leaking.

The back plate 184 may have substantially the same size as the base plate 182 in at least one of the left-right direction and the front-rear direction. In the example of the electronic apparatus 1, as illustrated in FIG. 17A, a size K2 in the front-rear direction of the back plate 184 is the same as that of the base plate 182. In addition, a size K1 in the left-right direction of the back plate 184 is the same as that of the base plate 182. According to this structure of the back plate 184 and the base plate 182, heat transmitted from the heat pipe 83 to the back plate 184 is transmitted to the whole of the base plate 182 easily and is therefore transmitted to the whole of the fins 81 easily. Incidentally, the back plate 184 may have substantially the same size as the base plate 182 in only either the left-right direction or the front-rear direction. Here, the back plate 184 and the base plate 182 having the same size in the front-rear direction means that frontmost portions thereof can be attached to the board shield 52 by a common fixture (a screw or a rivet) and that rearmost portions thereof can be attached to the board shield 52 by a common fixture. For example, attachment holes into which a common fixture is to be inserted are formed in each of the frontmost portions and the rearmost portions of the plates 184 and 182. Similarly, the back plate 184 and the base plate 182 having the same size in the left-right direction means that rightmost portions thereof can be attached to the board shield 52 by a common fixture and that leftmost portions thereof can be attached to the board shield 52 by a common fixture.

In addition, according to this structure, unlike the base plate 82 described above, the holes penetrating the base plate 182 (through holes 82g and 82h described above) are not formed. Therefore, a leakage of electromagnetic waves can be prevented more effectively.

[Memory Housing Chamber]

As illustrated in FIG. 15, a ground pattern 50f that includes a conductor and functions as an electric ground is formed on the lower surface of the circuit board 50. In FIG. 15, the ground pattern 50f is shaded. The ground pattern 50f surrounds the entire perimeter of a region B1 on which electronic parts 50c and 50e and the like are mounted (the region will hereinafter be referred to as a shielded region). The lower board shield 52 covers the shielded region B1. The lower board shield 52 has ground contact portions 52b (see FIG. 7C) fixed to the ground pattern 50f by a fixture such as a screw.

As illustrated in FIG. 15, a memory connector 50g from which a semiconductor memory 55 (see FIG. 18A) is detachable may be mounted on a region on the outside of the shielded region B1 in the lower surface of the circuit board 50. In the example of the electronic apparatus 1, the semiconductor memory 55 is disposed rightward from the memory connector 50g. The lower board shield 52 may have a connector cover 52c (see FIG. 18A) that covers the memory connector 50g. A memory housing chamber R1 (see FIG. 18A) that houses the semiconductor memory 55 is defined on the lower side of the circuit board 50.

Figure 18B:
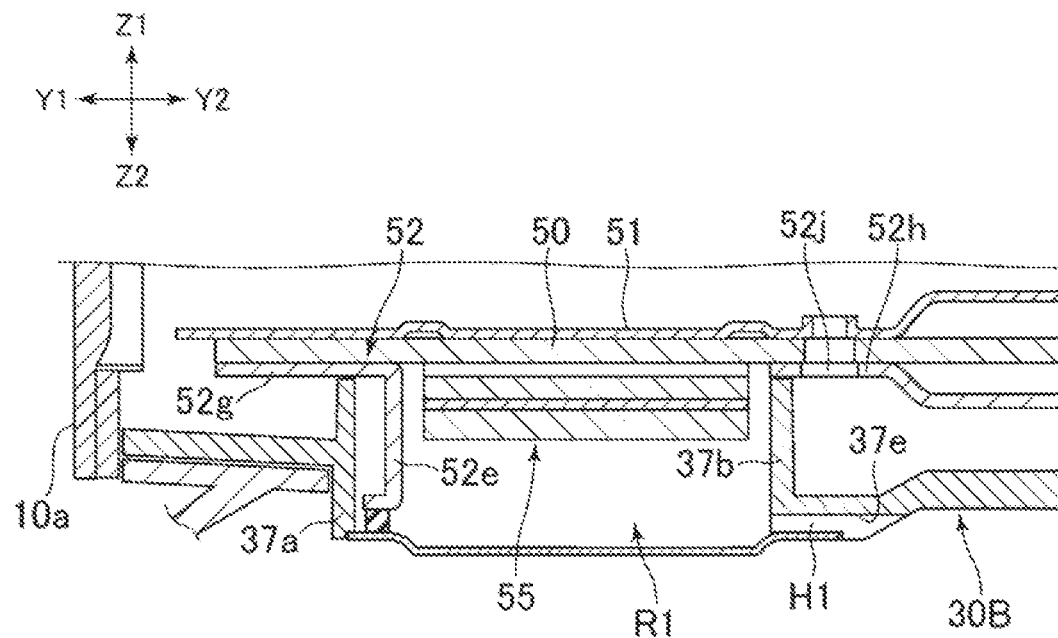
FIG. 18B is a sectional view obtained in a cutting plane indicated by a line XVIIIb-XVIIIb in FIG. 18A.
Figure 18C:
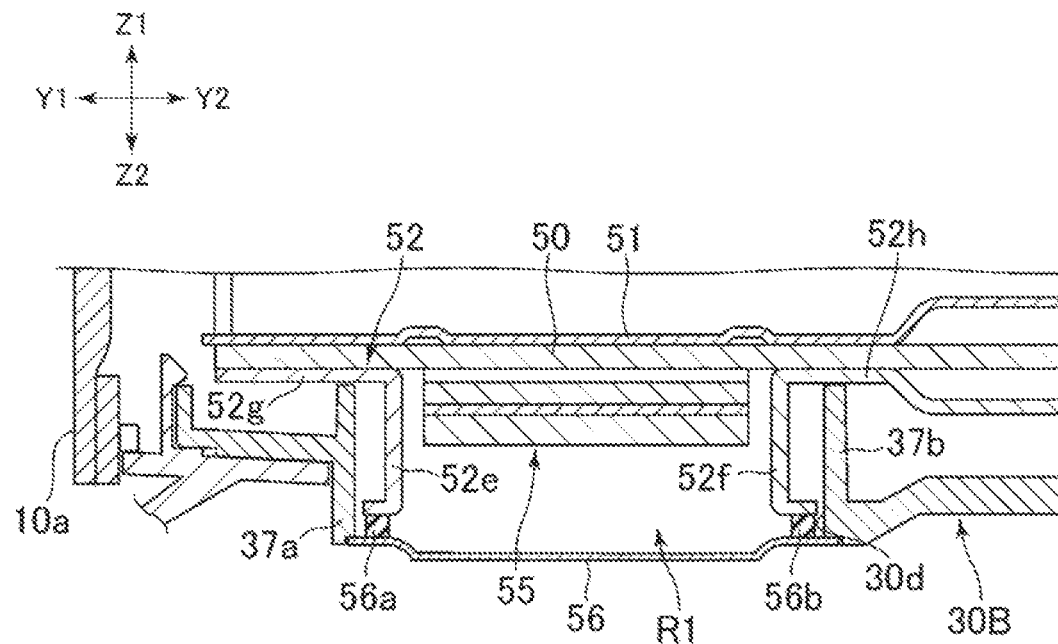
FIG. 18C is a sectional view obtained in a cutting plane indicated by a line XVIIIc-XVIIIc in FIG. 18A.

As illustrated in FIG. 18C, the lower board shield 52 has shield walls 52e and 52f formed along the memory housing chamber R1. According to this structure, it is possible to reduce an effect of static electricity on the semiconductor memory 55 while suppressing an increase in the number of parts. The shield walls 52e and 52f are walls higher than the semiconductor memory 55 and also have a length (width in the left-right direction) corresponding to the semiconductor memory 55.

In the example of the electronic apparatus 1, the memory housing chamber R1 is defined near a front surface 10a (see FIG. 8A) of the electronic apparatus 1. As illustrated in FIG. 15, the memory housing chamber R1 is located forward of the center of the circuit board 50 in the front-rear direction and is, for example, formed along a front edge 50h of the circuit board 50. The shield wall 52e is formed on the front side of the memory housing chamber R1. According to this structure, when the user touches the front surface 10a of the electronic apparatus 1, a flow of static electricity to the semiconductor memory 55 can be suppressed by the shield wall 52e.

As illustrated in FIG. 18C, the shield wall 52f may be formed on the rear side of the memory housing chamber R1. According to this, the effect of static electricity on the semiconductor memory 55 can be suppressed more effectively.

As illustrated in FIG. 15, the ground pattern 50f may have ground portions 50i and 50j formed along the memory housing chamber R1. The ground portions 50i and 50j, for example, have a length (length in the left-right direction) corresponding to the memory housing chamber R1. The ground portion 50i is formed on the front side of the memory housing chamber R1. The ground portion 50j is formed on the rear side of the memory housing chamber R1. In the following, the ground portion 50i will be referred to as a front ground portion, and the ground portion 50j will be referred to as a rear ground portion.

As illustrated in FIG. 18C, the lower board shield 52 has a contact portion 52g in contact with the front ground portion 50*i* and a contact portion 52*h* in contact with the rear ground portion 50*j*. The shield wall 52*e* on the front side extends downward from the contact portion 52*g*. The shield wall 52*f* on the rear side extends downward from the contact portion 52*h*. According to this structure, distances from the shield walls 52*e* and 52*f* to the ground pattern 50*f* of the circuit board 50 are decreased. As a result, the effect of static electricity can be reduced more effectively.

Incidentally, the structure of the ground pattern 50*f* and the structure of the lower board shield 52 are not limited to the example illustrated in the electronic apparatus 1. For example, the ground pattern 50*f* may have only one of the two ground portions 50*i* and 50*j* (for example, the front ground portion 50*i*). In such a case, the lower board shield 52 may have only one of the two contact portions 52*g* and 52*h* (for example, the contact portion 52*g* on the front side).

As illustrated in FIG. 18A, the memory housing chamber R1 may be covered by a memory cover 56. The memory cover 56 includes, for example, a conductive material (for example, a metal such as copper, aluminum, or iron). The memory cover 56 is electrically connected to the shield walls 52*e* and 52*f*. According to this, the effect of static electricity on the semiconductor memory 55 can be suppressed even more effectively.

In the example of the electronic apparatus 1, the memory cover 56 is electrically connected to the shield wall 52*e* through a conductive cushion 56*a* (FIG. 18C) disposed between an edge of the memory cover 56 and an edge of the shield wall 52*e* on the front side. In addition, the memory cover 56 is electrically connected to the shield wall 52*f* through a conductive cushion 56*b* disposed between an edge of the memory cover 56 and an edge of the shield wall 52*f* on the rear side.

As illustrated in FIG. 18C, an opening 30*d* that exposes the memory housing chamber R1 is formed in the lower housing member 30B. Supporting walls 37*a*, 37*b*, and 37*c* that surround the memory housing chamber R1 may be formed on the lower housing member 30B. The supporting walls 37*a*, 37*b*, and 37*c* are walls extending toward the circuit board 50 from edges of the opening 30*d*. The supporting walls 37*a*, 37*b*, and 37*c* can secure a strength of the lower housing member 30B on the periphery of the opening 30*d*.

As illustrated in FIG. 18C, the shield walls 52*e* and 52*f* may be located on the inside of the supporting walls 37*a*, 37*b*, and 37*c*. The shield wall 52*e* on the front side is, for example, disposed on the inside of the supporting wall 37*a* on the front side and along the supporting wall 37*a*. The shield wall 52*f* on the rear side is, for example, disposed on the inside of the supporting wall 37*b* on the rear side and along the supporting wall 37*b*. In the example of the electronic apparatus 1, the board shield 52 does not have a shield wall located on the inside of the supporting wall 37*c* formed on the right side of the memory housing chamber R1. Unlike the example of the electronic apparatus 1, the board shield 52 may have a shield wall located on the inside of the supporting wall 37*c*.

The outer peripheral edge of the memory cover 56 is, for example, disposed at lower edges of the supporting walls 37*a*, 37*b*, and 37*c*. As illustrated in FIG. 18A, a projecting portion 56*c* is formed at an end portion (left end in the example illustrated in the electronic apparatus 1) of the memory cover 56. An opening into which the projecting portion 56*c* is fitted in a horizontal direction is formed in the lower housing member 30B. An end portion on an opposite side (right end in the example illustrated in the electronic apparatus 1) of the memory cover 56 is disposed on the supporting wall 37*c* and is fixed to the supporting wall 37*c*. For example, a hole is formed in the supporting wall 37*c*, and the end portion of the memory cover 56 is fixed to this hole by a fixture such as a screw 58*a*.

The semiconductor memory 55 may be fixed to the circuit board 50 or the upper board shield 51 at a position separated from the memory connector 50*g*. For example, as illustrated in FIG. 18A, a right end 55*a* of the semiconductor memory 55 may be fixed to a screw hole 51*b* formed in the upper board shield 51 by a screw 58*b*. In such a case, a spacer 57 may be disposed between the upper board shield 51 and the right end 55*a* of the semiconductor memory 55. A hole 50*k* used for disposing the spacer 57 may be formed at a position corresponding to the screw hole 51*b* in the circuit board 50.

The electronic apparatus 1 may allow a plurality of semiconductor memories having different storage capacities to be used selectively. Such semiconductor memories have different lengths in the left-right direction according to the storage capacities. Accordingly, as illustrated in FIG. 18A, a plurality of screw holes 51*b* may be formed in the upper board shield 51 such that such a plurality of semiconductor memories having different lengths can be fixed to the upper board shield 51. In addition, in the circuit board 50, holes used for disposing the spacer 57 may be formed at positions corresponding to the screw holes 51*b*.

Vent holes H1 (see FIG. 18A and FIG. 18B) that allow a flow of air between the inside and the outside of the memory housing chamber R1 in a state in which the memory cover 56 is closed may be formed in the memory housing chamber R1. This can improve a heat radiation property for the semiconductor memory 55.

As described above, the memory housing chamber R1 is disposed near the front surface 10*a* of the electronic apparatus 1. The vent holes H1 may be formed in a wall portion on the rear side of the memory housing chamber R1. In the example of the electronic apparatus 1, the vent holes H1 may be provided in the shield wall 52*f* on the rear side or the supporting wall 37*b* on the rear side. In addition, the vent holes H1 may open toward the rear side of the electronic apparatus 1. According to this structure of the vent holes H1, the vent holes H1 are distant from the front surface 10*a* of the electronic apparatus 1, and therefore, the vent holes H1 can be effectively prevented from becoming a passage for static electricity.

Figure 19:
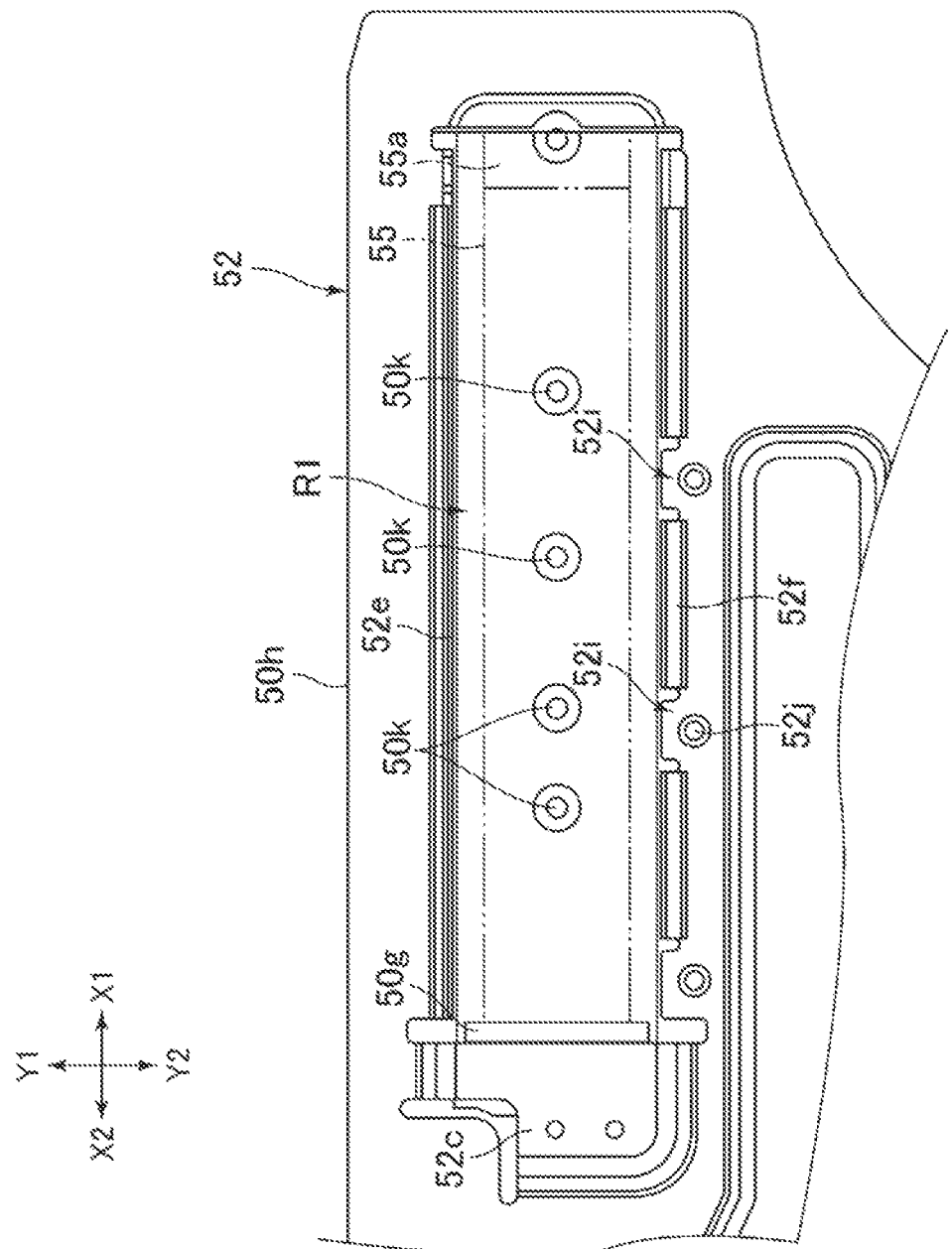
FIG. 19 is a plan view illustrating a memory housing chamber, in which the board shield is depicted.

In the example of the electronic apparatus 1, a plurality of gaps 52*i* (see FIG. 19) are formed in the shield wall 52*f* on the rear side. As illustrated in FIG. 18B, the lower edge of the supporting wall 37*b* of the lower housing member 30B has recessed portions 37*e* at positions corresponding to the gaps 52*i*. The vent holes H1 that open toward the rear side of the electronic apparatus 1 are formed between the recessed portions 37*e* and an edge of the memory cover 56. An attachment hole 52*j* (see FIG. 18B) used for fixing the ground contact portion 52*h* of the lower board shield 52 to the circuit board 50 may be formed in the gaps 52*i*.

The above-described lower flow passage Ub (see FIG. 20A) is formed between the lower surface of the lower housing member 30B and the lower exterior panel 20B. The vent holes H1 open in the lower flow passage Ub. In addition, the vent holes H1 open toward the inlet port 31*b* of the lower housing member 30B from the memory housing chamber R1 (see FIG. 8A). Therefore, when the cooling fan 5 is driven, an airflow from the inside of the memory housing chamber R1 to the inlet port 31*b* through the vent holes H1 is formed.

In addition to the vent holes H1, holes opening to the outside of the memory housing chamber R1 may be formed in the wall portions defining the memory housing chamber R1, the wall portions being the shield walls 52e and 52f, the supporting walls 37a, 37b, and 37c, the circuit board 50, and the like. When the cooling fan 5 is driven, air flows into the inside of the memory housing chamber R1 through the holes. The holes opening to the outside of the memory housing chamber R1, that is, air intake holes, are, for example, the holes 50k formed in the circuit board 50 to fix the semiconductor memory 55.

[Exterior Panel]

As described above, the electronic apparatus 1 has the upper exterior panel 20A attached to the upper surface of the apparatus main body 10 and the lower exterior panel 20B attached to the lower surface of the apparatus main body 10. The apparatus main body 10 has the upper housing member 30A and the lower housing member 30B combined with each other in the upward-downward direction. The upper exterior panel 20A is attached to the upper surface of the upper housing member 30A. The lower exterior panel 20B is attached to the lower surface of the lower housing member 30B.

As illustrated in FIG. 1C, the upper exterior panel 20A may have, on a right side thereof, a right projecting portion 20a that projects rightward beyond the position of a right side surface 10b of the apparatus main body 10 (right side external surface of the front exterior panel 35). In addition, the upper exterior panel 20A may have, on a left side thereof, a left projecting portion 20b (FIG. 1G) that projects leftward beyond the position of a left side surface 10c of the apparatus main body 10 (left side surface of the housing 30). As illustrated in FIG. 1B, the projecting portions 20a and 20b may continue from a rear edge to a front edge of the upper exterior panel 20A.

The projecting portions 20a and 20b can protect the apparatus main body 10. For example, when the electronic apparatus 1 is placed vertically such that the right side surface 10b of the electronic apparatus 1 is on the lower side, the right projecting portion 20a abuts against a floor surface and supports the apparatus main body 10, so that the side surface of the apparatus main body 10 can be prevented from being damaged or soiled.

Similarly to the upper exterior panel 20A, as illustrated in FIG. 1C, the lower exterior panel 20B may have, on a right side thereof, a right projecting portion 20c that projects rightward beyond the position of the right side surface 10b of the apparatus main body 10, and have, on a left side thereof, a left projecting portion 20d (see FIG. 1G) that projects leftward beyond the position of the left side surface 10c of the apparatus main body 10. The projecting portions 20c and 20d may continue from a rear edge to a front edge of the lower exterior panel 20B. According to this structure of the exterior panels 20A and 20B, the apparatus main body 10 can be protected more effectively.

As illustrated in FIG. 1E, the upper exterior panel 20A may have, on a front side thereof, a front projecting portion 20e that projects frontward beyond the position of the front surface 10a of the apparatus main body 10 (front surface of the front exterior panel 35). Similarly, the lower exterior panel 20B may have, on a front side thereof, a front projecting portion 20f that projects frontward beyond the position of the front surface 10a of the apparatus main body 10. According to this structure of the exterior panels 20A and 20B, the front surface 10a of the apparatus main body 10 and parts arranged in the front surface 10a (for example, the buttons 2a and 2b, the connector 3a and 3b, and the like) can be protected. The front projecting portion 20e continues from a right edge to a left edge of the upper exterior panel 20A. The front projecting portion 20f continues from a right edge to a left edge of the lower exterior panel 20B. In addition, the exterior panels 20A and 20B may have a rear projecting portion that projects rearward beyond the position of the rear surface of the apparatus main body 10 (rear surface of the housing 30).

Incidentally, the exterior panels 20A and 20B may have projecting portions on only a part of the right side, the left side, and the front side thereof. For example, the exterior panels 20A and 20B may not have the projecting portions 20e and 20f on the front side. In addition, only one of the two exterior panels 20A and 20B may have the projecting portions.

As illustrated in FIG. 1A, the upper exterior panel 20A has a shape obtained by gently curving one plate in a thickness direction thereof and does not have, at an outer peripheral edge thereof, a wall portion that drops toward the lower exterior panel 20B. That is, the upper exterior panel 20A is not in a box shape. Hence, the upper exterior panel 20A has a right end surface 20g (see FIG. 1E) facing rightward and having a width T3 (width in the upward-downward direction) corresponding to the thickness of the upper exterior panel 20A. Similarly, the upper exterior panel 20A has a left end surface facing leftward and having a width corresponding to the thickness of the upper exterior panel 20A, a front end surface facing frontward and having a width corresponding to the thickness of the upper exterior panel 20A, and a rear end surface facing rearward and having a width corresponding to the thickness of the upper exterior panel 20A.

Similarly to the upper exterior panel 20A, the lower exterior panel 20B does not have, at an outer peripheral edge thereof, a wall portion that extends toward the upper exterior panel 20A. Hence, the lower exterior panel 20B has a right end surface 20h (see FIG. 1G) facing rightward and having a width T4 (width in the upward-downward direction) corresponding to the thickness of the lower exterior panel 20B, a left end surface facing leftward and having a width corresponding to the thickness of the lower exterior panel 20B, a front end surface facing frontward and having a width corresponding to the thickness of the lower exterior panel 20B, and a rear end surface facing rearward and having a width corresponding to the thickness of the lower exterior panel 20B.

[Curve of Exterior Panel]

The upper exterior panel 20A may have a curved section in a cutting plane that is along the upward-downward direction and intersects the left-right direction. This can increase the strength of the exterior member when the electronic apparatus 1 is placed vertically, as compared with a case where the upper exterior panel 20A is a flat plate. As illustrated in FIG. 20A and FIG. 20B, the upper exterior panel 20A may have sections curved in different manners in two cutting planes that are along the upward-downward direction and intersect each other. Here, the two cutting planes are, for example, a cutting plane indicated by a line XXa-XXa illustrated in FIG. 1D and a cutting plane indicated by a line XXb-XXb. The cutting planes are not limited to the example illustrated in FIG. 1D and may, for example, be planes along the upward-downward direction and the front-rear direction. Also in such a case, the strength of the upper exterior panel 20A (strength against a force acting in the left-right direction) can be increased.

Figure 1D:
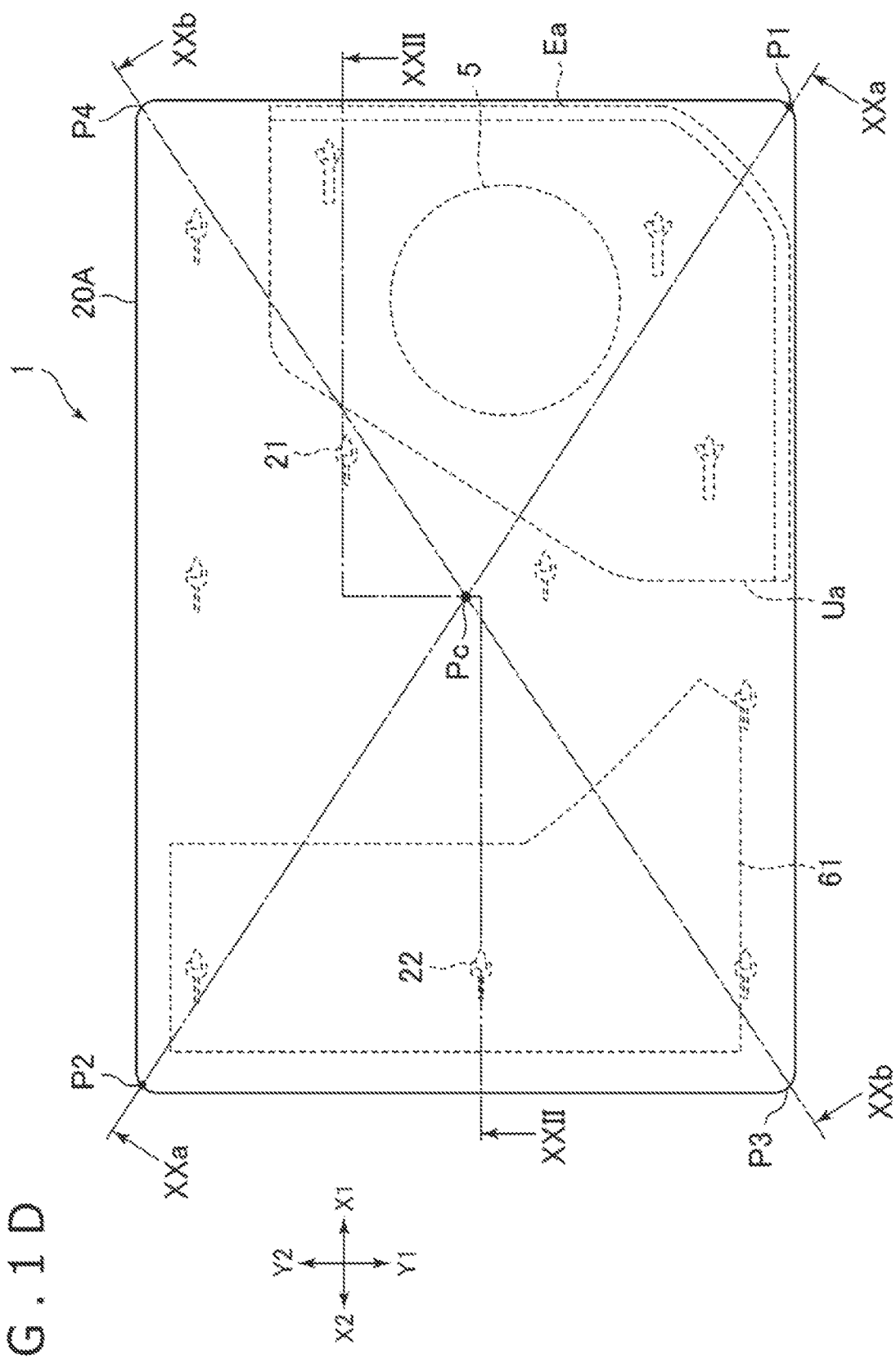
FIG. 1D is a plan view illustrating the electronic apparatus.
Figure 1E:
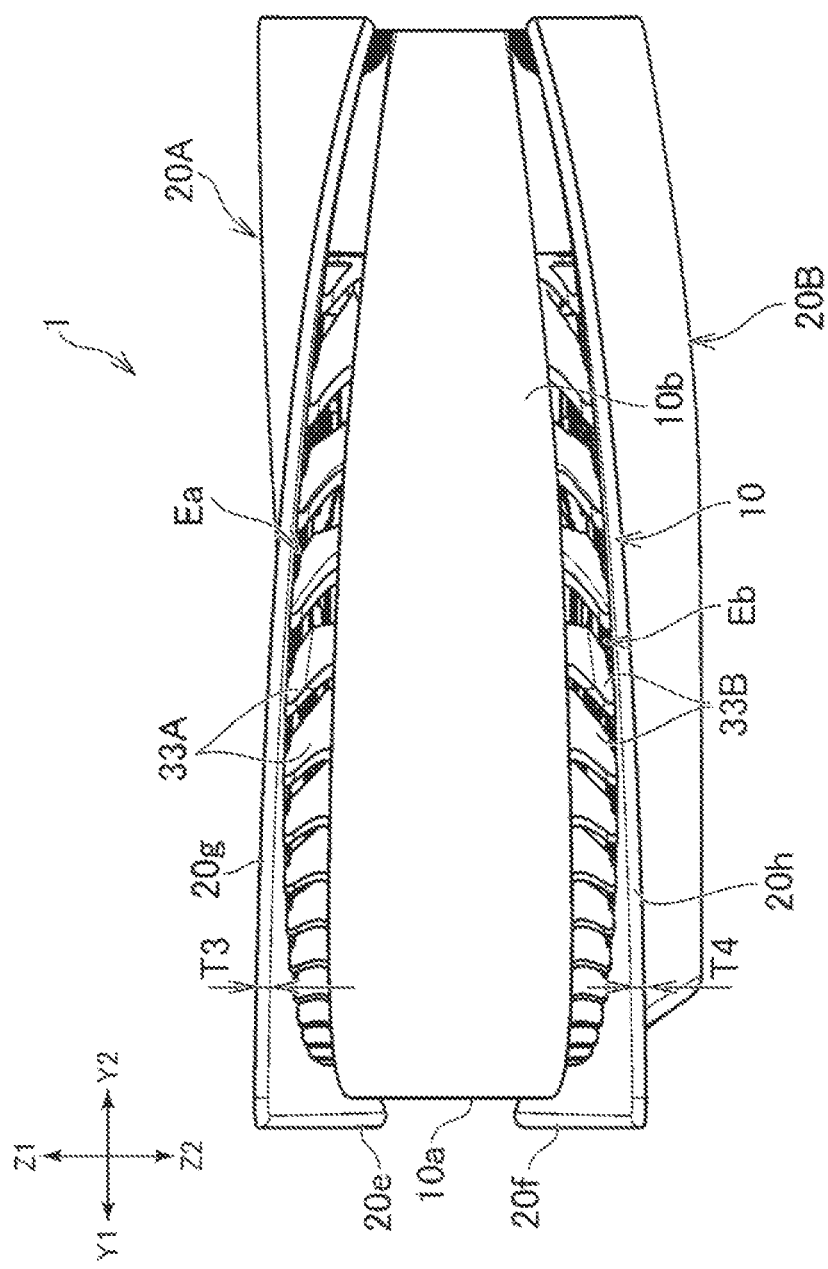
FIG. 1E is a right side view illustrating the electronic apparatus.
Figure 1F:
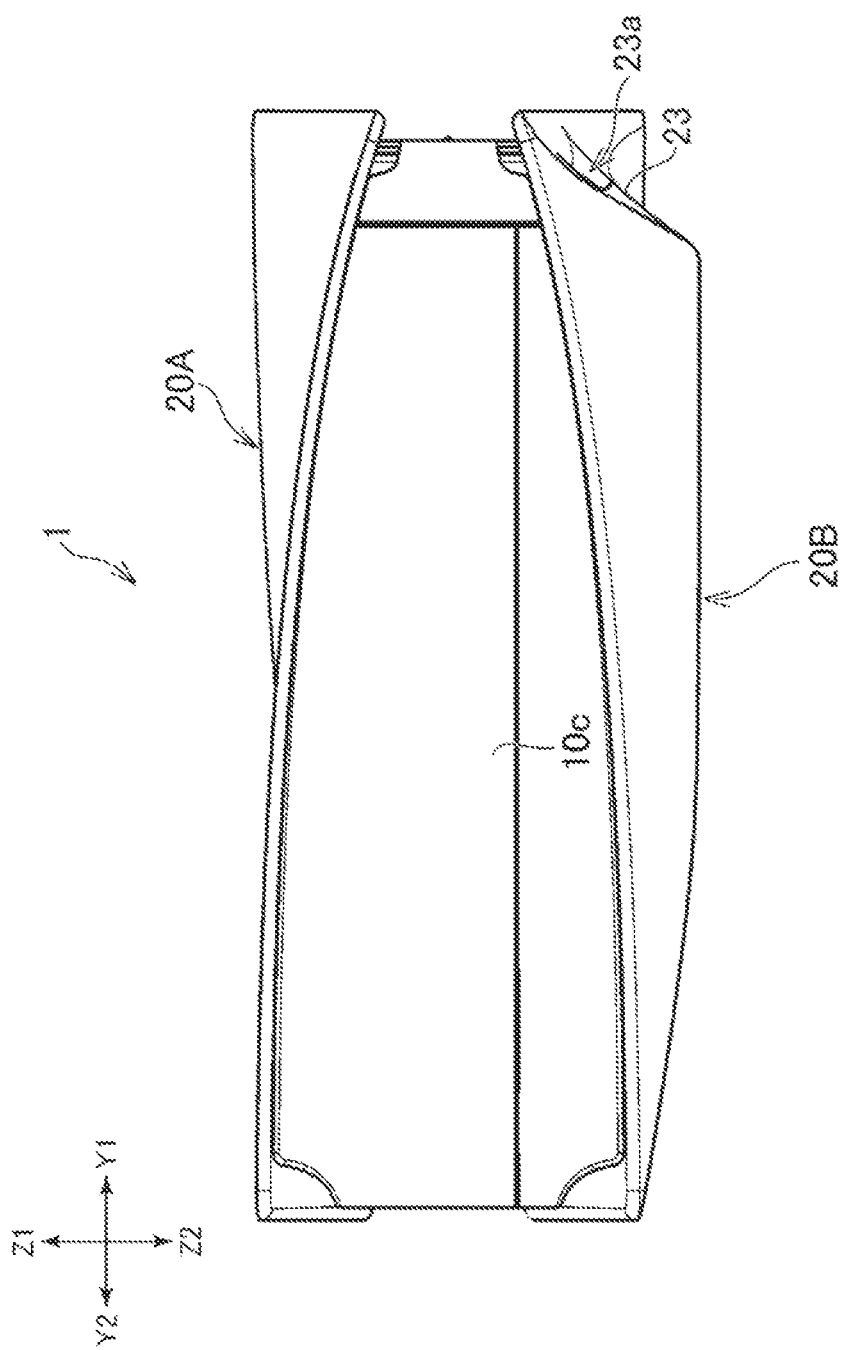
FIG. 1F is a left side view illustrating the electronic apparatus.
Figure 1G:
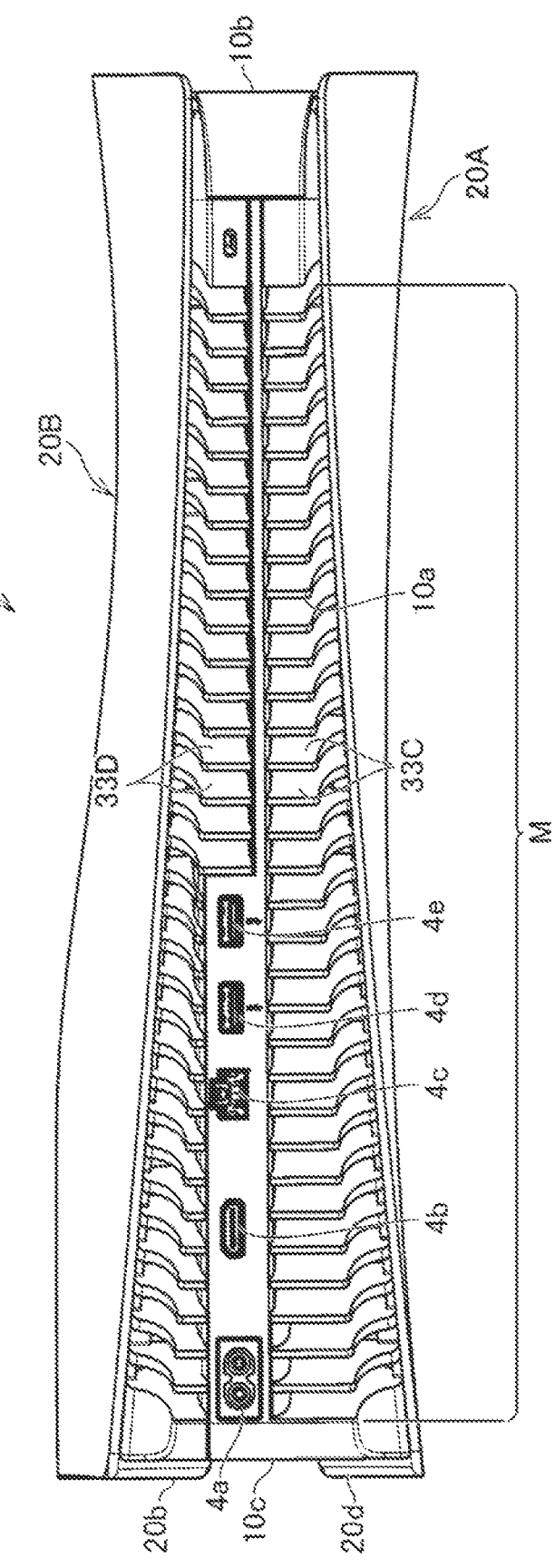
FIG. 1G is a rear view illustrating the electronic apparatus.

In FIG. 1D, a first position P1, a second position P2 located on an opposite side of a center Pc of the upper exterior panel 20A from the first position P1, a third position P3, and a fourth position P4 located on an opposite side of the center Pc of the upper exterior panel 20A from the third position P3 are set at four corners of the upper exterior panel 20A. In FIG. 1D, the first position P1 is given at a right front corner, the second position P2 is given at a left rear corner, the third position P3 is given at a left front corner, and the fourth position P4 is given at a right rear corner.

When the four positions are thus defined in the example of the electronic apparatus 1, a line L1 that connects the first position P1 and the second position P2 to each other and is along the upper surface of the upper exterior panel 20A is a curve bulging downward, as illustrated in FIG. 20A. In other words, when a cutting plane along a first diagonal line of the electronic apparatus 1 is viewed, the upper exterior panel 20A is curved along an arc about a point separated upward from the upper exterior panel 20A. Here, the "first diagonal line" is the line XXa-XXa illustrated in FIG. 1D.

On the other hand, a line L2 that connects the third position P3 and the fourth position P4 to each other and is along the upper surface of the upper exterior panel 20A is a curve bulging upward, as illustrated in FIG. 20B. In other words, when a cutting plane along a second diagonal line of the electronic apparatus 1 is viewed, the upper exterior panel 20A may be curved along an arc about a point separated downward from the upper exterior panel 20A. Here, the "second diagonal line" is the line XXb-XXb illustrated in FIG. 1D.

According to such curves of the upper exterior panel 20A, as illustrated in FIG. 20A, the thickness (width in the upward-downward direction) of the electronic apparatus 1 at the right front corner (first position P1) of the electronic apparatus 1 and the thickness (width in the upward-downward direction) of the electronic apparatus 1 at the left rear corner (second position P2) of the electronic apparatus 1 are increased. Therefore, when the electronic apparatus 1 is placed vertically, the attitude of the electronic apparatus 1 can be stabilized.

For example, when the electronic apparatus 1 is placed vertically such that the right side surface of the electronic apparatus 1 is on the lower side, the right front corner (first position P1) having a large thickness is on the lower side and supports the electronic apparatus 1. In addition, when the electronic apparatus 1 is placed such that the front surface of the electronic apparatus 1 is on the lower side, the right front corner (first position P1) having a large thickness is also on the lower side. When the electronic apparatus 1 is placed vertically such that the left side surface of the electronic apparatus 1 is on the lower side, on the other hand, the left rear corner (second position P2) having a large thickness is on the lower side and supports the electronic apparatus 1. Hence, according to the above-described curves of the upper exterior panel 20A, when the electronic apparatus 1 is placed vertically, the attitude of the electronic apparatus 1 can be stabilized.

FIG. 20A illustrates a first distance D1 at the first position P1 (right front corner) and a second distance D2 at the second position P2 (left rear corner) as distances from the horizontal plane Hp1 including the circuit board 50 to the upper surface of the upper exterior panel 20A. In addition, FIG. 20B illustrates a third distance D3 at the third position P3 (left front corner) and a fourth distance D4 at the fourth position P4 (right rear corner) as distances from the horizontal plane Hp1 including the circuit board 50 to the upper surface of the upper exterior panel 20A. As described above, the line L1 connecting the first position P1 and the second position P2 to each other, the first position P1 and the second position P2 being defined on a diagonal line of the upper exterior panel 20A, is a curve bulging downward, and the line L2 connecting the third position P3 and the fourth position P4 to each other, the third position P3 and the fourth position P4 being on another diagonal line of the upper exterior panel 20A, is a curve bulging upward. Therefore, each of the first distance D1 and the second distance D2 is larger than each of the third distance D3 and the fourth distance D4. It is therefore possible to realize smooth air intake and exhaust by arranging devices and parts of a cooling system near the first position P1 and near the second position P2.

For example, as illustrated in FIG. 1D, as viewed in plan of the electronic apparatus 1, a line connecting the center Pc of the upper exterior panel 20A and the first position P1 to each other (line XXa-XXa indicating a cutting plane) passes the inlet port Ea (see FIG. 1C) formed between the upper exterior panel 20A and the upper surface of the upper housing member 30A. In addition, the line connecting the center Pc of the upper exterior panel 20A and the first position P1 to each other passes the upper flow passage Ua (see FIG. 20A) formed between the upper exterior panel 20A and the recessed plate portion 32a (see FIG. 2A) of the upper housing member 30A. This facilitates securing of a sufficient width in the upward-downward direction of the inlet port Ea and a sufficient width in the upward-downward direction of the upper flow passage Ua.

In addition, as viewed in plan of the electronic apparatus 1, a line connecting the center Pc of the upper exterior panel 20A and the second position P2 to each other (line XXa-XXa indicating a cutting plane) may pass a flow passage from the cooling fan 5 to the exhaust port M provided in the back surface of the electronic apparatus 1. In the example of the electronic apparatus 1, the air flowing out of the cooling fan 5 passes through the inside of the power supply unit case 61 and is exhausted from the exhaust port M. As viewed in plan of the electronic apparatus 1, the line connecting the center Pc of the upper exterior panel 20A and the second position P2 to each other (line XXa-XXa indicating a cutting plane) passes an air flow passage formed in the rear portion (case rear portion 61c) of the power supply unit case 61. Therefore, a sufficient size in the upward-downward direction of the rear portion of the power supply unit case 61 is secured easily, and exhaust efficiency can be improved.

In addition, as viewed in plan of the electronic apparatus 1, the line connecting the center Pc of the upper exterior panel 20A and the second position P2 to each other passes the rear wall 61i (see FIG. 7C) of the power supply unit case 61 in which the exhaust holes 61g are formed, and the rear portion 61k (see FIG. 7C) of the upper wall 61j in which the exhaust holes 61h are formed. This facilitates securing of a sufficient size in the upward-downward direction of the rear wall 61i of the power supply unit case 61 and securing of a sufficient width in the upward-downward direction of the air flow passage Se (see FIG. 7C) formed between the rear portion 61k of the upper wall 61j and the upper housing member 30A.

The lower exterior panel 20B may also be curved as a whole. For example, as illustrated in FIG. 20A, the lower exterior panel 20B is curved when the cutting plane along the first diagonal line of the electronic apparatus 1 (line XXa-XXa in FIG. 1D) is viewed. As illustrated in FIG. 20B, when the cutting plane along the second diagonal line of the electronic apparatus 1 (line XXb-XXb in FIG. 1D) is viewed, the lower exterior panel 20B may be curved in a manner different from that in the cutting plane illustrated in FIG. 20A. As described above, the optical disk drive 6 is disposed on the lower side of the circuit board 50. The optical disk drive 6 is located in a left portion of the electronic apparatus 1. Therefore, a left portion of the lower exterior panel 20B is bulged downward so as to cover the lower side of the optical disk drive 6. A right portion Br of the lower exterior panel 20B may have a shape symmetric to a right portion of the upper exterior panel 20A.

Figure 21A:
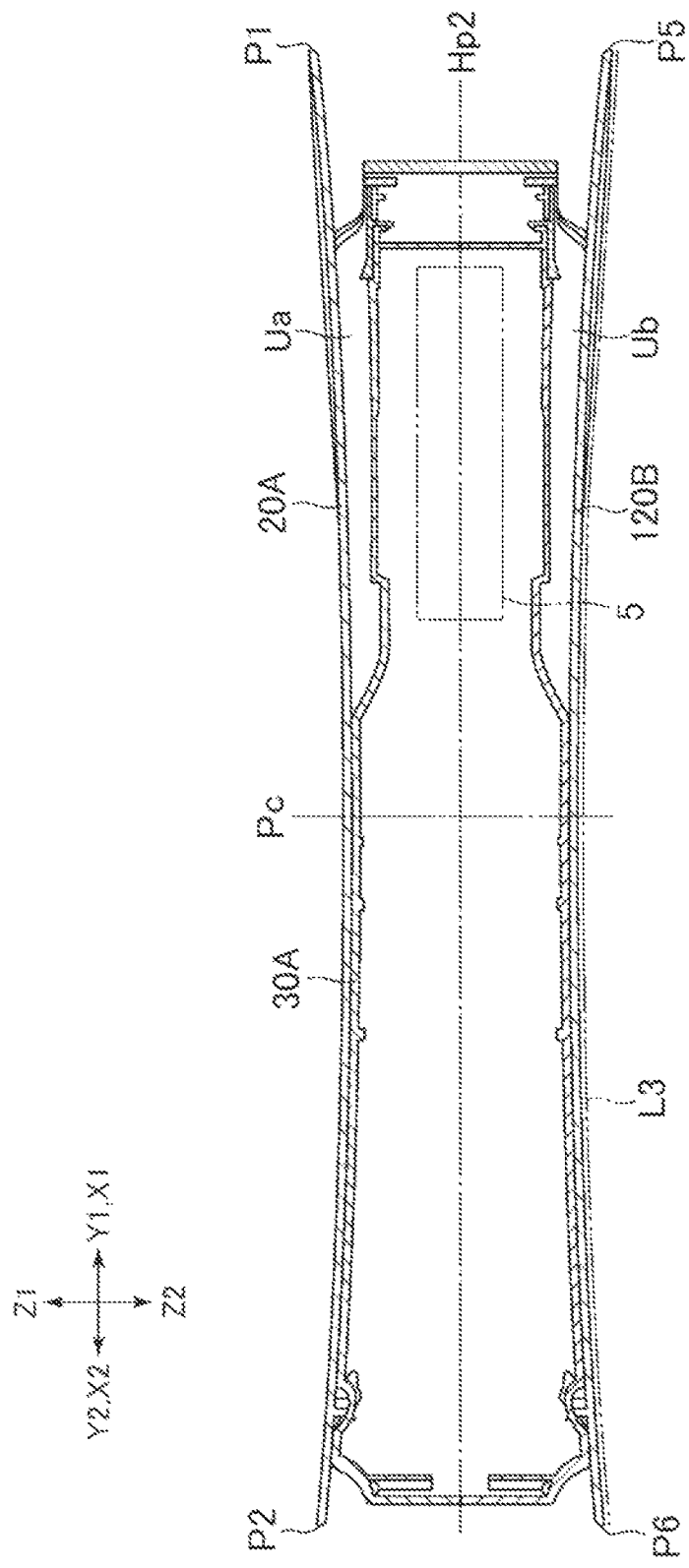
FIG. 21A is a sectional view of exterior panels and a housing of an electronic apparatus not including an optical disk drive, in which a cutting plane of the sectional view is the same as the cutting plane indicated by the line XXa-XXa in FIG. 1D.
Figure 21B:
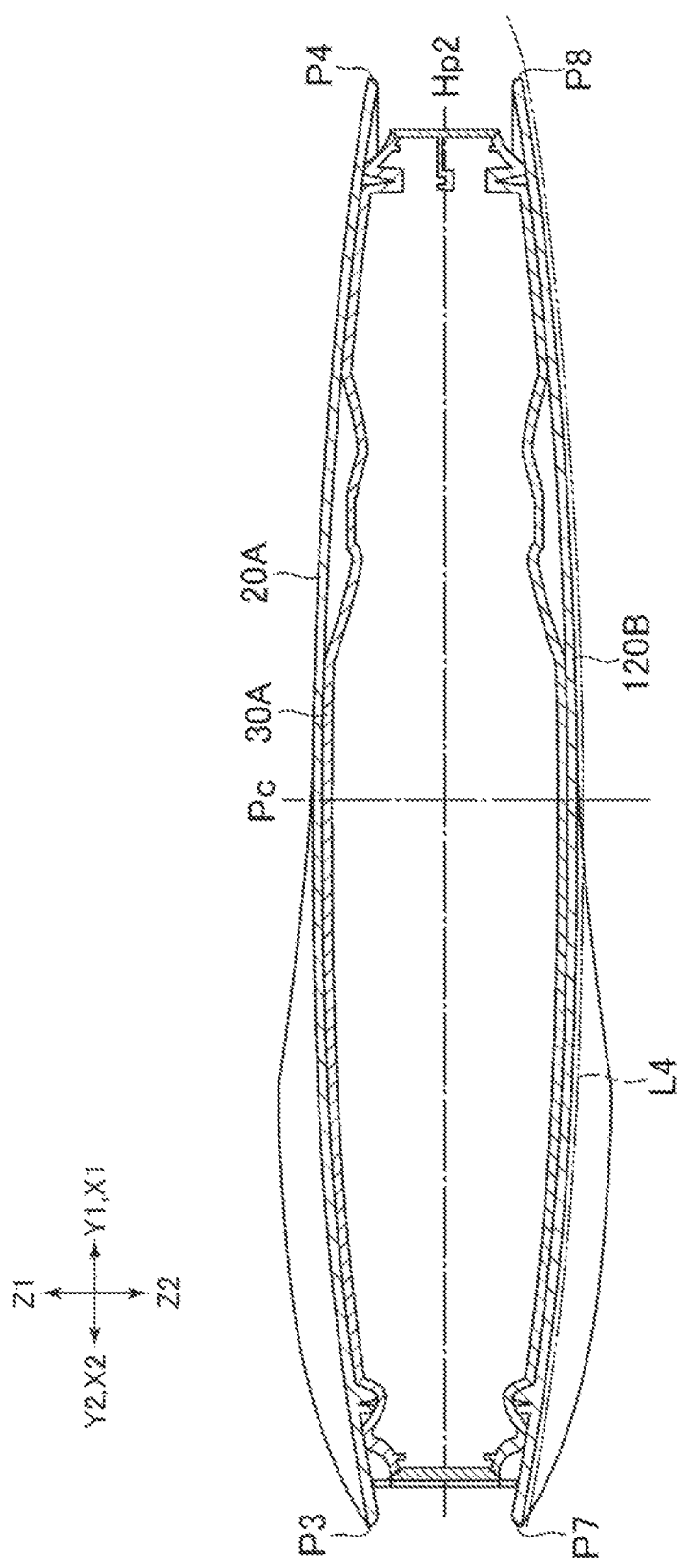
FIG. 21B is a sectional view of the exterior panels and the housing illustrated in FIG. 21A, in which a cutting plane of the sectional view is the same as the cutting plane indicated by the line XXb-XXb in FIG. 1D.
Figure 21C:
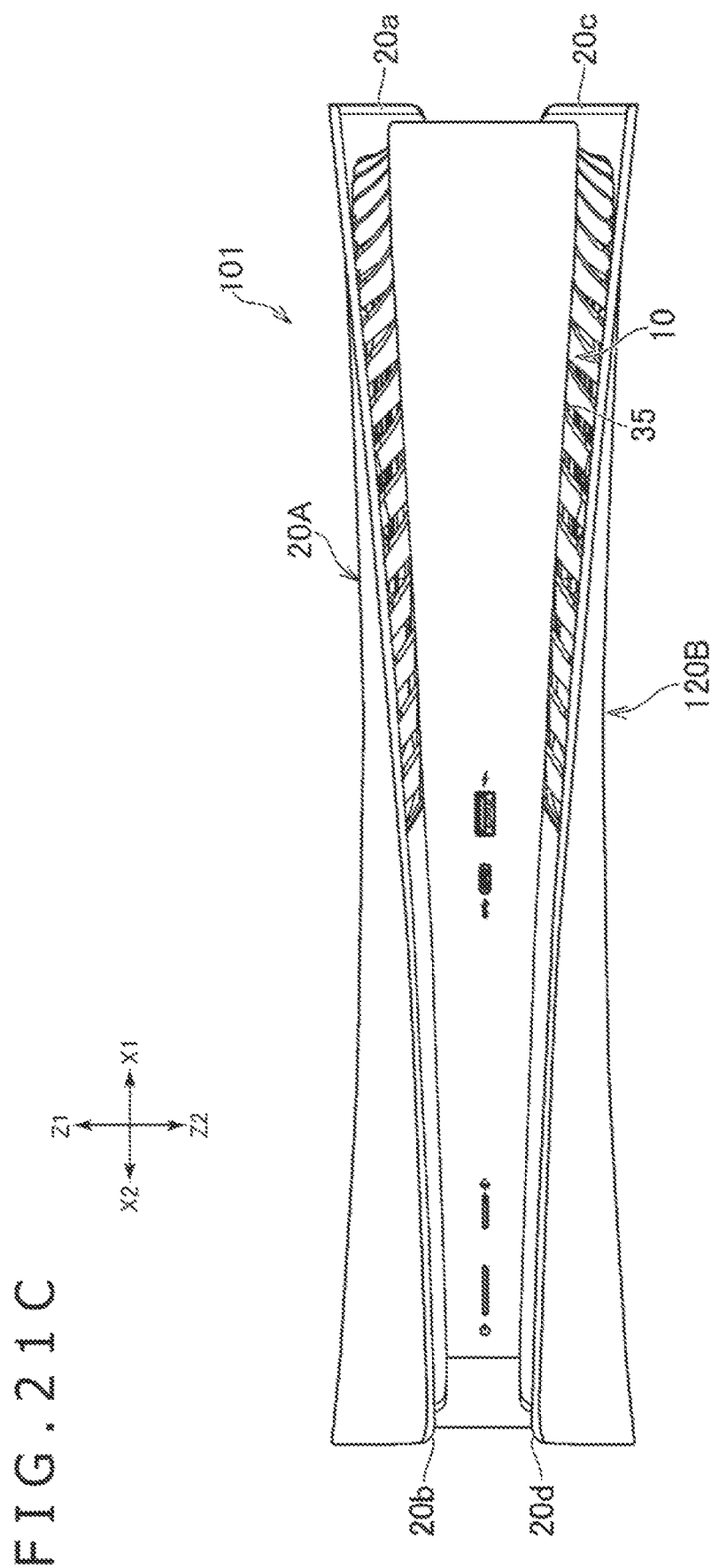
FIG. 21C is a front view of the electronic apparatus illustrated in FIG. 21A.

Incidentally, the electronic apparatus 1 may not have the optical disk drive 6 on the lower side of the circuit board 50. In such a case, the whole of the shape (curve) of the lower exterior panel 20B may be symmetric to the shape (curve) of the upper exterior panel 20A. FIG. 21A and FIG. 21B are sectional views illustrating a lower exterior panel according to such a modification. In an example illustrated in these diagrams, a lower exterior panel 120B and the upper exterior panel 20A have shapes symmetric with respect to a horizontal plane Hp2. FIG. 21A illustrates sections of the exterior panels 20A and 120B which are obtained in the same cutting plane as the cutting plane indicated by the line XXa-XXa in FIG. 1D. FIG. 21B illustrates sections of the exterior panels 20A and 120B which are obtained in the same cutting plane as the cutting plane indicated by the line XXb-XXb in FIG. 1D. FIG. 21C is a front view of an electronic apparatus 101 having the exterior panels 20A and 120B illustrated in FIG. 21A and FIG. 21B.

In the example illustrated in FIG. 21A and FIG. 21B, a fifth position P5, a sixth position P6 located on an opposite side of a center Pc of the lower exterior panel 120B from the fifth position P5, a seventh position P7, and an eighth position P8 located on an opposite side of the center Pc of the lower exterior panel 120B from the seventh position P7 are set at four corners of the lower exterior panel 120B. For example, the fifth position P5 is given at a right front corner of the lower exterior panel 120B, the sixth position P6 is given at a left rear corner of the lower exterior panel 120B, the seventh position P7 is given at a left front corner of the lower exterior panel 120B, and the eighth position P8 is given at a right rear corner of the lower exterior panel 120B. Hence, as viewed in plan of the electronic apparatus 1, the fifth position P5, the sixth position P6, the seventh position P7, and the eighth position P8 respectively correspond to the first position P1, the second position P2, the third position P3, and the fourth position P4 described above.

When the four positions are thus defined in the lower exterior panel 120B, a line L3 that connects the fifth position P5 and the sixth position P6 to each other and is along the lower surface of the lower exterior panel 120B may be a curve bulging upward, as illustrated in FIG. 21A. On the other hand, a line L4 that connects the seventh position P7 and the eighth position P8 to each other and is along the lower surface of the lower exterior panel 120B may be a curve bulging downward, as illustrated in FIG. 21B.

Incidentally, the curved form of the upper exterior panel 20A is not limited to the example of the electronic apparatus 1. For example, the above-described four positions P1 to P4 defining the curved form of the upper exterior panel 20A may not be the four corners of the upper exterior panel 20A. For example, the first position P1 may be defined at a center of the front edge of the upper exterior panel 20A, the second position P2 may be defined on an opposite side of the center Pc of the upper exterior panel 20A from the first position P1, the third position P3 may be defined at a center of the right edge of the upper exterior panel 20A, and the fourth position P4 may be defined on an opposite side of the center Pc of the upper exterior panel 20A from the third position P3. When the four positions P1 to P4 are thus defined, the line that connects the first position P1 and the second position P2 to each other and is along the upper surface of the upper exterior panel 20A may, for example, be a curve bulging downward. On the other hand, the line that connects the third position P3 and the fourth position P4 to each other and is along the upper surface of the upper exterior panel 20A may be a curve bulging upward.

In such a case, the curved form of the lower exterior panel 20B may correspond to the curved form of the upper exterior panel 20A. For example, the whole of the shape (curve) of the lower exterior panel 20B may be symmetric to the shape (curve) of the upper exterior panel 20A. Further, in another example, while only the upper exterior panel 20A is curved as described above, the lower exterior panel 20B may be in a flat plate shape. In yet another example, a part of the upper exterior panel 20A or a part of the lower exterior panel 20B may include a flat surface.

[Exterior Panel Attachment Structures]

Figure 22:
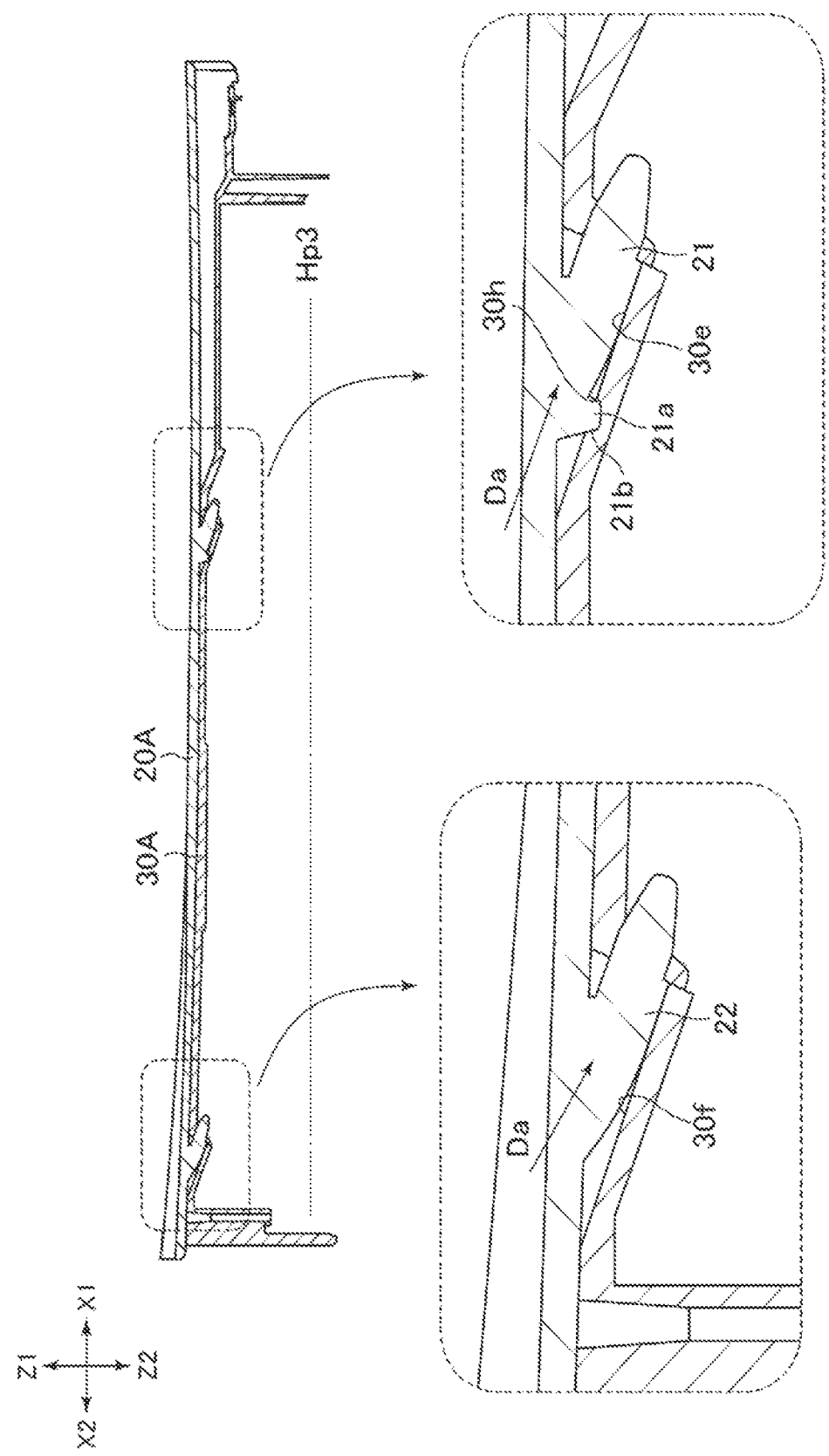
FIG. 22 is a sectional view of the upper exterior panel and the upper housing member, the sectional view being obtained in a cutting plane indicated by a line XX-XX in FIG. 1D.

As illustrated in FIG. 2A and FIG. 22, a plurality of attachment holes 30e and 30f are formed in the upper surface of the apparatus main body 10 (the upper surface of the upper housing member 30A). A plurality of attachment target projecting portions 21 and 22 (see FIG. 2B) are formed on the lower surface of the upper exterior panel 20A. The attachment target projecting portions 21 and 22 are fitted in the attachment holes 30e and 30f, respectively. The attachment holes 30e and 30f are, for example, holes that penetrate the upper housing member 30A.

In FIG. 22, fitting directions in which the attachment target projecting portions 21 and 22 are respectively fitted into the attachment holes 30e and 30f are indicated by arrows Da. The fitting directions Da, for example, correspond to a direction in which the attachment target projecting portions 21 and 22 project from the lower surface of the upper exterior panel 20A. In addition, the fitting directions Da, for example, correspond to a direction in which the attachment holes 30e and 30f penetrate the upper housing member 30A. Each of the fitting directions Da in which the plurality of attachment target projecting portions 21 and 22 are fitted into the attachment holes 30e and 30f is parallel with the other. The fitting direction Da may be inclined with respect to a plane perpendicular to the upward-downward direction (horizontal plane Hp3 parallel with the circuit board 50 in FIG. 22). For example, the fitting direction Da may be a direction inclined with respect to the horizontal plane Hp3 and along a plane parallel with the upward-downward direction and the left-right direction.

As described above, the upper exterior panel 20A is curved in manners different from each other in two cutting planes that are along the upward-downward direction and intersect each other. That is, the upper exterior panel 20A is curved so as to bulge downward in the cutting plane along the first diagonal line (line XXa-XXa in FIG. 1D) and is curved so as to bulge upward in the cutting plane along the second diagonal line (line XXb-XXb in FIG. 1D). As illustrated in FIG. 22, the upper surface of the apparatus main body 10 is also curved in conformity with the upper exterior panel 20A. When the fitting direction Da is inclined with respect to the horizontal plane Hp3, the curved upper exterior panel 20A can be attached to the upper surface of the apparatus main body 10 that is similarly curved, and the upper exterior panel 20A and the upper surface of the apparatus main body 10 can be brought into close contact with each other.

Figure 23:
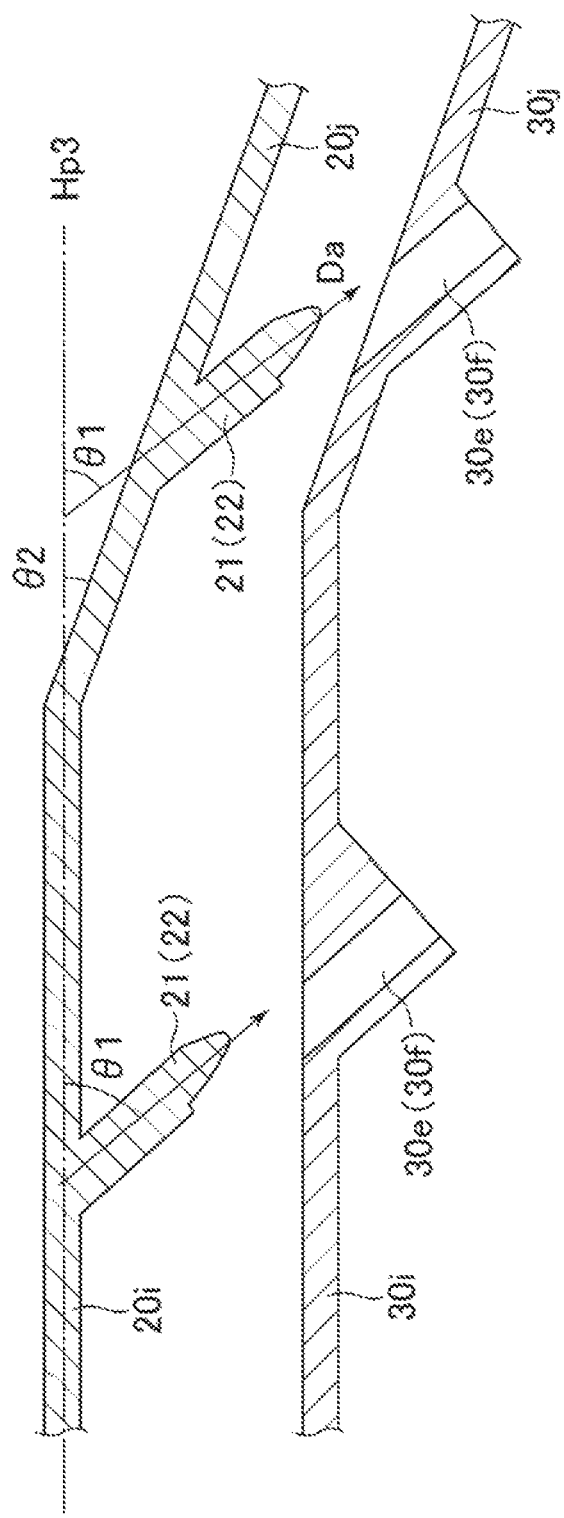
FIG. 23 is a schematic diagram of assistance in explaining an attachment structure of the upper exterior panel and the upper housing member.

FIG. 23 is a schematic diagram of assistance in explaining this. In an example illustrated in this figure, a horizontal portion 30i and an inclined portion 30j are formed in the upper housing member 30A. A horizontal portion 20i and an inclined portion 20j are also formed in the upper exterior panel 20A. The attachment target projecting portions 21 and 22 project in the direction Da inclined with respect to the horizontal plane. The attachment holes 30e and 30f penetrate the upper housing member 30A in the direction Da inclined with respect to the horizontal plane Hp3. The fitting direction Da is inclined more greatly than the inclined portions 30j and 20j. That is, an angle θ1 formed between the horizontal plane Hp3 and the fitting direction Da is larger than an angle θ2 formed between the horizontal plane Hp3 and the inclined portions 20j and 30j. Therefore, the attachment target projecting portions 21 and 20 can be inserted into the attachment holes 30e and 30f without the occurrence of an interference between the inclined portion 20j and the inclined portion 30j and an interference between the horizontal portion 20i and the horizontal portion 30i. In addition, after the insertion of the attachment target projecting portions 21 and 20, the inclined portion 20j and the inclined portion 30j can be brought into close contact with each other, and the horizontal portion 20i and the horizontal portion 30i can be brought into close contact with each other.

For a reduction in size in the upward-downward direction of the electronic apparatus 1, a method is effective in which the upper exterior panel 20A and the upper housing member 30A are attached to each other by, for example, sliding the upper exterior panel 20A with respect to the upper housing member 30A in a right direction or a left direction. However, that method causes a gap between the inclined portions 20j and 30j and an interference between another inclined portion of the upper exterior panel 20A and the upper housing member 30A. On the other hand, in the example of the electronic apparatus 1, the fitting direction Da is inclined more greatly than the inclined portions 20j and 30j, and therefore, the upper exterior panel 20A can be attached to the upper housing member 30A without causing such a gap or an interference. Hence, it is desirable that the fitting direction Da of the attachment target projecting portions 21 and 22 and the attachment holes 30e and 30f be inclined with respect to the horizontal plane Hp3 more greatly than a part inclined most greatly in the upper exterior panel 20A.

Incidentally, the plurality of attachment holes 30e and 30f are preferably distributed over the entire upper surface of the upper housing member 30A. This can bring the whole of the upper exterior panel 20A into close contact with the upper surface of the upper housing member 30A. In the example of the electronic apparatus 1, the recessed plate portion 32a is formed in the upper surface of the upper housing member 30A. The attachment holes 30e and 30f are preferably distributed in a region other than the recessed plate portion 32a.

As illustrated in FIG. 22, the attachment target projecting portion 21 has an engaging protruding portion 21a at a base portion thereof. A recessed portion 30h is formed in the bottom surface of the attachment hole 30e. The engaging protruding portion 21a is fitted in the recessed portion 30h and regulates slipping of the attachment target projecting portion 21 from the attachment hole 30e. On the other hand, the attachment target projecting portion 22 has no protruding portion at a base portion thereof. The engaging protruding portion 21a has a surface 21b that faces a direction of pulling out the attachment target projecting portion 21 from the attachment hole 30e. At the surface 21b, the engaging protruding portion 21a engages with the recessed portion 30h. (The surface 21b will hereinafter be referred to as a locking surface.) The upper exterior panel 20A holds the upper surface of the upper housing member 30A with the locking surface 21b of the attachment target projecting portion 21 and the attachment target projecting portion 22. A plurality of attachment target projecting portions 22 are arranged along a left edge of the upper exterior panel 20A. Unlike the attachment target projecting portion 21, no projecting portion may be formed at base portions of the attachment target projecting portions 22.

The structure for attachment of the lower exterior panel 20B to the lower housing member 30B may be the same as the structure for attachment of the upper exterior panel 20A to the upper housing member 30A. That is, as illustrated in FIG. 2A, the lower exterior panel 20B may have an attachment target projecting portion 25 having a protruding portion formed at a base portion thereof and an attachment target projecting portion 24 not having such a protruding portion formed thereon. Attachment holes into which the attachment target projecting portions 24 and 25 are to be fitted may be formed in the lower surface of the lower housing member 30B.

Figure 24:
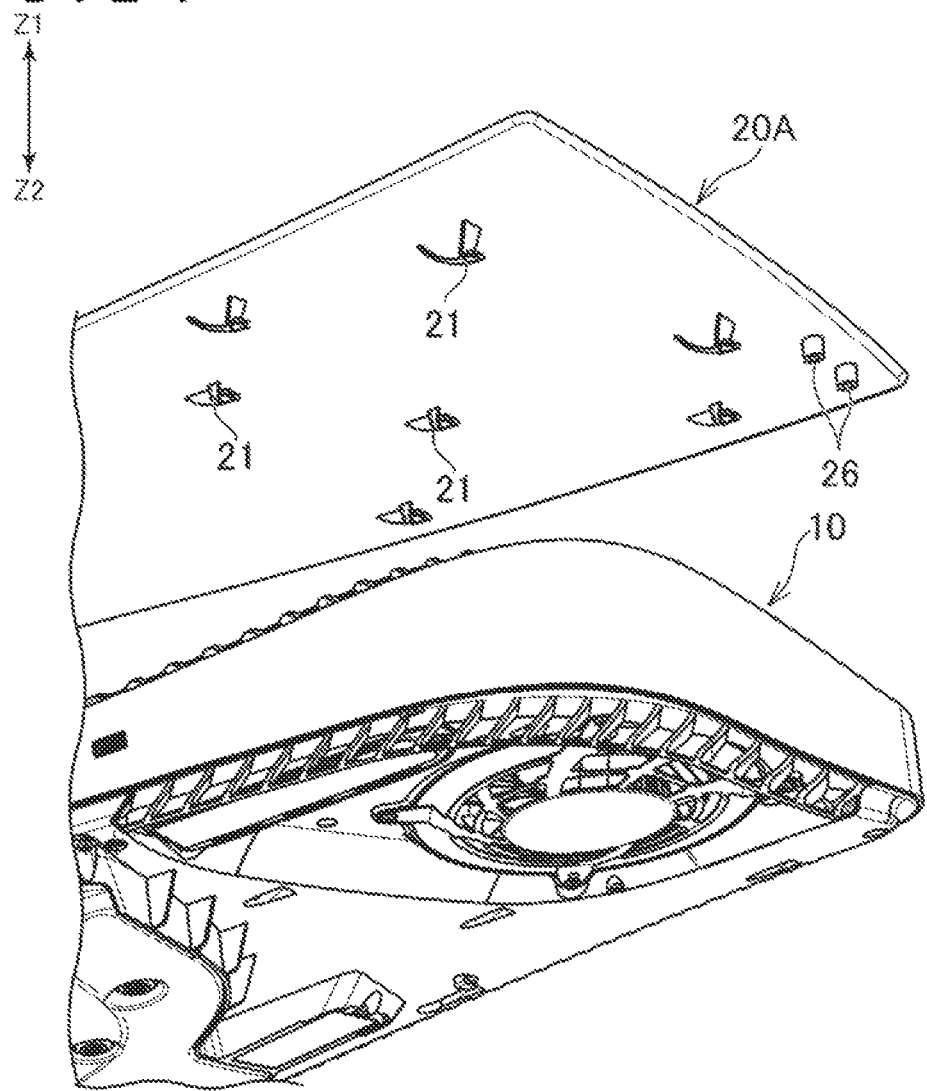
FIG. 24 is a perspective view of assistance in explaining a modification of the attachment structure of the upper exterior panel and the upper housing member.

Incidentally, the structure for fixing the upper exterior panel 20A to the upper housing member 30A is not limited to the example of the electronic apparatus 1. For example, as illustrated in FIG. 24, engaging protruding portions 26 may be formed in the lower surface of the upper exterior panel 20A in place of the engaging protruding portion 21a formed on the base portion of the attachment target projecting portion 21. The engaging protruding portions 26 may, for example, be formed such that center lines thereof are along the upward-downward direction. On the other hand, holes or recessed portions into which the engaging protruding portions 26 are to be fitted may be formed in the upper housing member 30A. According to this structure, the size of the projecting portions is increased easily as compared with the engaging protruding portion 21a of the attachment target projecting portion 21. As a result, the strength of the engaging protruding portions can be increased.

[Disk Insertion Slot]

Figure 25:
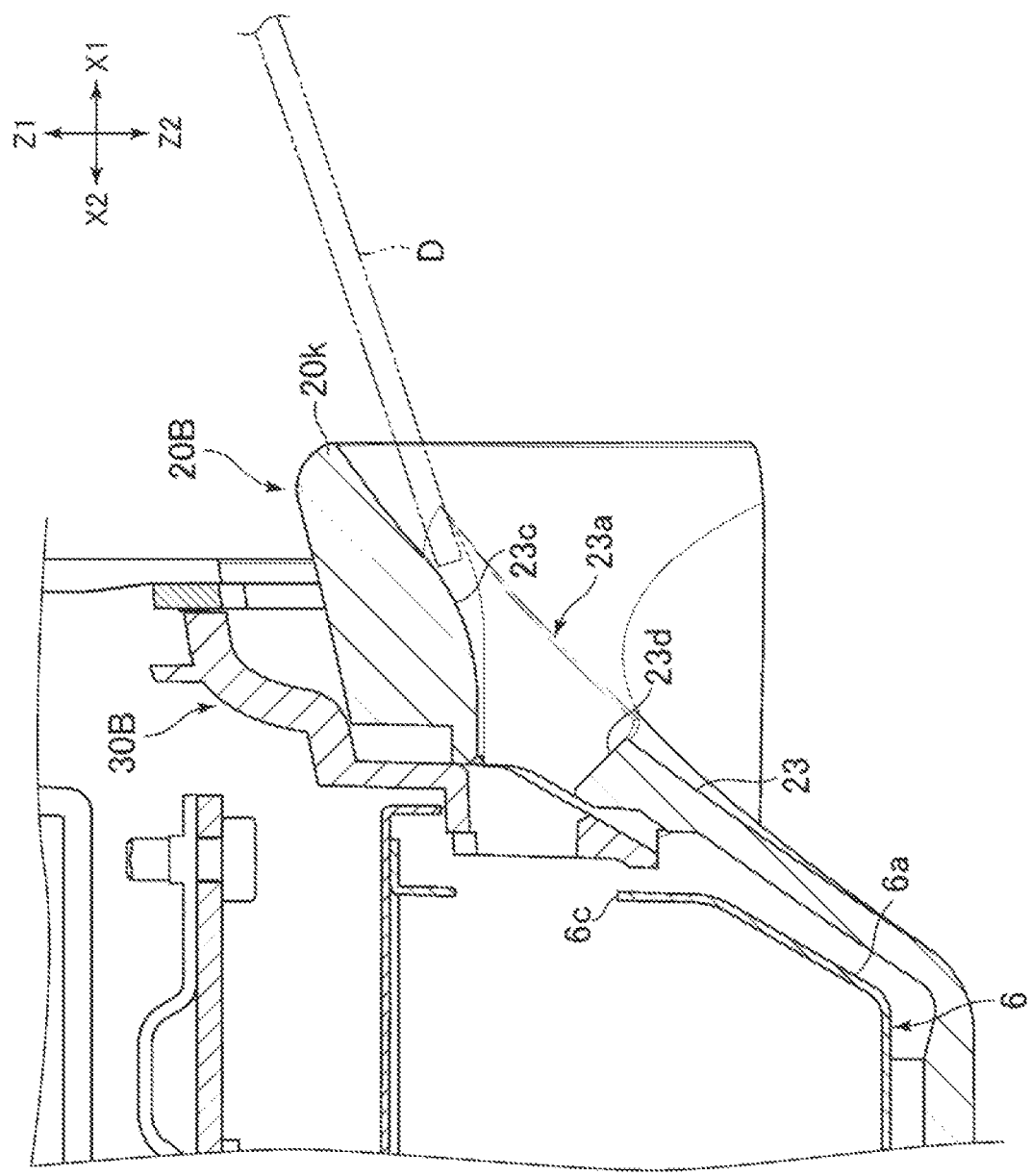
FIG. 25 is a sectional view of the electronic apparatus, the sectional view being obtained in a cutting plane indicated by a line XXV-XXV in FIG. 1C.

As illustrated in FIG. 1B and FIG. 25, a disk insertion slot 23a into which an optical disk is to be inserted toward the optical disk drive 6 may be formed in the lower exterior panel 20B. The lower exterior panel 20B has a front slope 23 on the front side thereof. The front slope 23 is a surface that extends obliquely downward and rearward from a front edge 20k of the lower exterior panel 20B. The disk insertion slot 23a is formed in the front slope 23. This can prevent the disk insertion slot 23a from being conspicuous.

As illustrated in FIG. 25, a guide curved surface 23c connected to the edge of the disk insertion slot 23a is formed on an upper portion of the disk insertion slot 23a. The guide curved surface 23c can function as a guide for an optical disk D. In a case where a front edge of the optical disk collides immediately below the front edge 20k of the lower exterior panel 20B at a time of insertion of the optical disk D, for example, the guide curved surface 23c guides the optical disk D to the inside of the disk insertion slot 23a.

Figure 1H:
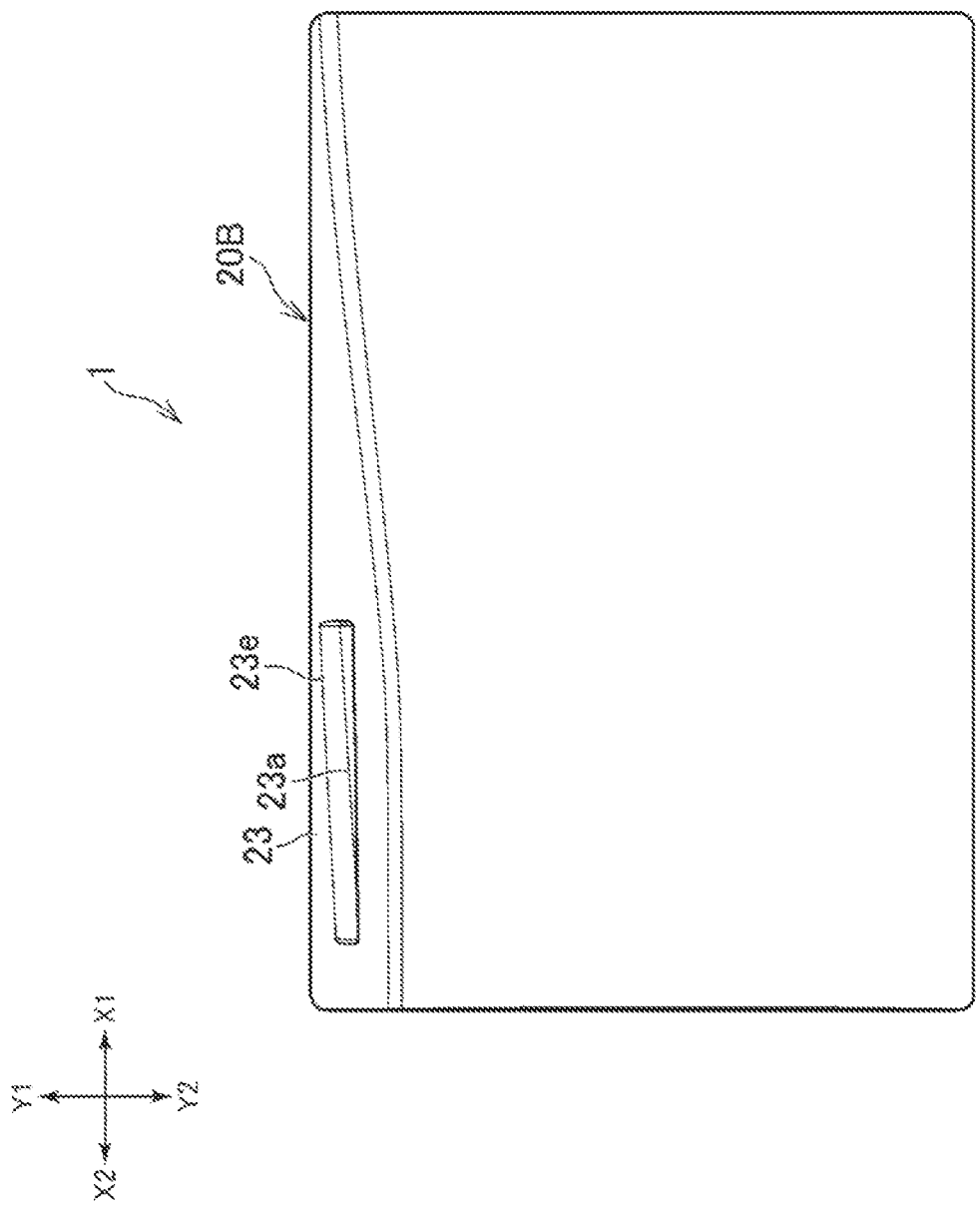
FIG. 1H is a bottom view illustrating the electronic apparatus.

In the example of the electronic apparatus 1, the disk insertion slot 23a is located in a left portion of the electronic apparatus 1. The front slope 23 in which the disk insertion slot 23a is formed is formed obliquely such that a right portion of the front slope 23 (part near the center in the left-right direction of the electronic apparatus 1) is located forward of a left portion of the front slope 23. Therefore, as illustrated in FIG. 1H, a front edge 23e of the disk insertion slot 23a is inclined frontward from a left end of the front edge 23e to the center (center in the left-right direction) of the electronic apparatus 1 in a bottom view of the electronic apparatus 1. Therefore, at a time of insertion of the optical disk D, the guiding of the optical disk D starts early near the center of the electronic apparatus 1.

As illustrated in FIG. 25, a slope 23d is formed at a lower edge of the disk insertion slot 23a. The slope 23d extends obliquely rearward and upward from a front edge thereof. In a case where the front edge of the optical disk collides with the slope 23d, the slope 23d guides the optical disk D to an insertion opening 6c formed in a front surface of the disk drive case 6a.

The insertion opening 6c formed in the front surface of the disk drive case 6a is located above a lower portion of the slope 23d. Thus, a distance from the insertion opening 6c to the disk insertion slot 23a formed in the lower housing member 30B is decreased. As a result, the work of inserting the optical disk D can be facilitated.

As described above, in the electronic apparatus 1, the housing 30 includes the upper housing member 30A that covers the upper surface of the circuit board 50, and the lower housing member 30B that covers the lower surface of the circuit board 50. The cooling fan 5 is disposed on the outside of the outer edge of the circuit board 50. The cooling fan 5 has the rotational center line Cf along the upward-downward direction as the thickness direction of the circuit board 50. The cooling fan 5 forms an airflow between the upper surface of the circuit board 50 and the upper housing member 30A and an airflow between the lower surface of the circuit board 50 and the lower housing member 30B. The upper housing member 30A has the upper inlet port 31a defined above the cooling fan 5. The lower housing member 30B has the lower inlet port 31b defined below the cooling fan 5. According to the electronic apparatus 1, one cooling fan 5 can send air to both surfaces of the circuit board 50. It is therefore possible to cool parts disposed on both surfaces of the circuit board 50 without increasing the number of parts. In addition, because the upper inlet port 31a and the lower inlet port 31b are formed in the housing 30, air can be taken in efficiently, so that cooling performance can be improved.

In addition, the electronic apparatus 1 includes: the first heat sink 71 that allows air to pass through in the front-rear direction; the power supply unit 60 including the power supply circuit 62 and the power supply unit case 61 housing the power supply circuit 62 and having the intake air wall 61a in which the plurality of air intake hole 61b are formed; and the cooling fan 5. The intake air wall 61a is located in front of the first heat sink 71. In addition, the intake air wall 61a has an external surface inclined with respect to both the front-rear direction and the left-right direction and facing the first heat sink 71. The cooling fan 5 is disposed so as to send air to the intake air wall. Such an intake air wall 61a makes it possible to secure an airflow to be supplied to the first heat sink 71, and to cool the power supply unit 60 by a cold air (air not warmed by another heat generating device or heat radiating device) at the same time. When the power supply unit 60 can be cooled by the cold air, a clearance between the circuit parts 62a and 62b included in the power supply circuit 62 (for example, a transformer and a capacitor) can be reduced, so that the power supply unit 60 can be miniaturized.

In addition, the electronic apparatus 1 includes: the circuit board 50; the cooling fan 5 that forms an airflow for cooling parts mounted on the circuit board 50; the flow passage wall 34A that defines the flow passage of the airflow sent out from the cooling fan 5; and the dust collecting chamber Ds that captures dust in the airflow and collects the captured dust, the dust collecting chamber Ds being provided to the flow passage wall 34A. According to this structure, it is possible to reduce an amount of dust that enters devices arranged downstream of the dust collecting chamber Ds, the devices being the first heat sink 71, the power supply unit 60, and the like. In addition, the dust collecting chamber Ds has the first opening A1 that opens toward the air flow passage Sa in a direction along the circuit board 50, and the second opening A2 that opens to the outside of the dust collecting chamber Ds in a direction intersecting the circuit board 50. In the example of the electronic apparatus 1, the direction in which the second opening A2 opens is a direction orthogonal to the circuit board 50. According to this structure of the dust collecting chamber Ds, the dust can be collected in the dust collecting chamber Ds, and the collected dust can be discharged through the second opening A2 by relatively simple work.

In addition, the heat radiating device 70 includes: the plurality of heat pipes 73A to 73F located above the integrated circuit 50a and each having the heat receiving portion 73a thermally connected to the integrated circuit 50a; and the heat sinks 71 and 72 connected to the plurality of heat pipes 73A to 73F. The heat receiving portions 73a of the heat pipes 73A to 73F are abreast of each other in the left-right direction and are in contact with the heat receiving portions 73a of adjacent heat pipes 73. The heat receiving portions 73a have the first width W1 in the upward-downward direction and have the second width W2 smaller than the first width W1 in the left-right direction. According to this structure, it becomes easy to increase the number of heat pipes 73. As a result, it becomes easy to increase the size of the heat sinks 71 and 72 to which the heat of the integrated circuit 50a is transmitted through the heat pipes 73. Cooling performance for the integrated circuit 50a can therefore be improved.

In addition, the electronic apparatus 1 includes: the circuit board 50; the board shield 52 that covers the circuit board 50 and has the opening 52a formed therein; and the heat radiating device 80. The heat radiating device 80 includes: the plurality of fins 81 arranged on the inside of the opening 52a; the heat pipe 83 that has the connecting portion 83a located between the plurality of fins 81 and the circuit board 50 and extending in the left-right direction along the circuit board 50; and the base plate 82 or 182 that supports the plurality of fins 81. The base plate 82 or 182 has the plate left portion 82c or 182c. The plate left portion 82c or 182c covers the lower surface of the heat pipe 83, the lower surface facing the board shield 52 side, and closes the gap G1 between the left end of the plurality of fins 81 and the left edge of the opening 52a of the board shield 52. According to this structure, it is possible to effectively suppress a leakage of electromagnetic waves from the gap G1 between the left end of the plurality of fins 81 and the left edge of the opening 52a of the board shield 52.

As described above, in the electronic apparatus 1, the lower surface of the circuit board 50 has the shielded region B1 on which the electronic parts 50c and 50e are arranged, and the board shield 52 covers the shielded region. The memory housing chamber R1 capable of housing the semiconductor memory 55 is defined on the outside of the shielded region. The board shield 52 has the shield walls 52e and 52f along the memory housing chamber R1. Because the shield walls 52e and 52f are formed on the board shield 52 in the electronic apparatus 1, the semiconductor memory 55 can be protected from static electricity while an increase in the number of parts is suppressed.

As described above, the electronic apparatus 1 includes the upper exterior panel 20A having an upper surface. The upper surface of the upper exterior panel 20A has, on a peripheral portion thereof, the first position P1, the second position P2 defined on an opposite side of the center Pc of the upper surface from the first position P1, the third position P3, and the fourth position P4 defined on an opposite side of the center Pc from the third position P3. The line L1 that connects the first position P1 and the second position P2 to each other and is formed along the upper surface is a curve bulging downward. The line L2 that connects the third position P3 and the fourth position P4 to each other and is formed along the upper surface is a curve bulging upward. According to the electronic apparatus 1, an external appearance is improved, and a strength of the exterior panel 20A is secured easily. Incidentally, there may be an application to an electronic apparatus not having the exterior panel 20A. In such a case, the upper surface of a housing that houses internal devices such as the circuit board 50 may be curved as described above.

In addition, the electronic apparatus 1 includes the apparatus main body 10 having an upper surface and the right side surface 10b and the curved upper exterior panel 20A. The upper exterior panel 20A covers the upper surface of the apparatus main body 10 and is attached to the upper surface. The upper exterior panel 20A has, at an end portion of the upper exterior panel 20A, the right projecting portion 20a beyond the position of the right side surface 10b. According to the electronic apparatus 1, the apparatus main body 10 can be protected by the upper exterior panel 20A when the electronic apparatus 1 is placed vertically such that the right side surface 10b is on the lower side. In addition, because the upper exterior panel 20A is curved, a strength of the upper exterior panel 20A can be secured as compared with a case where the upper exterior panel 20A is in a flat plate shape, for example. In addition, the upper exterior panel 20A has a curved section in a cutting plane that is along the upward-downward direction and that intersects the left-right direction (specifically, a cutting plane indicated by the line XXa-XXa in FIG. 1D). According to this, a sufficient strength of the exterior panel 20A can be secured. The cutting plane that is along the upward-downward direction and intersects the left-right direction may, for example, be a plane along the upward-downward direction and the front-rear direction. Also in such a case, a sufficient strength of the exterior panel 20A against an external force acting in the left-right direction can be secured.

In addition, the upper exterior panel 20A is a panel to be attached to the housing 30 having an upper surface and the right side surface 10b and disposed over the housing 30. The upper exterior panel 20 is curved, has the plurality of attachment target projecting portions 21 and 22 to be respectively attached to the plurality of attachment holes 30e and 30f formed in the upper surface of the housing 30, and has, at an end portion thereof, the right projecting portion 20a beyond the position of the right side surface 10b. According to the upper exterior panel 20A, the apparatus main body 10 can be protected by the upper exterior panel 20A when the electronic apparatus 1 is placed such that the right side surface 10b is on the lower side.

An exterior member 20A (or 20B) to be attached to an external surface of the housing 30 of the apparatus main body 10 includes an inner surface and an external surface that have a curved profile. The exterior member 20A (or 20B) includes the plurality of attachment target projecting portions 21 and 22 (or 24 and 25) extending out of the inner surface of the exterior member 20A (or 20B). Each of the attachment target projecting portions 21 and 22 (or 24 and 25) is inclined with respect to a plane of the exterior member 20A (or 20B) perpendicular to an upward-downward direction. The attachment target projecting portions 21 and 22 (or 24 and 25) fit in corresponding attachment holes 30e and 30f that penetrate the external surface of the housing 30 of the apparatus main body 10, when the exterior member 20A (or 20B) is attached to the housing 30 of the apparatus main body 10.

The upward-downward direction extends from the lower surface to the upper surface of the housing 30. The exterior member 20A (or 20B) covers the surface of the housing 30 when the exterior member 20A (or 20B) is attached to the apparatus main body 10.

The housing 30 has two surfaces (upper surface and lower surface) that are opposite to each other, and the exterior member 20A is attached to one of the two surfaces (upper surface) of the housing 30. The two surfaces of the housing 30 are approximately parallel to each other. The exterior member 20B which is a second exterior member is attached to the other surface (lower surface), which is the other one of the two surfaces (upper surface and lower surface) of the housing 30 that are opposite to each other.

When the plurality of attachment target projecting portions 21 and 22 (or 24 and 25) are fitted into the corresponding attachment holes 30e and 30f, a space (clearance Ua (or Ub)) is secured between the surface of the housing 30 of the apparatus main body 10 and the inner surface of the exterior member 20A (or 20B).

The clearance Ua (or Ub) provides a flow passage for airflow generated by the cooling fan 5 of the apparatus main body 10, between the inner surface of the exterior member 20A (or 20B) and the surface of the housing 30 when the exterior member 20A (or 20B) is attached to the housing 30. The cooling fan 5 is oriented from the surface of the housing 30 toward the inner surface of the exterior member 20A (or 20B) when the exterior member 20A (or 20B) is attached to the housing 30.

As illustrated in FIGS. 24 and 2B, some of the attachment target projecting portions 21 project from the inner surface of the exterior member 20A more than the other attachment target projecting portions 21. Further, as illustrated in FIG. 2A, some of the attachment target projecting portions 24 (or 25) project from the inner surface of the exterior member 20B more than the other attachment target projecting portions 24 (or 25). In other words, the plurality of attachment target projecting portions 21 and 22 (or 24 and 25) include a first size and a second size (see FIGS. 24, 2A, and 2B). Here, the attachment target projecting portions having the first size project from the inner surface of the exterior member 20A (or 20B) less than the attachment target projecting portions having the second size.

The clearance Ua (or Ub) is secured between the surface of the housing 30 of the apparatus main body 10 and the inner surface of the exterior member 20A (or 20B) when the plurality of attachment target projecting portions 21 and 22 (or 24 and 25) having the first size and the second size are fitted into the corresponding attachment holes 30e and 30f.

The clearance Ua (or Ub) is a flow passage for airflow generated by the cooling fan of the apparatus main body 10 and allows the air to flow between the inner surface of the exterior member 20A (or 20B) and the surface of the housing 30.

The plurality of attachment target projecting portions 21 and 22 (or 24 and 25) having the second size include extended portions. (As illustrated in FIG. 24, the attachment target projecting portion 21 of a relatively large size includes the extended portion that extends from the inner surface of the exterior member 20A and that has a shape of an arc.) A space is formed between the inner surface of the exterior member 20A (or 20B) and the extended portion. When the exterior member 20A (or 20B) is attached to the housing 30 and the cooling fan 5 of the apparatus main body 10 operates, this space allows the air to flow along the flow passage Ua (or Ub).

One or more of the plurality of attachment target projecting portions 21 (or 25) include the engaging protruding portion 21*a*. The engaging protruding portion 21*a* is located near a base portion of the attachment target projecting portion 21 (or 25).

The housing 30 includes the second exterior member 20B that is to be attached to the lower surface of the housing 30 and that includes the plurality of attachment target projecting portions 24 and 25.

The curved profile of the exterior member 20A (or 20B) in a first cutting plane (a cutting plane taken along the line XXa-XXa in FIG. 1D) is different from the curved profile of the exterior member 20A (or 20B) in a second cutting plane (a cutting plane taken along the line XXb-XXb in FIG. 1D). Here, the first and second cutting planes extend along the upward-downward direction and intersect.

The exterior member 20A bulges downward in the first cutting plane along the first diagonal line (line XXa-XXa in FIG. 1D) and bulges upward in the second cutting plane along the second diagonal line (line XXb-XXb in FIG. 1D).

The exterior member 20A (or 20B) to be attached to the surface of the housing 30 of the apparatus main body 10 is curved and includes an inner surface and an external surface. Further, the exterior member 20A (or 20B) includes the plurality of attachment target projecting portions 21 and 22 (or 24 and 25) extending out of the inner surface of the exterior member. Each of the attachment target projecting portions 21 and 22 (or 24 and 25) is inclined with respect to a plane of the exterior member 20A (or 20B) perpendicular to an upward-downward direction (Z1 and Z2 directions). The plurality of attachment target projecting portions 21 and 22 (or 24 and 25) include the attachment target projecting portions 21 and 22 (or 24 and 25) having the first size and the attachment target projecting portions 21 and 22 (or 24 and 25) having the second size. Here, the attachment target projecting portions 21 and 22 (or 24 and 25) having the second size project from the inner surface of the exterior member 20A (or 20B) more than the attachment target projecting portions 21 and 22 (or 24 and 25) having the first size. The plurality of attachment target projecting portions 21 and 22 (or 24 and 25) having the second size include extended portions. (As illustrated in FIG. 24, the attachment target projecting portion 21 of a large size includes the extended portion that extends from the inner surface of the exterior member 20A and that has a shape of an arc.) A space is formed between the extended portion of the exterior member 20A (or 20B) and the inner surface of the exterior member 20A (or 20B).

The attachment target projecting portions 21 and 22 (or 24 and 25) fit in corresponding attachment holes 30*e* and 30*f* that penetrate the surface of the housing 30 of the apparatus main body 10, when the exterior member 20A (or 20B) is attached to the housing 30 of the apparatus main body 10.

The space formed between the extended portion of the exterior member 20A (or 20B) and the inner surface of the exterior member 20A (or 20B) allows the air to flow. Airflow is generated between the inner surface of the exterior member 20A (or 20B) and the surface of the housing 30 when the cooling fan 5 of the apparatus main body 10 operates.

The clearance Ua (or Ub) is secured between the exterior member 20A (or 20B) and the surface of the housing 30. The clearance Ua (or Ub) is secured by the plurality of attachment target projecting portions 21 and 22 (or 24 and 25). In the example illustrated in FIGS. 2A, 2B, and 24, the attachment target projecting portions 21 and 22 (or 24 and 25) of a relatively large size are placed in a region of the clearance Ua (or Ub), to thereby secure the clearance Ua (or Ub).

The curved profile of the exterior member 20A (or 20B) in the first cutting plane is different from the curved profile of the exterior member 20A (or 20B) in the second cutting plane. Here, the first and second cutting planes extend along the upward-downward direction and intersect. Further, the exterior member 20A (or 20B) bulges downward in the first cutting plane along the first diagonal line (line XXa-XXa in FIG. 1D) and bulges upward in the second cutting plane along the second diagonal line (line XXb-XXb in FIG. 1D).

The invention claimed is:

1. An electronic apparatus comprising:
   an exterior member having a first external surface disposed in a first cutting plane and in a second cutting plane intersecting the first cutting plane, each cutting plane being along an upward-downward direction of the electronic apparatus, wherein
   the first external surface has, on a peripheral portion of the first external surface, a first position, a second position defined on an opposite side of a center of the first external surface from the first position, a third position, and a fourth position defined on an opposite side of the center of the first external surface from the third position,
   a line that connects the first position and the second position to each other and is formed along the first external surface is a curve bulging to at least one direction of an upward direction or a downward direction in the first cutting plane, and
   a line that connects the third position and the fourth position to each other and is formed along the first external surface is a curve bulging to another direction of the upward direction or the downward direction, the another direction being opposite the at least one direction in the second cutting plane.

2. The electronic apparatus according to claim 1, wherein the first position and the second position are positions of two corners located on mutually opposite sides of the center of the first external surface, and
   the third position and the fourth position are positions of two corners located on mutually opposite sides of the center of the first external surface.

3. The electronic apparatus according to claim 1, further comprising:
   a circuit board, wherein,
   as distances from a horizontal plane including the circuit board to the first external surface, the electronic apparatus has a first distance at the first position, has a second distance at the second position, has a third distance at the third position, and has a fourth distance at the fourth position, and of the first distance and the second distance, at least the first distance is larger than each of the third distance and the fourth distance.

4. The electronic apparatus according to claim 1, wherein the electronic apparatus has a vent hole, and
   when the electronic apparatus is viewed in the upward-downward direction, a line that connects the center of the first external surface and the first position to each other passes through the vent hole.

5. The electronic apparatus according to claim 3, wherein the electronic apparatus has a cooling fan, an inlet port, and a flow passage from the inlet port to the cooling fan, and
   when the electronic apparatus is viewed in the upward-downward direction, a line that connects the center of the first external surface and the first position to each other passes through the flow passage.

6. The electronic apparatus according to claim 1, further comprising:
a circuit board, wherein,
as distances from a horizontal plane including the circuit board to the first external surface, the electronic apparatus has a first distance at the first position, has a second distance at the second position, has a third distance at the third position, and has a fourth distance at the fourth position, and
of the first distance and the second distance, at least the second distance is larger than each of the third distance and the fourth distance.

7. The electronic apparatus according to claim 6, wherein
the electronic apparatus has a cooling fan, an exhaust port, and a flow passage from the cooling fan to the exhaust port, and
when the electronic apparatus is viewed in the upward-downward direction, a line that connects the center of the first external surface and the second position to each other passes through the flow passage.

8. The electronic apparatus according to claim 6, wherein
when the electronic apparatus is viewed in the upward-downward direction, a part of a power supply unit case is disposed between the center of the first external surface and the second position, and
a vent hole is formed in the part of the power supply unit case.

9. The electronic apparatus according to claim 1, wherein
the exterior member has a second external surface facing a side opposite to a side that the first external surface faces,
the second external surface has, on a peripheral portion of the second external surface, a fifth position, a sixth position defined on an opposite side of a center of the second external surface from the fifth position, a seventh position, and an eighth position defined on an opposite side of the center of the second external surface from the seventh position,
a line that connects the fifth position and the sixth position to each other and is formed along the second external surface is a curve bulging to at least one direction of the upward direction or the downward direction in the first cutting plane, and
a line that connects the seventh position and the eighth position to each other and is formed along the second external surface is a curve bulging to another direction of the upward direction or the downward direction, the another direction being opposite the at least one direction in the second cutting plane.

10. The electronic apparatus according to claim 9, wherein
one of the fifth position and the sixth position corresponds to the first position when the exterior member is viewed in the upward-downward direction.

11. The electronic apparatus according to claim 1, wherein
the electronic apparatus includes a housing and an exterior panel that is to be attached to the housing and that has the first external surface.

12. An exterior panel that is to be attached to a housing of an electronic apparatus and arranged in disposed in a first cutting plane and in a second cutting plane intersecting the first cutting plane, each cutting plane being along an upward-downward direction of the electronic apparatus with respect to the housing, wherein
the exterior panel has, on a peripheral portion of the exterior panel, a first position, a second position defined on an opposite side of a center of the exterior panel from the first position, a third position, a fourth position defined on an opposite side of the center of the exterior panel from the third position,
a line that connects the first position and the second position to each other and is formed along an external surface of the exterior panel is a curve bulging to at least one direction of an upward direction or a downward direction in the first cutting plane, and
a line that connects the third position and the fourth position to each other and is formed along the external surface of the exterior panel is a curve bulging to another direction of the upward direction or the downward direction, the another direction being opposite the at least one direction in the second cutting plane.

* * * * *